(12) United States Patent
Song

(10) Patent No.: US 9,030,897 B2
(45) Date of Patent: May 12, 2015

(54) MEMORY AND MEMORY SYSTEM FOR PREVENTING DEGRADATION OF DATA

(71) Applicant: SK Hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 138 days.

(21) Appl. No.: 13/843,681

(22) Filed: Mar. 15, 2013

(65) Prior Publication Data

US 2014/0063995 A1 Mar. 6, 2014

(30) Foreign Application Priority Data

Aug. 31, 2012 (KR) .......................... 10-2012-0096561
Aug. 31, 2012 (KR) .......................... 10-2012-0096601

(51) Int. Cl.
*G11C 7/00* (2006.01)
*G11C 29/04* (2006.01)
*G11C 8/14* (2006.01)
*G11C 29/00* (2006.01)

(52) U.S. Cl.
CPC .............. *G11C 29/04* (2013.01); *G11C 29/808* (2013.01); *G11C 8/14* (2013.01); *G11C 29/848* (2013.01); *G11C 29/702* (2013.01)

(58) Field of Classification Search
CPC ... G11C 29/808; G11C 29/785; H05K 999/99
USPC .......................... 365/200, 230.03, 230.06, 201
See application file for complete search history.

(56) References Cited

U.S. PATENT DOCUMENTS

| | | | | |
|---|---|---|---|---|
| 5,359,560 A * | 10/1994 | Suh et al. | ........................ | 365/200 |
| 5,469,388 A * | 11/1995 | Park | ............................... | 365/200 |
| 5,841,708 A * | 11/1998 | Nagata | .......................... | 365/200 |
| 6,005,810 A | 12/1999 | Wu | | |
| 6,798,703 B2 * | 9/2004 | Lee | ............................... | 365/200 |
| 6,894,917 B2 | 5/2005 | Ting et al. | | |
| 7,573,763 B2 * | 8/2009 | Im et al. | ........................ | 365/200 |

* cited by examiner

*Primary Examiner* — Connie Yoha
(74) *Attorney, Agent, or Firm* — IP & T Group LLP

(57) ABSTRACT

A memory may comprise a first bank configured to include first to $N^{th}$ word lines and first to $M^{th}$ redundancy word lines to replace M number of word lines among the first to $N^{th}$ word lines, a second bank configured to include first to $N^{th}$ word lines and first to $M^{th}$ redundancy word lines to replace M number of word lines among the first to $N^{th}$ word lines, and a control circuit configured to activate, in the case where a word line corresponding to an inputted address among the first to $N^{th}$ word lines in a bank selected between the first bank and the second bank is replaced with a $K^{th}$ ($1 \leq K \leq M$) redundancy word line among the first to $M^{th}$ redundancy word lines during an operation in a first mode, at least one adjacent word line adjacent to the $K^{th}$ redundancy word line of the selected bank.

52 Claims, 18 Drawing Sheets

MEMORY AND MEMORY SYSTEM FOR PREVENTING DEGRADATION OF DATA

CROSS-REFERENCE TO RELATED APPLICATIONS

The present application claims priority of Korean Patent Application No. 10-2012-0096561, filed on Aug. 31, 2012, which is incorporated herein by reference in its entirety.

In addition, the present application claims priority of Korean Patent Application No. 10-2012-0096601, filed on Aug. 31, 2012, which is incorporated herein by reference in its entirety.

BACKGROUND

1. Field

Exemplary embodiments of the present invention relate to a memory that may prevent degradation of stored data due to word line disturbance in a memory cell, and a memory system including the same.

2. Description of the Related Art

As the degree of integration of a memory increases, an interval between a plurality of word lines included in the memory is reduced. As the interval between the word lines is reduced, a coupling effect between adjacent word lines increases.

Whenever data is inputted and outputted to and from a memory cell, a word line toggles between an active state and an inactive state. In this regard, as the coupling effect between adjacent word lines increases as described above, data of a memory cell connected to a word line adjacent to a frequently activated word line is damaged. Such damage is called word line disturbance. Due to the word line disturbance, a concern may be raised in that the data of a memory cell may be damaged before the memory cell is refreshed.

FIG. 1 is a diagram illustrating word line disturbance and illustrating a part of a cell array included in a memory.

In FIG. 1, 'WLL' indicates to a word line having a large number of activations, and 'WLL−1' and WLL+1 (indicate to word lines adjacent to the 'WLL' that is, word lines adjacent to the word line having the large number of activations. Furthermore, 'CL' indicates a memory cell connected to the word line 'WLL', 'CL−1' indicates a memory cell connected to the word line 'WLL−1', and 'CL+1' indicates a memory cell connected to the word line 'WLL+1'. The respective memory cells 'CL', 'CL−1' and 'CL+1' include cell transistors TL, TL−1 and TL+1 and cell capacitors CAPL, CAPL−1 and CAPL+1.

In FIG. 1, when the word line 'WLL' is activated or deactivated, the voltages of the word lines 'WLL−1' and 'WLL+1' are increased or decreased due to a coupling effect occurring among the word lines 'WLL', 'WLL−1' and 'WLL+1', and an influence is exerted on the amounts of charges of the cell capacitors CAPL−1 and CAPL+1. Therefore, frequent toggles of the word line 'WLL' between an activated state and a deactivated state lead to increased changes in the amounts of charges stored in the cell capacitors CAPL−1 and CAPL+1 included in the memory cells 'CL−1' and the 'CL+1', so that the data of the memory cells 'CL−1' and the 'CL+1' may be degraded.

Furthermore, as electromagnetic waves, which are generated while the word line toggles between the activated state and the deactivated state, introduce or discharge electrons into or from the cell capacitors of the memory cells connected to adjacent word lines, data may be damaged.

SUMMARY

Various exemplary embodiments are directed to a memory that may include a plurality of banks and a memory system, in which word lines adjacent to a word line are activated for a number of times that is equal to or greater than a reference number to refresh memory cells connected to themselves, thereby preventing word line disturbance to the memory cells connected to the adjacent word lines.

Also, various exemplary embodiments are directed to a memory that may include a plurality of banks and a memory system, in which, even when a word line, which is activated for a number of times equal to or greater than a reference number, is a redundancy word line replacing a normal word line, it may be possible to prevent word line disturbance to memory cells connected to word lines adjacent to the redundancy word line.

Also, various exemplary embodiments are directed to a memory system that may include a plurality of banks in which, even in the case where a group of a plurality of normal word lines is replaced with a group of a plurality of redundancy word lines and a normal word line, which is activated for a number of times equal to or greater than a reference number, is replaced with a redundancy word line, it may be possible to prevent word line disturbance to memory cells connected to word lines adjacent to the redundancy word line.

In an embodiment, a memory may include a first bank configured to include first to $N^{th}$ word lines and first to $M^{th}$ redundancy word lines to replace M number of word lines among the first to $N^{th}$ word lines, a second bank configured to include first to $N^{th}$ word lines and first to $M^{th}$ redundancy word lines to replace M number of word lines among the first to $N^{th}$ word lines, and a control circuit configured to activate, in the case where a word line corresponding to an inputted address among the first to $N^{th}$ word lines in a bank selected between the first bank and the second bank is replaced with a $K^{th}$ ($1 \leq K \leq M$) redundancy word line among the first to $M^{th}$ redundancy word lines during an operation in a first mode, at least one adjacent word line adjacent to the $K^{th}$ redundancy word line of the selected bank in response to an active signal of the selected bank.

In an embodiment, a memory may include a first bank configured to include first to $N^{th}$ word lines and first to $M^{th}$ redundancy word lines to replace M number of word lines among the first to $N^{th}$ word lines, a second bank configured to include first to $N^{th}$ word lines and first to $M^{th}$ redundancy word lines to replace M number of word lines among the first to $N^{th}$ word lines, and a control circuit configured to activate, in the case where a word line corresponding to an inputted address among the first to $N^{th}$ word lines in a bank selected between the first bank and the second bank is adjacent to the first redundancy word line during an operation in a first mode, at least one adjacent word line adjacent to the word line corresponding to the inputted address among the first to $M^{th}$ redundancy word lines in response to an active signal of the selected bank.

In an embodiment, a memory system may include a memory configured to include a first bank configured to include first to $N^{th}$ word lines and first to $M^{th}$ redundancy word lines to replace M number of word lines among the first to $N^{th}$ word lines and a second bank configured to include first to $N^{th}$ word lines, and first to $M^{th}$ redundancy word lines to replace M number of word lines among the first to $N^{th}$ word lines, wherein the memory is configured to activate, in the case where a word line corresponding to an inputted address among the first to $N^{th}$ word lines in a bank selected between the first bank and the second bank is replaced with a $K^{th}$ (1≤K≤M) redundancy word line among the first to $M^{th}$ redundancy word lines during an operation in a first mode, at least one adjacent word line adjacent to the $K^{th}$ redundancy word line in response to an active signal of the selected bank, and a memory controller configured to input to the memory during the operation in the first mode, in response to a result of counting the numbers of activations of the first to $N^{th}$ word lines of the first bank and the numbers of activations of the first to $N^{th}$ word lines of the second bank, an address corresponding to a word line of which the number of activations is equal to or greater than a reference number among the first to $N^{th}$ word lines of the selected bank.

In an embodiment, a memory system may include a memory configured to include a first bank configured to include first to $N^{th}$ word lines and first to $M^{th}$ redundancy word lines to replace M number of word lines among the first to $N^{th}$ word lines, and a second bank configured to include first to $N^{th}$ word lines and first to $M^{th}$ redundancy word lines to replace M number of word lines among the first to $N^{th}$ word lines, wherein the memory is configured to activate, in the case where a word line corresponding to an inputted address among the first to $N^{th}$ word lines in a bank selected between the first bank and the second bank is adjacent to the first redundancy word line during an operation in a first mode, at least one adjacent word line adjacent to the word line corresponding to the inputted address among the first to $M^{th}$ redundancy word lines in response to an active signal of the selected bank, and a memory controller configured to input to the memory during the operation in the first mode, in response to a result of counting the numbers of activations of the first to $N^{th}$ word lines of the first bank and the numbers of activations of the first to $N^{th}$ word lines of the second bank, an address corresponding to a word line of which the number of activations is equal to or greater than a reference number among the first to $N^{th}$ word lines of the selected bank.

In an embodiment, a memory may include, first to $N^{th}$ word line groups, each of which is configured to include a plurality of word lines, first to $M^{th}$ redundancy word line groups, each of which is configured to include a plurality of redundancy word lines to replace M number of word line groups among the first to $N^{th}$ word line groups, and a control circuit configured to activate, in the case where a word line group including a word line corresponding to an inputted address among the first to $N^{th}$ word line groups is replaced with a $K^{th}$ (1≤K≤M) redundancy word line group among the first to $M^{th}$ redundancy word line groups in a first mode, at least one adjacent word line adjacent to a redundancy word line that replaces the word line corresponding to the inputted address among the plurality of redundancy word lines of the $K^{th}$ redundancy word line group in response to an active signal.

In an embodiment, a memory may include first to $N^{th}$ word line groups, each of which is configured to include a plurality of word lines, first to $M^{th}$ redundancy word line groups, each of which is configured to include a plurality of redundancy word lines to replace M number of word line groups among the first to $N^{th}$ word line groups, a redundancy control block configured to generate first to $M^{th}$ redundancy signals, and, in the case where a word line group including a word line corresponding to an inputted address among the first to $N^{th}$ word line groups is replaced with a $K^{th}$ (1≤K≤M) redundancy word line group among the first to $M^{th}$ redundancy word line groups, to activate a $K^{th}$ redundancy signal among the first to $M^{th}$ redundancy signals that corresponds to the $K^{th}$ redundancy word line group in response to a portion of the inputted address, an adjacent activation control block configured to activate at least one adjacent control signal in the case where the word line group including the word line corresponding to the inputted address is replaced with the $K^{th}$ redundancy word line group in a first mode, and a word line control block configured to activate at least one adjacent word line adjacent to the redundancy word line that replaces the word line corresponding to the inputted address in response to an active signal and the $K^{th}$ redundancy signal and the adjacent control signal, in the case where the word line group including the word line corresponding to the inputted address is replaced with the $K^{th}$ redundancy word line group in the first mode.

In an embodiment, a memory system may include a memory configured to include first to $N^{th}$ word line groups, each of which is configured to include a plurality of word lines, and first to $M^{th}$ redundancy word line groups, each of which is configured to include a plurality of redundancy word lines to replace M number of word line groups among the first to $N^{th}$ word line groups, wherein the memory is configured to activate, in the case where a word line group including a word line corresponding to an inputted address among the first to $N^{th}$ word line groups is replaced with a $K^{th}$ (1≤K≤M) redundancy word line group among the first to $M^{th}$ redundancy word line groups in a first mode, at least one adjacent word line adjacent to a redundancy word line that replaces the word line corresponding to the inputted address among the plurality of redundancy word lines of the $K^{th}$ redundancy word line group in response to an active signal, and a memory controller configured to input to the memory, in response to a result of counting the numbers of activations of the plurality of word lines of the first to $N^{th}$ word line groups, an address corresponding to a word line of which the number of activations is equal to or greater than a reference number among the plurality of word lines of the first to $N^{th}$ word line groups in the first mode.

In an embodiment, a memory system may include a memory and a memory controller, wherein the memory is configured to include first to $N^{th}$ word line groups, each of which is configured to include a plurality of word lines, first to $M^{th}$ redundancy word line groups, each of which is configured to include a plurality of redundancy word lines to replace M number of word line groups among the first to $N^{th}$ word line groups, a redundancy control block configured to generate first to $M^{th}$ redundancy signals, and, in the case where a word line group including a word line corresponding to an inputted address among the first to $N^{th}$ word line groups is replaced with a $K^{th}$ (1≤K≤M) redundancy word line group among the first to $M^{th}$ redundancy word line groups, to activate a $K^{th}$ redundancy signal among the first to $M^{th}$ redundancy signals that corresponds to the $K^{th}$ redundancy word line group in response to a portion of the inputted address, an adjacent activation control block configured to activate at least one adjacent control signal in the case where the word line group including the word line corresponding to the inputted address is replaced with the $K^{th}$ redundancy word line group in a first mode, and a word line control block configured to activate at least one adjacent word line adjacent to the redundancy word line that replaces the word line corresponding to the inputted address in response to an active signal and the $K^{th}$ redundancy signal and the adjacent control signal in the case where the word line group including the word line corresponding to the inputted address is replaced with the $K^{th}$ redundancy word line group in the first mode, and wherein the memory controller is configured to input to the memory, in response to a result of counting the numbers of activations of the plurality of word lines of the first to $N^{th}$ word line groups, an address corresponding to a word line of which the number of activations is equal to or greater than a reference number among the plurality of word lines of the first to $N^{th}$ word line groups in the first mode.

In an embodiment, a memory may include first to $N^{th}$ word line groups, each of which is configured to include a plurality of word lines, first to $M^{th}$ redundancy word line groups, each of which is configured to include a plurality of redundancy word lines to replace M number of word line groups among the first to $N^{th}$ word line groups, and a control circuit configured to activate at least one adjacent word line adjacent to a word line corresponding to an inputted address among the redundancy word lines included in the first to $M^{th}$ redundancy word lines in response to an active signal in the case where the word line corresponding to the inputted address is adjacent to a redundancy word line disposed first in the first redundancy word line group, in a first mode.

In an embodiment, a memory may include first to $N^{th}$ word line groups, each of which is configured to include a plurality of word lines, first to $M^{th}$ redundancy word line groups, each of which configured to include a plurality of redundancy word lines to replace M number of word line groups among the first to $N^{th}$ word line groups, a redundancy control block configured to generate first to $M^{th}$ redundancy signals, and, in the case where a word line group including a word line corresponding to an inputted address among the first to $N^{th}$ word line groups is replaced with a $K^{th}$ ($1 \leq K \leq M$) redundancy word line group among the first to $M^{th}$ redundancy word line groups, to activate a $K^{th}$ redundancy signal among the first to $M^{th}$ redundancy signals that corresponds to the $K^{th}$ redundancy word line group in response to a portion of the inputted address, an adjacent activation control block configured to activate at least one adjacent control signal in the case where the word line corresponding to the inputted address is adjacent to a redundancy word line disposed first in the first redundancy word line group, in a first mode, and a word line control block configured to activate at least one adjacent word line adjacent to the word line corresponding to the inputted address among the redundancy word lines included in the first to $M^{th}$ redundancy word line groups in response to an active signal and a signal that is activated when the word line corresponding to the inputted address is activated and the adjacent control signal in the case where the word line corresponding to the inputted address is adjacent to the redundancy word line disposed first in the first redundancy word line group, in the first mode.

In an embodiment, a memory may include first to $N^{th}$ word line groups, each of which is configured to include a plurality of word lines, first to $M^{th}$ redundancy word line groups, each of which is configured to include a plurality of redundancy word lines to replace M number of word line groups among the first to $N^{th}$ word line groups; a redundancy control block configured to generate first to $M^{th}$ redundancy signals, and, in the case where a word line group including a word line corresponding to an inputted address among the first to $N^{th}$ word line groups is replaced with a $K^{th}$ ($1 \leq K \leq M$) redundancy word line group among the first to $M^{th}$ redundancy word line groups, to activate a $K^{th}$ redundancy signal among the first to $M^{th}$ redundancy signals that corresponds to the $K^{th}$ redundancy word line group in response to a portion of the inputted address, a pulse signal generation unit configured to generate a pulse signal at deactivation of an active signal, a first shifting unit configured to shift values stored therein when the pulse signal is activated in the case where a redundancy word line state signal is activated in a first mode, and to generate a plurality of first signals a second shifting unit configured to shift values stored therein when the pulse signal is activated in the first mode, and to generate a plurality of second signals, an address latch unit configured to latch a bit for distinguishing respective word lines of a word line group in the inputted address, and to generate a word line distinguishing signal, a signal generation unit configured to combine the plurality of first signals and the plurality of second signals and the word line distinguishing signal, and to generate at least one adjacent control signal, and a word line control block configured to activate at least one adjacent word line adjacent to the redundancy word line that replaces the word line corresponding to the inputted address in response to an active signal and the $K^{th}$ redundancy signal and the adjacent control signal in the case where the word line group including the word line corresponding to the inputted address is replaced with the $K^{th}$ redundancy word line group in the first mode.

DETAILED DESCRIPTION

Figure 1:
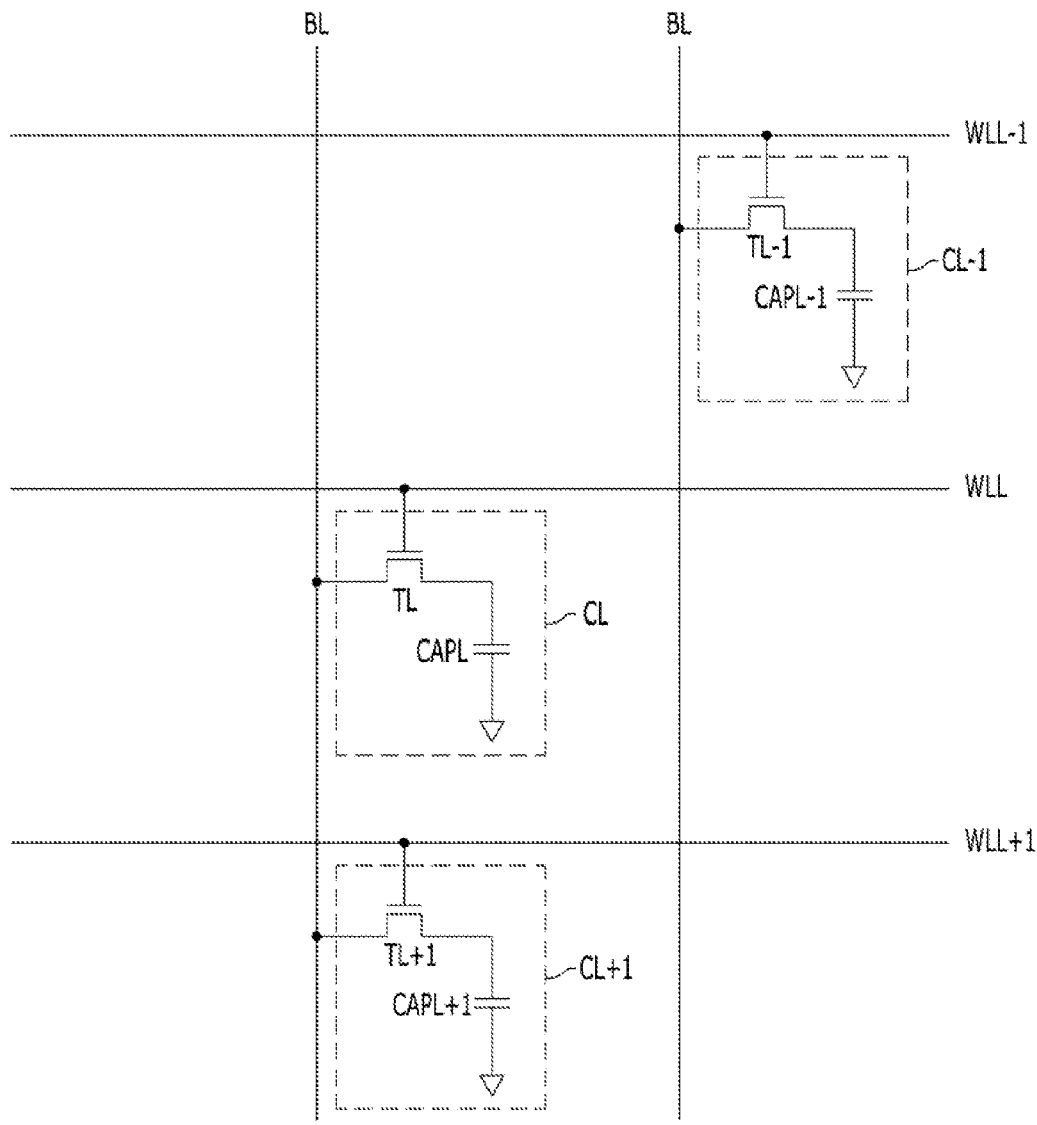
FIG. 1 is a diagram illustrating word line disturbance and illustrating a part of a cell array included in a memory.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Hereinafter, an adjacent word line means a word line that is identified to be subject to the word line disturbance by a specific word line (for example, an over-activated word line to be disclosed herein below). Identification or the number of the adjacent word lines may vary according to a memory design. Hereinafter, descriptions will be made for an exemplary case in which two adjacent word lines are respectively disposed next to the specific word line.

Also, a word line designated by a specific address indicates a word line that physically or logically corresponds to the specific address by a preset correspondence relationship or a word line that replaces the word line corresponding to the specific address. For example, when a word line physically or logically corresponding to an address with the value of 'X' is an Xth word line, if the Xth word line is not replaced, the Xth word line is the word line designated by the address with the value of 'X'. If the Xth word line is replaced with a Yth redundancy word line, the word line designated by the address with the value of 'X' is the Yth redundancy word line.

Figure 2:
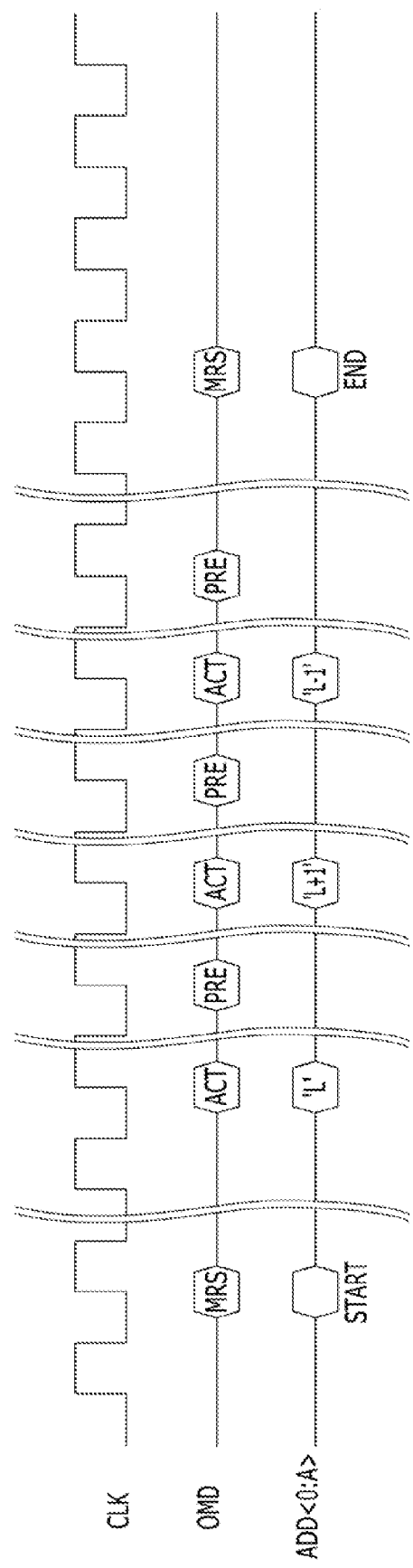
FIG. 2 is a diagram illustrating prevention of word line disturbance to memory cells connected to word lines adjacent to a word line having a large number of activations.

FIG. 2 is a diagram illustrating prevention of word line disturbance to memory cells connected to word lines adjacent to a word line having a large number of activations. Hereinafter, "a number of" or the number of" activations refer to how many activations are performed.

A memory includes first to $N^{th}$ (N is a natural number) word lines, and a memory controller (not illustrated in FIG. 2) controls the memory by applying various signals, such as a command CMD, addresses ADD<0:A> and data (not illustrated in FIG. 2), to the memory. A clock CLK is a clock signal in synchronization with which the memory operates.

FIG. 2 illustrates the signals that the memory controller applies to the memory in an operation mode (hereinafter, referred to as a special mode) to prevent the data of memory cells from being degraded due to word line disturbance. Hereinafter, the value of an address corresponding to an $L^{th}$ word line (L is a natural number, $1 \leq L \leq N$) among the first to $N^{th}$ word lines will be denoted by 'L.'.

The number of activations of a word line is the number of inputs of an address corresponding to the word line, together with an active command from the memory controller to the memory. For example, when the memory controller inputs an address '15' for ten times together with the active command, it represents that a $15^{th}$ word line is activated for ten times. Thus, the memory or the memory controller determines the presence or absence of a word line of which the number of activations is equal to or greater than a reference number, using a result obtained by counting the numbers of times by which the addresses corresponding to the first to $N^{th}$ word lines have been inputted to the memory together with the active command. The reference number may be a value that is determined internally of a memory system or a value that is inputted from an outside of the memory system. Value of the reference number may vary according to a memory design.

When a specific address combination is inputted from the memory controller together with an MRS command MRS, the memory enters the special mode by MRS (mode resistor set) setting ('start' setting). Furthermore, when a specific address combination is inputted together with the MRS command MRS, the memory exits the special mode ('end' setting). Signal combination for entering and/or getting out of the special mode may vary and depend on a memory design.

In the special mode, the memory controller operates the memory by the unit of a 'compensation cycle' including an operation of inputting to a memory an address (hereinafter, referred to as an excessive input address) of which the number of input times together with the active command is equal to or greater than the reference number and an operation of activating adjacent word lines, or word lines that are adjacent to a word line (hereinafter, referred to as an over-activated word line) corresponding to the excessive input address. Hereinafter, descriptions will be made for the case in which the address 'L' is the excessive input address and the $L^{th}$ word line is the over-activated word line.

In each compensation cycle, a first active command ACT and the excessive input address L are inputted to the memory. After a predetermined time lapses, a precharge command PRE is inputted to the memory. The memory activates the $L^{th}$ word line in response to the active command ACT and the address L, and deactivates the activated $L^{th}$ word line in response to the precharge command PRE.

After the activation of the over-activated word line, addresses L+1 and L−1 corresponding to adjacent word lines adjacent to the $L^{th}$ word line or the over-activated word line are sequentially inputted together with the active command ACT to prevent the word line disturbance. In FIG. 2, a second active command ACT and the address L+1 are inputted, and a third active command ACT and the address L−1 are inputted. Accordingly, an $L+1^{th}$ word line and an $L-1^{th}$ word line of the memory are sequentially activated. For reference, the input order of the address L+1 and the address L−1 may be changed according to a memory design.

When the operation of activating the adjacent word lines is completed, the memory exits the special mode by the combination of the MRS command and an address inputted from the memory controller.

When a certain word line is activated, the data of the memory cells connected to the word line are refreshed. Therefore, in the special mode, by activating the adjacent word lines adjacent to the over-activated word line corresponding to the excessive input address, data degradation may be prevented from occurring due to word line disturbance.

Figure 3:
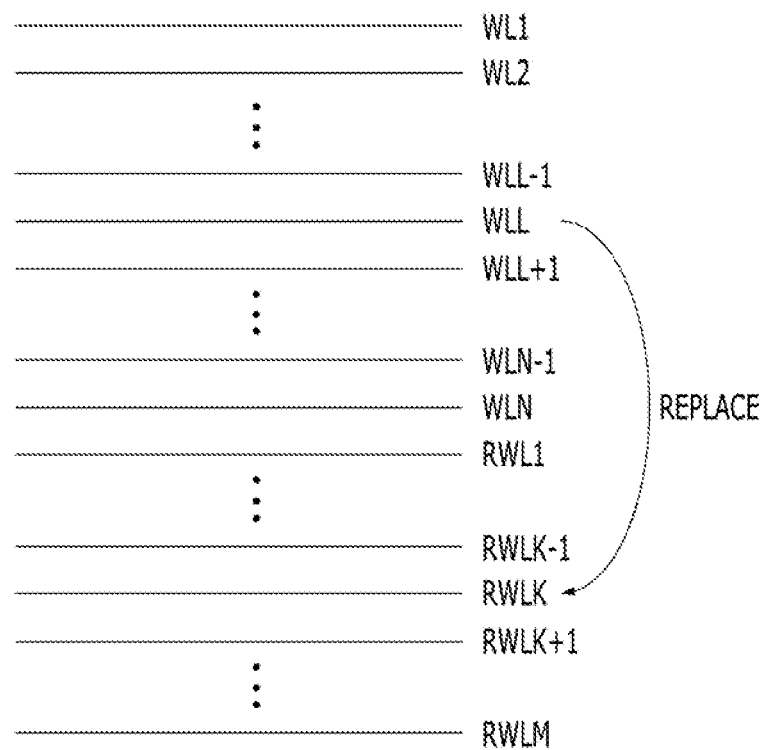
FIG. 3 is a diagram illustrating the compensation process of redundancy word lines.

FIG. 3 is a diagram illustrating the compensation process of redundancy word lines.

Referring to FIG. 3, a memory includes first to $N^{th}$ normal word lines WL1 to WLN and first to $M^{th}$ redundancy word lines RWL1 to RWLM to replace failed M normal word lines among the first to $N^{th}$ word lines WL1 to WLN. The first to $N^{th}$ normal word lines WL1 to WLN are sequentially disposed and the first to $M^{th}$ redundancy word lines RWL1 to RWLM are sequentially disposed next to the $N^{th}$ normal word line WLN, as illustrated in FIG. 3.

Hereafter, descriptions will be made for the case in which an address L corresponding to an $L^{th}$ normal word line WLL is an excessive input address and the $L^{th}$ word line is replaced with a $K^{th}$ (K is a natural number, $1 \leq K \leq M$) redundancy word line RWLK.

The memory stores the address L corresponding to the $L^{th}$ normal word line WLL that is replaced. When the value of an inputted address is identical to L, the memory performs an operation (redundancy operation) of activating the $K^{th}$ redundancy word line RWLK in place of the $L^{th}$ normal word line WLL. An address is not separately allocated to a redundancy word line.

In a compensation cycle, a first active command ACT and the address L are inputted to the memory. Next, an address L+1 and an address L−1 are inputted together with second and third active commands ACT, respectively. Accordingly, an $L+1^{th}$ normal word line WLL+1 and an $L-1^{th}$ normal word line WLL−1 are activated in response to the second and third active commands ACT, respectively.

However, since the $L^{th}$ normal word line WLL is replaced with the $K^{th}$ redundancy word line RWLK, an over-activated word line is not the $L^{th}$ normal word line WLL but is the $K^{th}$ redundancy word line RWLK, and a word line of which the number of activations is actually equal to or greater than a reference number is not the $L^{th}$ normal word line WLL but is the $K^{th}$ redundancy word line RWLK, even though the excessive input address still corresponds to the $L^{th}$ normal word line WLL. Thus, word lines to be activated, as adjacent word lines in the special mode, are not the $L+1^{th}$ normal word line WLL+1 nor the $L-1^{th}$ normal word line WLL−1 but a $K+1^{th}$ redundancy word line RWLK+1 and a $K-1^{th}$ redundancy word line RWLK−1.

Because an address is not allocated to a redundancy word line as described above, a scheme for activating a redundancy word line as an adjacent word line in the special mode is in demand.

Figure 5:
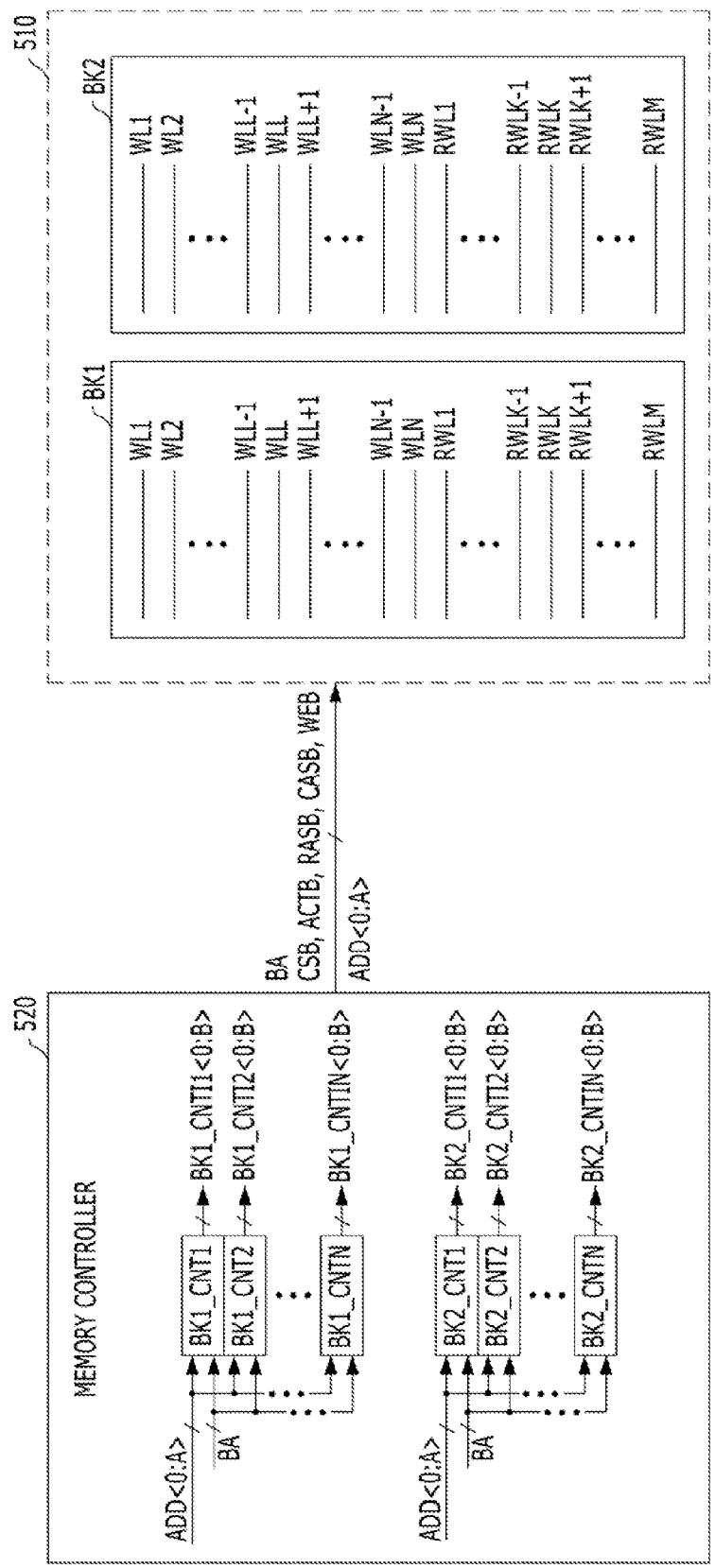
FIG. 5 is a configuration diagram illustrating a memory system in accordance with an embodiment of the present invention.

FIG. 5 is a configuration diagram of a memory system in accordance with an embodiment of the present invention.

Referring to FIG. 5, a memory system includes a memory 510 and a memory controller 520.

The memory 510 includes a first bank BK1 and a second bank BK2. Each of the first and second banks BK1 and BK2 includes first to $N^{th}$ normal word lines WL1 to WLN and first to $M^{th}$ redundancy word lines RWL1 to RWLM for replacing failed M normal word lines among the first to $N^{th}$ normal word lines WL1 to WLN. In each of the first and the second banks BK1 and BK2 of the memory 510, the first to $N^{th}$ normal word lines WL1 to WLN are sequentially disposed, and the first to $M^{th}$ redundancy word lines RWL1 to RWLM are sequentially disposed next to the $N^{th}$ normal word line WLN. The memory controller 520 inputs an address ADD<0:A> that is inputted for at least a reference number, among the addresses ADD<0:A> corresponding to the first to $N^{th}$ normal word lines WL1 to WLN of a bank selected by bank select information SBK, to the memory 510 in a special mode in response to a result obtained by respectively counting the numbers of times by which the addresses ADD<0:A> corresponding to the first to $N^{th}$ normal word lines WL1 to WLN of the first and the second banks BK1 and BK2 have been inputted.

For reference, the memory controller 520 inputs command signals including a chip select signal CSB, an active control signal ACTB, an address strobe signal RASB, a column address strobe signal CASB and a write enable signal WEB, to the memory 510. The fact that the memory controller 520 applies a specific command to the memory 510 represents that the combination of the command signals CSB, ACTB, RASB, CASB and WEB corresponds to the specific command. For example, the fact that the memory controller 520 applies an active command to the memory 510 represents that the combination of the command signals CSB, ACTB, RASB, CASB and WEB applied to the memory 510 by the memory controller 520 corresponds to the active command. A command decoder (not illustrated) included in the memory 510 decodes the command signals CSB, ACTB, RASB, CASB and WEB and generates a command internally of the memory 510.

In the following descriptions, a normal access mode corresponds to a normal operation mode for performing read or write operation for data of the memory 510.

A memory system will be described with reference to FIG. 5.

In the following descriptions, an adjacent word line to a specific word line is a word line disposed before or after the specific word line. In FIG. 5, adjacent word lines to an $L^{th}$ normal word line WLL are an $L-^{th}$ normal word line WLL−1 and an $L+1^{th}$ normal word line WLL+1, and adjacent word lines to a $K^{th}$ redundancy word line RWLK are a $K-1^{th}$ redundancy word line RWLK−1 and a $K+1^{th}$ redundancy word line RWLK+1. Furthermore, an adjacent word line to the first normal word line WL1 (K=1) is the second normal word line WL2, adjacent word lines to the $N^{th}$ normal word line WLN (K=N) are the $N-1^{th}$ normal word line WLN−1 and the first redundancy word line RWL1, adjacent word lines to the first redundancy word line RWL1 (K=1) are the $N^{th}$ normal word line WLN and the second redundancy word line RWL2, and an adjacent word line to the $M^{th}$ redundancy word line RWLM (K=M) is the $M-1^{th}$ redundancy word line RWLM−1. Identification or the number of the adjacent word lines may vary according to a memory design.

In the normal access mode, the memory 510 or the memory controller 520 counts the numbers of activations of the respective word lines of the first and the second banks BK1 and BK2 of the memory 510. In order to count the numbers of activations of the first to $N^{th}$ normal word lines WL1 to WLN of the first and the second banks BK1 and BK2, the memory 510 or the memory controller 520 may include first to $N^{th}$ counting units BK1_CNT1 to BK1_CNTN and BK2_CNT1 to BK2_CNTN corresponding to the first to $N^{th}$ normal word lines WL1 to WLN of the first and the second banks BK1 and BK2, respectively. The counting units BK1_CNT1 to BK1_CNTN count the numbers of activations of the first to $N^{th}$ normal word lines WL1 to WLN of the first bank BK1, and the counting units BK2_CNT1 to BK2_CNTN count the numbers of activations of the first to $N^{th}$ normal word lines WL1 to WLN of the second bank BK2. In detail, each group of the counting units BK1_CNT1 to BK1_CNTN and the counting units BK2_CNT1 to BK2_CNTN counts the numbers of times by which the addresses ADD<0:A> corresponding to the first to $N^{th}$ normal word lines WL1 to WLN in each bank BK1 or BK2 have been inputted together with the active command in response to a value of a bank address BA corresponding to the first or second bank BK1 or BK2. This is because the memory 510 activates a word line corresponding to an address ADD<0:A> of a bank corresponding to the bank address BA in response to the active command. Therefore, first to $N^{th}$ counting information BK1_CNTI1<0:B> to BK1_CNTIN<0:B> of the first bank BK1 represents the numbers of activations of the respective first to $N^{th}$ normal word lines WL1 to WLN of the first bank BK1, and first to $N^{th}$ counting information BK2_CNTI1<0:B> to BK2_CNTIN<0:B> of the second bank BK2 represents the numbers of activations of the respective first to $N^{th}$ normal word lines WL1 to WLN of the second bank BK2. Even in the case of word line replacement, namely the case that the $L^{th}$ normal word line WLL is replaced with the $K^{th}$ redundancy word line RWLK as the example discussed above, the address corresponding to the normal word line is mapped to the redundancy word line through the redundancy operation discussed in connection with FIG. 3, and thus the number of activations of the redundancy word line may be counted with the number of inputs of the address corresponding to the normal word line.

The Operation of the Memory System in the Special Mode

As the memory controller 520 inputs a combination of MRS commands and a specific address to the memory 510, the memory 510 enters the special mode (a mode signal MOD is activated). The memory controller 520 is configured to input to the memory 510 an excessive input address in the special mode in response to a result of counting the number of activations of the first to $N^{th}$ normal word lines WL1 to WLN in each of the banks BK1 and BK2. A bank for which a compensating operation is to be performed in the special mode is selected between the first and the second banks BK1 and BK2 by the combination of MRS commands and activated one of bank select signals included in the bank select information SBK. Since the excessive input address may be at least one, that is, there may be at least one over-activated word line of which the number of activations is equal to or greater than a reference number, the special mode may include at least one 'compensation cycle' for the case of a plurality of the inputted excessive input addresses. Hereinafter, descriptions will be made for the case where the special mode includes one compensation cycle for one excessive input address corresponding to the $L^{th}$ normal word line WLL.

After the memory 510 enters the special mode, the memory controller 520 inputs the active command three times to the memory 510 during the compensation cycle. The memory controller 520 inputs the excessive input address ADD<0:A> with the value of L together with a first active command, inputs the address ADD<0:A> with the value of L+1 together with a second active command, and inputs the address ADD<0:A> with the value of L−1 together with a third active command. The number of times by which the active command is inputted to the memory 510 during the compensation cycle may be designed to vary according to the number of adjacent word lines to be activated in the compensation cycle.

Cases (A) and (B) to be described below are where adjacent word lines to an over-activated word line may include at least one redundancy word line.

In case (A) where the over-activated word line is a redundancy word line, or a word line corresponding to the excessive input address ADD<0:A> among the first to $N^{th}$ normal word lines WL1 to WLN in one of the first and the second banks BK1 and BK2 selected by the bank select information SBK is replaced with the $K^{th}$ (1≤K≤M) redundancy word line RWLK among the first to $M^{th}$ redundancy word lines RWL1 to RWLM, the memory 510 activates at least one adjacent word line to the $K^{th}$ redundancy word line RWLK in response to the active command.

In case (B) where the adjacent word lines partly include at least one redundancy word line, or at least one adjacent word line to an over-activated word line corresponding to the excessive input address ADD<0:A> among the first to $N^{th}$ normal word lines WL1 to WLN in one of the first and the second banks BK1 and BK2 selected by the bank select information SBK includes at least one word line among the first to $M^{th}$ redundancy word lines RWL1 to RWLM, the memory 510 activates the adjacent word line to the over-activated word line corresponding to the excessive input address ADD<0:A> among the first to $M^{th}$ redundancy word lines RWL1 to RWLM in response to the active command. For example, case (B) is the one where adjacent word lines to the over-activated $N^{th}$ normal word line WLN are the N−1$^{th}$ normal word line WLN−1 and the first redundancy word line RWL1.

The above cases (A) and (B) correspond to the case in which at least one adjacent word line to the over-activated word line designated by the excessive input address ADD<0: A> includes at least one redundancy word line among the first to $M^{th}$ redundancy word lines RWL1 to RWLM. In either one of the above cases (A) and (B), the memory 510 activates the adjacent word lines, which may include at least one normal word line and at least one redundancy word line, regardless of the inputted address ADD<0:A> for the adjacent word lines.

In order to perform an operation of activating at least one adjacent word line to the over-activated word line with the number of activations equal to or greater than the reference number in one of the first and the second banks BK1 and BK2 selected by the bank select information SBK in the special mode, the active command and the bank address BA for designating one of the first and the second banks BK1 and BK2 are applied. For reference, the bank select information SBK includes a first bank select signal SBK1 and a second bank select signal SBK2. If the first bank select signal SBK1 is activated, the first bank BK1 is selected, and if the second bank select signal SBK2 is activated, the second bank BK2 is selected. Hereinafter, descriptions will be made for the case where the first bank BK1 is selected in the special mode.

The Operation of the Memory 510 in Case (A)

When the bank address BA corresponding to the first bank BK1 and the excessive input address ADD<0:A> with the value of L are inputted together with the first active command, the memory 510 activates the $K^{th}$ redundancy word line RWLK that replaces the $L^{th}$ normal word line WLL, and thus the Kth redundancy word line RWLK is the over-activated word line, in the first bank BK1. When the bank address BA corresponding to the first bank BK1 and the second active command are inputted, the memory 510 activates the K+1$^{th}$ redundancy word line RWLK+1 as an adjacent word line to the $K^{th}$ redundancy word line RWLK in the first bank BK1, regardless of the address ADD<0:A> with the value of L+1 that is applied together with the second active command. When the bank address BA corresponding to the first bank BK1 and the third active command are inputted, the memory 510 activates the K−1$^{th}$ redundancy word line RWLK−1 as the other adjacent word line to the $K^{th}$ redundancy word line RWLK in the first bank BK1, regardless of the address ADD<0:A> with the value of L−1 that is applied together with the third active command. The order of activation of the K+1$^{th}$ redundancy word line RWLK+1 and the K−1$^{th}$ redundancy word line RWLK−1 may be changed according to a memory design. In the case when K is equal to '1', that is, the over-activated word line corresponding to the excessive input address ADD<0:A> is replaced with the first redundancy word line RWL1, the second redundancy word line RWL2 and the $N^{th}$ normal word line WLN are sequentially activated as adjacent word lines to the over activated word line, namely the first redundancy word line RWL1, in response to the second and third active commands.

The Operation of the Memory 510 in Case (B)

The memory 510 activates the word line corresponding to the excessive input address ADD<0:A> in the first bank BK1 in response to the first active command and the bank address BA corresponding to the first bank BK1. The over-activated word line corresponding to the excessive input address ADD<0:A> may be the $N^{th}$ normal word line WLN that is adjacent to the first redundancy word line RWL1.

When the bank address BA corresponding to the first bank BK1 and the active command for the adjacent word lines are applied, the memory 510 may activate at least one redundancy word line as an adjacent word line to the over-activated word line corresponding to the excessive input address ADD<0:A> among the first to $M^{th}$ redundancy word lines RWL1 to RWLM in the first bank BK1. For instance, when the bank address BA corresponding to the first bank BK1 and the second active command are inputted, the memory 510 activates the first redundancy word line RWL1 as an adjacent word line to the over-activated $N^{th}$ normal word line WLN regardless of the inputted address ADD<0:A> for an adjacent word line, and when the bank address BA corresponding to the first bank BK1 and the third active command are inputted, the memory 510 activates the N−1$^{th}$ normal word line WLN−1 as the other adjacent word line to the over-activated $N^{th}$ normal word line WLN regardless of the inputted address ADD<0:A> for the other adjacent word line. The order of activation of the first redundancy word line RWL1 and the N−1$^{th}$ normal word line WLN−1 may be changed according to a memory design.

Except cases (A) and (B), that is, when an over-activated word line and all adjacent word lines are normal word lines, or the normal word line corresponding to the excessive input address ADD<0:A> is not replaced and is not adjacent to the first redundancy word line RWL1, the memory 510 activates the normal word line corresponding to the address ADD<0:A> inputted together with the active command in the compensation cycle.

Meanwhile, the memory 510 does not perform a redundancy operation (explained in connection with FIG. 3) for the address ADD<0:A> for the adjacent word lines inputted together with the second and third active commands after the activation of the over-activated word line in each compensation cycle, and maintains the states of signals associated with the redundancy operation in the states after the first active command for the over-activated word line is inputted. It is a word line physically adjacent to the over-activated word line that needs to be protected against the word line disturbance. Therefore, a nominally adjacent word line, which is not physically adjacent to the over-activated word line, need not be activated for protection from the word line disturbance. The nominally adjacent word line is caused by replacement to a redundancy word line from a normal word line. For example, assume that an excessive input address is 5, and thus the over-activated word line is a fifth normal word line, and that a fourth normal word line, which corresponds to an address 4 and is physically adjacent to the over-activated fifth normal word line, is replaced with a third redundancy word line. Even though the third redundancy word line may be nominally an adjacent word line to the fifth normal word line according to the replacement, the third redundancy word line is not influenced by word line disturbance since it is not physically adjacent to the over-activated word line or the fifth normal word line. Accordingly, the memory 510 does not perform a redundancy operation for the address 4 and the third redundancy word line in the compensation cycle.

For the bank not selected by the bank select information SBK in the special mode, a normal read or write operation is performed. Accordingly, the bank not selected by the bank select information SBK operates in the substantially the same manner as an operation in the normal access mode, which will be described below.

The Operation of the Memory System in the Normal Access Mode

In order to perform an operation according to an external request (not illustrated), the memory controller 520 applies the command signals CSB, ACTS, RASB, CASB and WEB, the address ADD<0:A> and data (not illustrated) to the memory 510. The memory 510 activates a word line corresponding to the address ADD<0:A> in one of the first and the second banks BK1 and BK2 corresponding to the bank address BA when the bank address BA and the active command are inputted. However, in the case where the word line corresponding to the address ADD<0:A> in one of the first and the second banks BK1 and BK2 corresponding to the bank address BA is replaced with a redundancy word line, the memory 510 activates the redundancy word line that replaces the word line corresponding to the address ADD<0:A>.

In the above descriptions, it is described that, when the memory 510 corresponds to one of cases (A) and (B), at least one word line is activated regardless of the address ADD<0:A> inputted together with the active commands after the first active command for the over-activated word line. The memory 510 may be designed to activate at least one adjacent word line regardless of the address ADD<0:A> inputted together with the active commands after the first active command for the over-activated word line only in one of cases (A) and (B).

In the memory system in accordance with the embodiment of the present invention, even in the case where at least one adjacent word line to be activated in the compensation cycle during the operation in the special mode is a redundancy word line that is not allocated with an address, a normal compensating operation may be performed. Moreover, even in the case where the memory 510 includes a plurality of banks, a normal compensating operation may be performed, and a normal access operation may be performed for the bank not selected by the bank select information SBK in the special mode. Also, by activating only word lines necessary in respective situations, current and power consumption in the compensating operation may be reduced.

Figure 6:
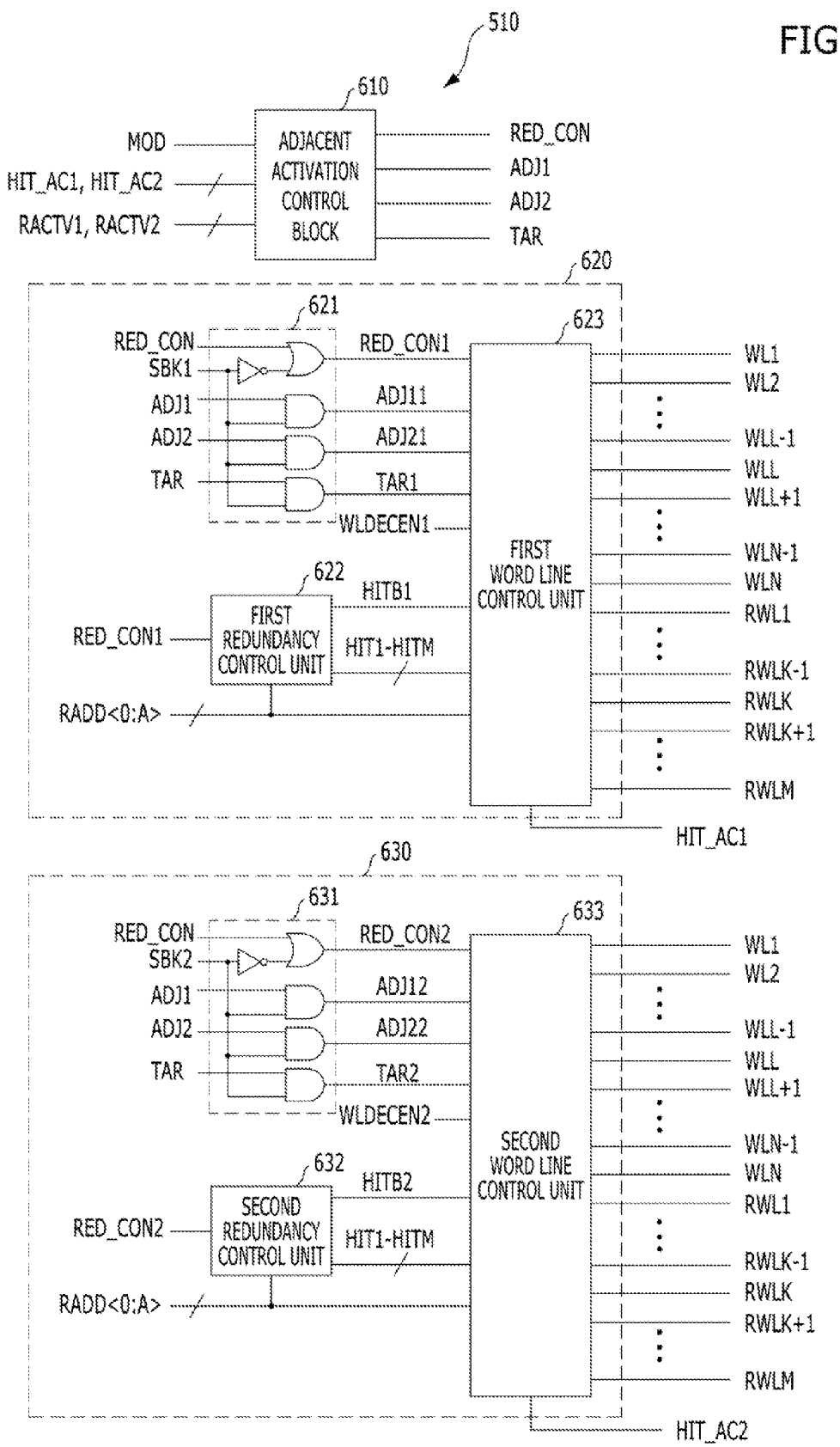
FIG. 6 is a configuration diagram illustrating a memory in accordance with the embodiment of the present invention.

FIG. 6 is a configuration diagram of the memory 510 in accordance with the embodiment of the present invention.

Referring to FIG. 6, the memory 510 includes the first to N$^{th}$ normal word lines WL1 to WLN, the first to M$^{th}$ redundancy word lines RWL1 to RWLM for replacing failed M normal word lines among the first to N$^{th}$ normal word lines WL1 to WLN, and a first control block 620, and a second control block 630. The first to N$^{th}$ normal word lines WL1 to WLN are sequentially disposed, and the first to M$^{th}$ redundancy word lines RWL1 to RWLM are sequentially disposed next to the N$^{th}$ normal word line WLN.

A first active signal and a second active signal RACTV1 and in RACTV2 are active signals corresponding to the first and the second banks BK1 and BK2, respectively. The memory 510 activates the first active signal RACTV1 in response to the bank address BA corresponding to the first bank BK1 and the active command, and activates the second active signal RACTV2 in response to the bank address BA corresponding to the second bank BK2 and the active command. The first active signal RACTV1 or the second active signal RACTV2 is deactivated when a precharge command is applied to the memory 510. An inputted address RADD<0:A> of FIG. 6 has the same value as the inputted address ADD<0:A> applied from the memory controller 520 and is synchronized with the internal operation timing of the memory 510.

The memory 510 will be described with reference to FIG. 6.

The Operation of the Memory 510 in the Special Mode

As the memory controller 520 inputs a combination of MRS commands and a specific address to the memory 510, the memory 510 enters the special mode (the mode signal MOD is activated). The memory controller 520 is configured to input to the memory 510 an excessive input address in the special mode in response to a result of counting the number of activations of the first to N$^{th}$ normal word lines WL1 to WLN in each of the banks BK1 and BK2. A bank for which a compensating operation is to be performed in the special mode is selected between the first and the second banks BK1 and BK2 by the combination of MRS commands and activated one of bank select signals included in the bank select information SBK. Hereinafter, descriptions will be made for the case where the special mode includes one compensation cycle for one excessive input address corresponding to the L$^{th}$ normal word line WLL.

Similar to the above description, cases (A) and (B), which will be described below, are where adjacent word lines to an over-activated word line may include at least one redundancy word line.

In case (A) where the over-activated word line is a redundancy word line, or a word line corresponding to the excessive input address RADD<0:A> among the first to $N^{th}$ normal word lines WL1 to WLN in one of the first and the second banks BK1 and BK2 selected by the bank select information SBK is replaced with the $K^{th}$ (1≤K≤M) redundancy word line RWLK among the first to $M^{th}$ redundancy word lines RWL1 to RWLM, the first control block 620 activates at least one adjacent word line to the $K^{th}$ redundancy word line RWLK in response to the active command for the selected bank.

In case (B) where the adjacent word lines partly include at least one redundancy word line, or at least one adjacent word line to an over-activated word line corresponding to the inputted address ADD<0:A> among the first to $N^{th}$ normal word lines WL1 to WLN in one of the first and the second banks BK1 and BK2 selected by the bank select information SBK includes at least one word line among the first to $M^{th}$ redundancy word lines RWL1 to RWLM, the first control block 620 activates the adjacent word line to the over-activated word line corresponding to the excessive input address ADD<0:A> among the first to $M^{th}$ redundancy word lines RWL1 to RWLM in response to the active command for the selected bank. For example, case (B) is the one where adjacent word lines to the over-activated $N^{th}$ normal word line WLN are the $N-1^{th}$ normal word line WLN-1 and the first redundancy word line RWL1.

The above cases (A) and (B) correspond to the case in which at least one adjacent word line to the over-activated word line designated by the excessive input address RADD<0:A> inputted when the active signal RACTV1 or RACTV2 is activated for the first time in the compensation cycle includes at least one redundancy word line among the first to $M^{th}$ redundancy word lines RWL1 to RWLM. In either one of cases (A) and (B), the first control block 620 activates the adjacent word lines, which may include at least one normal word line and at least one redundancy word line, regardless of the inputted address RADD<0:A> for the adjacent word lines.

In order to perform an operation of activating at least one adjacent word line to the over-activated word line with the number of activations that is equal to or greater than the reference number in one of the first and the second banks BK1 and BK2 selected by the bank select information SBK in the special mode, the active command and the bank address BA for designating one of the first and the second banks BK1 and BK2 are applied. For reference, the bank select information SBK includes a first bank select signal SBK1 and a second bank select signal SBK2. If the first bank select signal SBK1 is activated, the first bank BK1 is selected, and if the second bank select signal SBK2 is activated, the second bank BK2 is selected. Hereinafter, descriptions will be made for the case where the first bank BK1 is selected in the special mode.

The Operation of the Control Block 620 in Case (A)

When the first active signal RACTV1 is activated for the first time in the compensation cycle, if the value of the excessive input address RADD<0:A> is L, the first control block 620 activates the $K^{th}$ redundancy word line RWLK that replaces the $L^{th}$ normal word line WLL, and thus $K^{th}$ redundancy word line RWLK is the over-activated word line in the first bank BK1. Further, when the first active signal RACTV1 is activated for the second time, the first control block 620 activates the $K+1^{th}$ redundancy word line RWLK+1 as an adjacent word line to the $K^{th}$ redundancy word line RWLK, regardless of the inputted address RADD<0:A> with the value of L+1. When the first active signal RACTV1 is activated for the third time, the first control block 620 activates the $K-1^{th}$ redundancy word line RWLK-1 as the other adjacent word line to the $K^{th}$ redundancy word line RWLK regardless of the inputted address RADD<0:A> with the value of L-1. The order of activation of the $K+1^{th}$ redundancy word line RWLK+1 and the $K-1^{th}$ redundancy word line RWLK-1 may be changed according to a memory design. In the case where K is equal to one, that is, the over-activated word line corresponding to the excessive input address RADD<0:A> is replaced with the first redundancy word line RWL1, the second redundancy word line RWL2 and the $N^{th}$ normal word line WLN are sequentially activated as adjacent word lines to the over activated word line, namely the first redundancy word line RWL1, in response to the second and third activation of the first active signal RACTV1.

The Operation of the Control Block 620 in Case (B)

The first control block 620 activates the word line corresponding to the excessive input address RADD<0:A> in the first bank BK1 when the first active signal RACTV1 is activated for the first time in the compensation cycle. The over-activated word line corresponding to the excessive input address RADD<0:A> may be the $N^{th}$ normal word line WLN that is adjacent to the first redundancy word line RWL1.

When the first active signal RACTV1 is activated after the first active signal RACTV for the over-activated word line, the first control block 620 may activate at least one redundancy word line as an adjacent word line to the over-activated word line corresponding to the excessive input address RADD<0:A> among the first to $M^{th}$ redundancy word lines RWL1 to RWLM of the first bank BK1. For instance, when the first active signal RACTV1 is activated for the second time, the first control block 620 activates the first redundancy word line RWL1 as an adjacent word line to the over-activated $N^{th}$ normal word line WLN regardless of the inputted address RADD<0:A> for an adjacent word line. When the first active signal RACTV1 is activated for the third time, the first control block 620 activates the $N-1^{th}$ normal word line WLN-1 as the other adjacent word line to the over-activated $N^{th}$ normal word line WLN regardless of the inputted address RADD<0:A> for the other adjacent word line. The order of activation of the first redundancy word line RWL1 and the $N-1^{th}$ normal word line WLN-1 may be changed according to a memory design.

Except cases (A) and (B), that is, when an over-activated word line and all adjacent word lines are normal word lines, or the word line corresponding to the address RADD<0:A> is not replaced and is not adjacent to the first redundancy word line RWL1, the first control block 620 activates the word line corresponding to the inputted address RADD<0:A> in the selected bank when the active signal RACTV1 or RACTV2 for the selected bank is activated in the compensation cycle.

Meanwhile, the first control block 620 does not perform a redundancy operation (explained in connection with FIG. 3) for the address RADD<0:A> for the adjacent word lines inputted together with the second and third active signals RACTV after the first active signal RACTV for the over-activated word line in each compensation cycle, and maintains the states of signals associated with the redundancy operation in the states after the active signal RACTV1 or RACTV2 is inputted. It is a word line physically adjacent to the over-activated word line that needs to be protected against the word line disturbance. Therefore, a nominally adjacent word line, which is not physically adjacent to the over-activated word line, need not be activated for protection from the word line disturbance. The nominally adjacent word line is caused by replacement to a redundancy word line from a normal word line. For example, assume that an excessive input address is 5, and thus, the over-activated word line is a fifth normal word line and that a fourth normal word line, which corresponds to an address 4 and is physically adjacent to the over-activated fifth normal word line, is replaced with a third redundancy word line. Even though the third redundancy word line may be nominally an adjacent word line to the fifth normal word line according to the replacement, the third redundancy word line is not influenced by word line disturbance since it is not physically adjacent to the over-activated word line or the fifth normal word line. Accordingly, the first control block 620 does not perform a redundancy operation for the address 4 and the third redundancy word line in the compensation cycle.

The Operation of the Control Block 520 in the Normal Access Mode

The first control block 620 activates a word line corresponding to the inputted address RADD<0:A> when the active signal RACTV1 or RACTV2 of the selected bank is activated. In the case where the word line corresponding to the inputted address RADD<0:A> is replaced with a redundancy word line, the first control block 620 activates the redundancy word line that replaces the word line corresponding to the inputted address RADD<0:A>.

In the above descriptions, it is explained that the first control block 620 of one of cases (A) and (B) activates adjacent word lines regardless of the address RADD<0:A> inputted together with the active signal RACTV1 or RACTV2 of the selected bank after the first active signal RACTV1 or RACTV2 for the over-activated word line. The first control block 620 may be designed to activate at least one adjacent word line regardless of the address RADD<0:A> inputted together with the active signal RACTV1 or RACTV2 of the selected bank is activated after the first active command for the over-activated word line only in case (A) or (B).

The bit numbers of the bank address and the bank select information SBK may vary according to the number of banks. While it was explained in the above-described example that the first bank BK1 is selected and the compensating operation is performed for the first bank BK1, it is to be noted that the second bank BK2 may be selected and a compensating operation may be performed for the second bank BK2.

For the above-described operations, referring to FIG. 6, the control circuit 510 includes an adjacent activation control block 610, a first control block 620, and a second control block 630. The configurations and the operations of the respective control blocks 610, 620 and 630 will be described below.

In case (A) where the over-activated word line is a redundancy word line, or the word line corresponding to the excessive input address RADD<0:A> among the first to $N^{th}$ normal word lines WL1 to WLN in the bank selected by the bank select information SBK during the operation under the special mode is replaced with the $K^{th}$ redundancy word line RWLK, the adjacent activation control block 610 activates at least one of the adjacent control signals ADJ1 and ADJ2 each time the active signal RACTV1 or RACTV2 of the selected bank is activated.

Also, in case (B) where the adjacent word lines partly include at least one redundancy word line, or at least one adjacent word line to an over-activated word line corresponding to the excessive input address RADD<0:A> in the bank selected by the bank select information SBK during the operation under the special mode includes at least one redundancy word line among the first to $M^{th}$ redundancy word lines RWL1 to RWLM, the adjacent activation control block 610 activates at least one of the adjacent control signals ADJ1 and ADJ2 each time the active signal RACTV1 or RACTV2 of the selected bank is activated.

In case (A) or (B) where at least one adjacent word line to the over-activated word line designated by the inputted address RADD<0:A> in the selected bank during the operation under the special mode include at least one redundancy word line among the first to $M^{th}$ redundancy word lines RWL1 to RWLM, the adjacent activation control block 610 activates at least one of the adjacent control signals ADJ1 and ADJ2 each time the active signal RACTV1 or RACTV2 of the selected bank is activated.

In detail, the adjacent activation control block 610 generates a redundancy control signal RED_CON, a target control signal TAR and at least one of the adjacent control signals ADJ1 and ADJ2 in response to the mode signal MOD, one or more redundancy word line state signals HIT_AC1 and HIT_AC2 and the one or more active signals RACTV1 and RACTV2. In an initial state the adjacent activation control block 610 activates the redundancy control signal RED_CON and the target control signal TAR and deactivates the adjacent control signals ADJ1 and ADJ2.

The first adjacent control signal ADJ1 is a signal for activating an adjacent word line disposed after the over-activated word line activated in response to the excessive input address RADD<0:A> inputted when the active signal RACTV1 or RACTV2 of the selected bank is activated for the first time in the compensation cycle, and the second adjacent control signal ADJ2 is a signal for activating an adjacent word line disposed before the over-activated word line activated in response to the address RADD<0:A> inputted when the active signal RACTV1 or RACTV2 of the selected bank is activated for the first time in the compensation cycle. For instance, in the case where the first bank BK1 is selected, the value of the excessive input address RADD<0:A> inputted when the first active signal RACTV1 is activated for the first time in the compensation cycle is L and the $L^{th}$ normal word line WLL is replaced with the $K^{th}$ redundancy word line RWLK the over-activated word line is the $K^{th}$ redundancy word line RWLK, the first adjacent control signal ADJ1 is a signal for controlling the $K+1^{th}$ redundancy word line RWLK+1, and the second adjacent control signal ADJ2 is a signal for controlling the $K-1^{th}$ redundancy word line RWLK-1. The first redundancy word line state signal HIT_AC1 indicates whether a redundancy word line is to be activated or not in the first bank BK1, and the second redundancy word line state signal HIT_AC2 indicates whether a redundancy word line is to be activated or not in the second bank BK2. Identification or the number of the adjacent word lines, and thus the number of the adjacent control signals may vary according to a memory design.

In the case where the mode signal MOD and at least one redundancy word line state signal of the one or more redundancy word line state signals HIT_AC1 and HIT_AC2 are activated, namely in case (A) or (B), when the firstly activated active signal RACTV1 or RACTV2 of the selected bank is deactivated, the adjacent activation control block 610 deactivates the redundancy control signal RED_CON and the target control signal TAR and activates the first adjacent control signal ADJ1. When the secondly activated active signal RACTV1 or RACTV2 of the selected bank is deactivated, the adjacent activation control block 610 deactivates the first adjacent control signal ADJ1 and activates the second adjacent control signal ADJ2. When the thirdly activated active signal RACTV1 or RACTV2 of the selected bank is deactivated, the adjacent activation control block 610 deactivates the second adjacent control signal ADJ2 and activates the redundancy control signal RED_CON and the target control signal TAR (the compensation cycle ends and return is made to the initial state).

In the case where the mode signal MOD is activated and both of the redundancy word line state signals HIT_AC1 and HIT_AC2 are deactivated, which means that an over-activated word line and all adjacent word lines are normal word lines, when the firstly activated active signal RACTV1 or RACTV2 of the selected bank is deactivated, the adjacent activation control block 610 deactivates the redundancy control signal RED_CON. When the secondly activated active signal RACTV1 or RACTV2 of the selected bank is deactivated, the adjacent activation control block 610 maintains the previous state (the state in which only the target control signal TAR is activated among the four signals RED_CON, TAR, ADJ1 and ADJ2). When the thirdly activated active signal RACTV1 or RACTV2 of the selected bank is deactivated, the adjacent activation control block 610 activates the redundancy control signal RED_CON (the compensation cycle ends and return is made to the initial state).

In the case where the mode signal MOD is deactivated, the adjacent activation control block 610 maintains the initial state, that is, the state in which the redundancy control signal RED_CON and the target control signal TAR are activated and the adjacent control signals ADJ1 and ADJ2 are deactivated, regardless of toggle of the active signal RACTV1 or RACTV2 of the selected bank.

In case (A) where the over-activated word line is a redundancy word line, or the word line corresponding to the excessive input address RADD<0:A> among the first to $N^{th}$ normal word lines WL1 to WLN in the first bank BK1 is replaced with the $K^{th}$ redundancy word line RWLK when the first bank BK1 is selected in the special mode, the first control block 620 activates at least one adjacent word line to the $K^{th}$ redundancy word line RWLK in response to the first active signal RACTV1, at least one of the adjacent control signals ADJ1 and ADJ2 and the $K^{th}$ redundancy signal HITK in the first bank BK1.

In case (B) where the adjacent word lines partly include at least one redundancy word line, or the over-activated word line corresponding to the excessive input address RADD<0:A> in the first bank BK1 is next to the first redundancy word line RWL1, for example in case of the over-activated $N^{th}$ normal word line WLN, when the first bank BK1 is selected in the special mode, the first control block 620 activates at least one adjacent word line to the over-activated word line corresponding to the excessive input address RADD<0:A> among the first to $N^{th}$ normal word lines WL1 to WLN in response to the first active signal RACTV1 corresponding to the first bank BK1, at least one of the adjacent control signals ADJ1 and ADJ2, and the first redundancy signal HIT1.

For such operations, the first control block 620 includes a first signal transfer block 621, a first redundancy control block 622, and a first word line control block 623.

In the case where the first bank select signal SBK1 is activated and the first bank BK1 is selected, the first signal transfer block 621 transfers the redundancy control signal RED_CON, the target control signal TAR, at least one of the adjacent control signals ADJ1 and ADJ2 as a first redundancy control signal REC_CON1, a first target control signal TAR1, and one or more first bank adjacent control signals ADJ11 and ADJ21. In the case where the first bank select signal SBK1 is deactivated, the first redundancy control signal REC_CON1 is maintained in the activated state, and the first target control signal TAR1 and the one or more first bank adjacent control signals ADJ11 and ADJ21 are maintained in the deactivated states.

The first redundancy control block 622 generates first to $M^{th}$ redundancy signals HIT1 to HITM corresponding to the first to $M^{th}$ redundancy word lines RWL1 to RWLM. In the case where the normal word line corresponding to the excessive input address RADD<0:A> among the first to $N^{th}$ normal word lines WL1 to WLN is replaced with the $K^{th}$ redundancy word line RWLK, the first redundancy control block 622 activates the $K^{th}$ redundancy signal HITK corresponding to the $K^{th}$ redundancy word line RWLK in response to the excessive input address RADD<0:A>.

In detail, while the first redundancy control block 622 stores the address corresponding to the word line to be replaced among the first to $N^{th}$ normal word lines WL1 to WLN in the case where the first redundancy control signal RED_CON1 is activated, if the value of the address stored therein is identical to the value of the inputted address RADD<0:A>, the first redundancy control block 622 activates corresponding one from the first to $M^{th}$ redundancy word lines RWL1 to RWLM. At this time, a first redundancy enable signal HITB1 indicating that the redundancy operation is being performed is activated together (to level LOW). Conversely, in the case where the first redundancy control signal RED_CON1 is deactivated, the first redundancy control block 622 keeps previous states of the first to $M^{th}$ redundancy signals HIT1 to HITM and the first redundancy enable signal HITB1 regardless of whether the value of the inputted address RADD<0:A> is identical to the value of the address stored therein.

In other words, in the case where the first redundancy control signal RED_CON1 is activated, the first redundancy control block 622 compares the inputted address RADD<0:A> with the stored value and updates one redundancy signal among the first to $M^{th}$ redundancy signals HIT1 to HITM and the first redundancy enable signal HITB1. In the case where the first redundancy control signal RED_CON1 is deactivated, the first redundancy control block 622 keeps previous states of the first to $M^{th}$ redundancy signals HIT1 to HITM and the first redundancy enable signal HITB1 regardless of a result of comparing the inputted address RADD<0:A> with the stored address.

The first redundancy control signal RED_CON1 is generated by the redundancy control signal RED_CON in the case where the first bank select signal SBK1 is activated. While the first redundancy control block 622 operates in the special mode through the operation of the adjacent activation control block 610, the first redundancy control signal RED_CON1 is deactivated during a period from a time at which the firstly activated first active signal RACTV1 is deactivated to a time at which the thirdly activated first active signal RACTV1 is deactivated in each compensation cycle, and is activated during a remaining period. In the case where the first bank BK1 is not selected or the first redundancy control block 622 operates in the normal access mode, the first redundancy control signal RED_CON1 is always maintained in the activated state. The thirdly activated first active signal RACTV1 means the first active signal RACTV1 that is finally activated in each compensation cycle. The number of activation time of the first active signal RACTV1 depends on the number of the adjacent word line that may vary according to a memory design.

Accordingly, in the case where the value of the address RADD<0:A> inputted when the first active signal RACTV1 is activated for the first time in the compensation cycle is identical to the value of the address stored therein, the first redundancy control block 622 activates one redundancy signal corresponding to the value of the address stored therein among the first to $M^{th}$ redundancy signals HIT1 to HITM and the first redundancy enable signal HITB1 and keeps current states in the remaining period of the compensation cycle. In the case where the value of the address RADD<0:A> inputted when the first active signal RACTV1 or RACTV2 is activated for the first time in the compensation cycle is not the address stored therein, the first redundancy control block 622 does not activate the first to $M^{th}$ redundancy signals HIT1 to HITM and the first redundancy enable signal HITB1 and keeps these states in the remaining period of the compensation cycle.

In the case where the value of the address RADD<0:A> inputted when the first active signal RACTV1 is activated for the first time in the compensation cycle is identical to the value of the address stored therein, a redundancy signal corresponding to a redundancy word line that replaces a normal word line of the inputted address RADD<0:A> stays active during the compensation cycle.

In case (A) where the over-activated word line is a redundancy word line, or a word line corresponding to the excessive input address RADD<0:A> in the first bank BK1 is replaced with the $K^{th}$ redundancy word line RWLK, the first word line control block 623 activates at least one adjacent word line to the $K^{th}$ redundancy word line RWLK in response to the first active signal RACTV1, the one or more first bank adjacent control signals ADJ11 and ADJ21, and the $K^{th}$ redundancy signal HITK when the first bank BK1 is selected in the special mode.

Furthermore, in case (B) where the adjacent word lines partly include at least one redundancy word line, or a word line corresponding to the excessive input address RADD<0:A> in the first bank BK1 is adjacent to the first redundancy word line RWL1 the first word line control block 623 activates at least one adjacent word line to an over-activated word line corresponding to the excessive input address RADD<0:A> in response to the first active signal RACTV1, the one or more first bank adjacent control signals ADJ11 and ADJ21 and a signal indicating activation of the over-activated word line, when the first bank BK1 is selected in the special mode.

In detail, the first word line control block 623 activates an appropriate word line in response to the first active signal RACTV1, a first word line decoding enable signal WLDECEN1 the inputted address RADD<0:A>, the first target control signal TAR1, the first to $M^{th}$ redundancy signals HIT1 to HITM, and the first redundancy enable signal HITB1. The first word line decoding enable signal WLDECEN1 is activated after a delay defined from the activation of the first active signal RACTV1 to determination of the activation of the first redundancy enable signal HITB1 (whether or not the value of the input address RADD<0:A> is identical to the value of the address stored in the first redundancy control block 622) is determined in response to the inputted address RADD<0:A> in the first redundancy control block 622, stays active for a predetermined period, and is then deactivated.

With the first active signal RACTV1 deactivated, the first word line control block 623 keeps deactivated states of the first to $N^{th}$ normal word lines WL1 to WLN and the first to $M^{th}$ redundancy word lines RWL1 to RWLM. After the first active signal RACTV1 is activated, activation of the first word line decoding enable signal WLDECEN1 causes activation of the word line corresponding to the excessive input address RADD<0:A>.

In the case where a word line corresponding to the excessive input address RADD<0:A> inputted under the first activation of the first active signal RACTV1 in the compensation cycle of the special mode is not replaced, the first word line control block 623 sequentially activates word lines corresponding to the addresses RADD<0:A> inputted when the first active signal RACTV1 is activated for the second and third times. However, the first word line control block 623 does not activate a redundancy word line that replaces a normal word line of the address RADD<0:A> inputted when the first active signal RACTV1 is activated for the second and third times.

In case (A) where the over-activated word line is a redundancy word line, or a word line corresponding to the address RADD<0:A> inputted when the first active signal RACTV1 is activated for the first time in the compensation cycle under the special mode is replaced with the $K^{th}$ redundancy word line RWLK, the first word line control block 623 activates the $K^{th}$ redundancy word line RWLK in response to the first redundancy enable signal HITB1, the first target control signal TAR1, and the $K^{th}$ redundancy signal HITK. When the first active signal RACTV1 is activated for the second time in the compensation cycle, the first word line control block 623 does not activate a word line corresponding to the inputted address RADD<0:A> but activates the $K+1^{th}$ redundancy word line RWLK+1 in response to the $K^{th}$ redundancy signal HITK and the first bank adjacent control signal ADJ11. When the first active signal RACTV1 is activated for the third time in the compensation cycle, the first word line control block 623 does not activate a word line corresponding to the inputted address RADD<0:A>, but activates the $K-1^{th}$ redundancy word line RWLK-1 in response to the $K^{th}$ redundancy signal HITK and the first bank adjacent control signal ADJ21.

Moreover, in case (B) where the adjacent word lines include at least one redundancy word line, or a word line corresponding to the excessive input address RADD<0:A> inputted when the first active signal RACTV1 is activated for the first time in the compensation cycle is adjacent to the first redundancy word line RWL1, for example, the $N^{th}$ normal word line WLN, when the first active signal RACTV1 is activated for the second time in the compensation cycle, the first word line control block 623 does not activate a word line corresponding to the address RADD<0:A> inputted at that time, but the first redundancy word line RWL1 in response to a signal HWLN indicating that the address RADD<0:A> corresponding to the $N^{th}$ normal word line WLN is inputted and the first bank adjacent control signal ADJ11. When the first active signal RACTV1 is activated for the third time in the compensation cycle, the first word line control block 623 does not activate a word line corresponding to the inputted address RADD<0:A>, but activates the $N-1^{th}$ normal word line WLN-1 in response to the signal HWLN indicating that the address RADD<0:A> corresponding to the $N^{th}$ normal word line WLN is inputted and the first bank adjacent control signal ADJ21.

When operating in the normal access mode, in the case where the first bank BK1 corresponds to the bank address BA and a word line corresponding to the inputted address RADD<0:A> is not replaced, the first word line control block 623 activates the word line corresponding to the inputted address RADD<0:A>. In the case where the first bank BK1 corresponds to the bank address BA and a word line corresponding to the inputted address RADD<0:A> is replaced, the first word line control block 623 activates a redundancy word line that replaces the word line corresponding to the inputted address RADD<0:A>. At this time, a word line corresponding to the address RADD<0:A> inputted in response to the first redundancy enable signal HITB1 is not activated.

In case (A) where the over-activated word line is a redundancy word line, or the word line corresponding to the excessive input address RADD<0:A> among the first to $N^{th}$ normal word lines WL1 to WLN in the second bank BK2 is replaced with the $K^{th}$ redundancy word line RWLK when the second bank BK2 is selected in the special mode, the second control block 630 activates at least one adjacent word line to the $K^{th}$ redundancy word line RWLK in response to the second active signal RACTV2, at least one of the adjacent control signals ADJ1 and ADJ2, and the $K^{th}$ redundancy signal HITK in the second bank BK2.

In case (B) where the adjacent word lines partly include at least one redundancy word line, or the over-activated word line corresponding to the excessive input address RADD<0:A> in the second bank BK2 is adjacent to the first redundancy word line RWL1, for example, in case of the over-activated $N^{th}$ normal word line WLN, when the second bank BK2 is selected in the special mode, the second control block 630 activates at least one adjacent word line to the over-activated word line corresponding to the excessive input address RADD<0:A> among the first to $N^{th}$ normal word lines WL1 to WLN in response to the second active signal RACTV2 corresponding to the second bank BK2, at least one of the adjacent control signals ADJ1 and ADJ2, and the second redundancy signal HIT2.

For such operations, the second control block 630 includes a second signal transfer block 631, a second redundancy control block 632, and a second word line control block 633. The second control block 630 has substantially the same configuration and operation as those of the first control block 620. In the case where the second bank select signal SBK2 is activated in the special mode, the second control block 630 controls the second bank BK2 in substantially the same manner as the first control block 620 controls the first bank BK1.

In the memory in accordance with the embodiment of the present invention, when operating in the special mode, in case (A) where the over-activated word line is a redundancy word line, or a word line corresponding to the excessive input address inputted together with a first active command in a compensation cycle is replaced with a redundancy word line, or in case (B) where the adjacent word lines partly include at least one redundancy word line, or at least one adjacent word line to an over-activated word line corresponding to the excessive input address RADD<0:A> inputted in the special mode includes at least one redundancy word line, adjacent word lines to the over-activated word line are activated regardless of the address inputted in the corresponding compensation cycle, whereby a normal compensating operation may be performed even when a normal word line is replaced with a redundancy word line. Moreover, even in the case where a memory includes a plurality of banks, a compensating operation may be performed to a selected bank. Also, since only word lines necessary in each situation are activated, current and power consumption in the compensating operation may be reduced.

Figure 7:
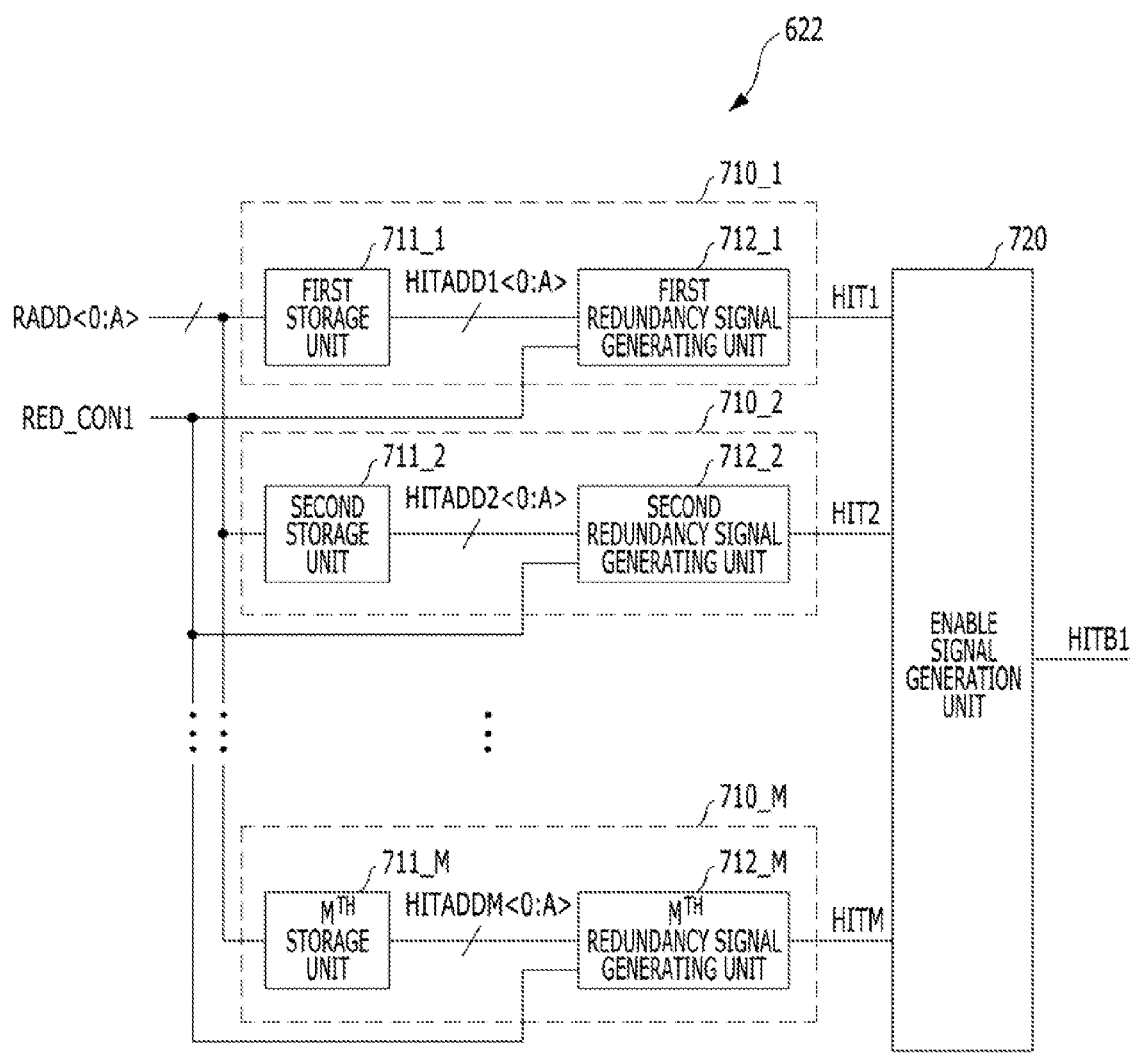
FIG. 7 is a detailed configuration diagram illustrating a first redundancy control block illustrated in FIG. 6.

FIG. 7 is a detailed configuration diagram of the first redundancy control block 622 illustrated in FIG. 6.

The first redundancy control block 622 includes first to $M^{th}$ unit redundancy control units 710_1 to 710_M each configured to activate its redundancy signal in the case where the value of an inputted address RADD<0:A> is identical to the value stored therein, and a first enable signal generation unit 720 configured to generate the first redundancy enable signal HITB1 that is activated when at least one redundancy signal among the first to $M^{th}$ redundancy signals HIT1 to HITM is activated. The first to $M^{th}$ redundancy signals HIT1 to HITM respectively correspond to the first to $N^{th}$ normal word lines WL1 to WLN of the first bank BK1. The configurations and operations of the first to $M^{th}$ unit redundancy control units 710_1 to 710_M are substantially the same. The configuration and operation of an $M^{th}$ unit redundancy control unit 710_M among the first to $M^{th}$ unit redundancy control units 710_1 to 710_M will be described below.

The $M^{th}$ unit redundancy control unit 710_M includes an $M^{th}$ storage unit 711_M configured to store the address of a word line to replace and generate $M^{th}$ comparison information HITADDM<0:A> by comparing the respective bits of the value stored therein and the respective bits of an inputted address RADD<0:A>, and an $M^{th}$ redundancy signal generating unit 712_M configured to generate an $M^{th}$ redundancy signal HITM and update the state of the $M^{th}$ redundancy signal HITM in response to the $M^{th}$ comparison information HITADDM<0:A> in the state in which the first redundancy control signal RED_CON1 is activated.

The $M^{th}$ storage unit 711_M activates all bits of the $M^{th}$ comparison information HITADDM<0:A> in the case where all bits of the value stored therein and all bits of the inputted address RADD<0:A> are substantially the same with one another. The $M^{th}$ redundancy signal generating unit 712_M activates the $M^{th}$ redundancy signal HITM when all bits of the $M^{th}$ comparison information HITADDM<0:A> are activated in the state in which the first redundancy control signal RED_CON1 is activated, and deactivates the $M^{th}$ redundancy signal HITM in the case where even any one of all bits of the $M^{th}$ comparison information HITADDM<0:A> is not activated in the state in which the first redundancy control signal RED_CON1 is activated. In the case where the first redundancy control signal RED_CON1 is deactivated, the $M^{th}$ redundancy signal generating unit 712_M causes the $M^{th}$ redundancy signal HITK to maintain the state at the time when the first redundancy control signal RED_CON1 is deactivated regardless of whether all bits of the $M^{th}$ comparison information HITADDM<0:A> are activated.

Figure 8:
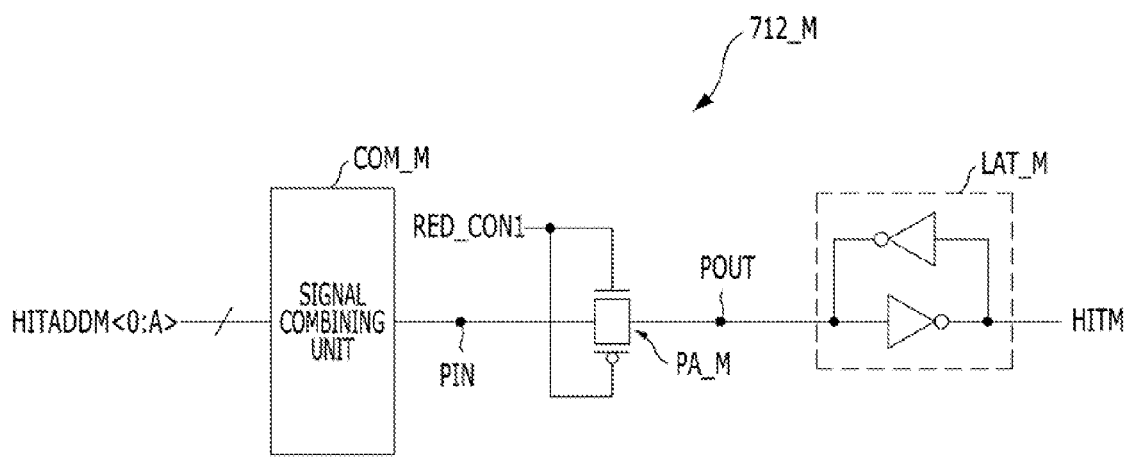
FIG. 8 is a detailed configuration diagram illustrating an $M^{th}$ redundancy signal generating unit illustrated in FIG. 7.

FIG. 8 is a detailed configuration diagram of the $M^{th}$ redundancy signal generating unit 712_M illustrated in FIG. 7.

Referring to FIG. 8, the $M^{th}$ redundancy signal generating unit 712_M includes a pass gate PA_M configured to allow or intercept the transfer of an input thereto as an output in response to the redundancy control signal RED_CON, a signal combining unit COM_M configured to activate (to level LOW) the input to the pass gate PA_M in the case where all bits of the $M^{th}$ comparison information HITADDM<0:A> are activated, and a latch LAT_M configured to invert the output value of the pass gate PA_M and to latch the output value of the pass gate PA_M in the case where input to the pass gate PAM is blocked.

The signal combining unit COM_M activates (to level LOW) an input PIN to the pass gate PA_M in the case where all respective bits of the $M^{th}$ comparison information HITADDM<0:A> are activated (to level HIGH), and deactivates (to level HIGH) the input PIN to the pass gate PA_M in the case where even one of the respective bits of the $M^{th}$ comparison information HITADDM<0:A> is deactivated (to level LOW). The pass gate PA_M transfers the input PIN thereto as an output POUT in the case where the redundancy control signal RED_CON is activated, and intercepts the transfer of the input PIN thereto as the output POUT in the case where the redundancy control signal RED_CON is deactivated.

Referring back to FIG. 7, the enable signal generation unit 720 activates (to level LOW) the first redundancy enable signal HITB1 when at least one redundancy signal among the first to $M^{th}$ redundancy signals HIT1 to HITM is activated, and deactivates the first redundancy enable signal HITB1 when all the first to $M^{th}$ redundancy signals HIT1 to HITM are deactivated.

The configuration and operation of the second redundancy control block 633 are substantially similar to those of the first redundancy control block 623 except that the second redundancy control block 633 performs a redundancy operation for the second bank BK2 and control associated therewith.

Figure 9:
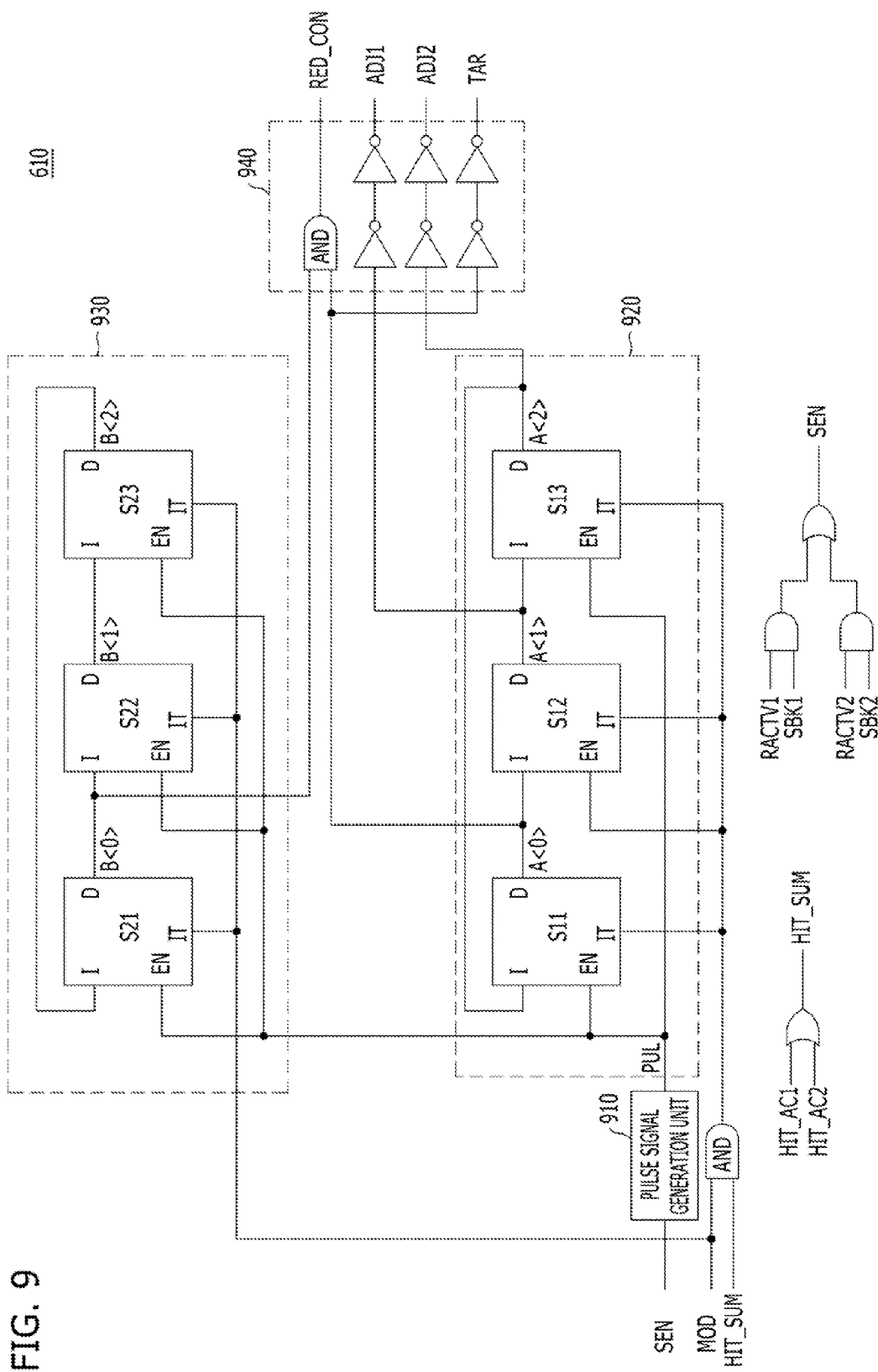
FIG. 9 is a detailed configuration diagram illustrating an adjacent activation control block illustrated in FIG. 6.

FIG. 9 is a detailed configuration diagram of an adjacent activation control block 610 illustrated in FIG. 6.

Referring to FIG. 9, the adjacent activation control block 610 includes a pulse generation unit 910, a first shifting unit 920, a second shifting unit 930, and a signal generation unit 940.

Operations of the adjacent activation control block 610 will be described below with reference to FIG. 9.

The pulse generation unit 910 generates the pulse signal PUL having the predetermined duration at each deactivation time of the active signal RACTV1 or RACTV2 of the bank selected by the bank select signal SBK1 or SBK2, and transfers the generated pulse signal PUL to the first shifting unit 920 and the second shifting unit 930. In detail, the pulse generation unit 910 generates the pulse signal PUL having the predetermined duration at each deactivation time of a shifting enable signal SEN. The shifting enable signal SEN is generated by transferring the active signal RACTV1 or RACTV2 of the bank selected by the bank select signal SBK1 or SBK2. For example, in the case where the first bank BK1 is selected (the first bank select signal SBK1 is activated), the first active signal RACTV1 is transferred as the shifting enable signal SEN, and, in the case where the second bank BK2 is selected (the second bank select signal SBK2 is activated), the second active signal RACTV2 is transferred as the shifting enable signal SEN. The shifting enable signal SEN may be generated by performing logical OR operation on the signals generated by performing logical AND operation on bank select signals and active signals of corresponding bank. For example, the shifting enable signal SEN may be generated by performing logical OR operation on a signal generated by performing logical AND operation on the first bank select signal SBK1 and the first active signal RACTV1 and a signal generated by performing logical AND operation on the second bank select signal SBK2 and the second active signal RACTV2.

The first shifting unit 920 includes a plurality of first unit shifting units S11, S12 and S13 that are connected in series. While the plurality of first unit shifting units S11, S12 and S13 are in initial states, if the mode signal MOD and a state signal HIT_SUM are activated, the plurality of first unit shifting units S11, S12 and S13 shift their outputs each time the pulse signal PUL is activated and generate a plurality of first signals A<0:2>. A<0> is the output of the first unit shifting unit S11, A<1> is the output of the first unit shifting unit S12, and A<2> is the output of the first unit shifting unit S13. In the initial states, the initial values of the plurality of first signals A<0:2> are (A<0>, A<1>, A<2>) (1, 0, 0). The state signal HIT_SUM is activated when at least one of the one or more redundancy word line state signals HIT_AC1 and HIT_AC2 is activated. The state signal HIT_SUM may be generated by performing logical OR operation on the one or more redundancy word line state signals HIT_AC1 and HIT_AC2.

The second shifting unit 930 includes a plurality of second unit shifting units S21, S22 and S23 that are connected in series. While the plurality of second unit shifting units S21, S22 and S23 are in initial states, if the mode signal MOD is activated, the plurality of second unit shifting units S21, S22 and S23 shift their outputs each time the pulse signal PUL is activated and generate a plurality of second signals B<0:2>. B<0> is the output of the second unit shifting unit S21, B<1> is the output of the second unit shifting unit S22, and B<2> is the output of the second unit shifting unit S23. In the initial states, the values of the plurality of second signals B<0:2> are initialized to (B<0>, B<1>, B<2>)=(1, 0, 0).

The signal generation unit 940 is configured to combine the plurality of first signals A<0:2> and the plurality of second signals B<0:2> and to generate the redundancy control signal RED_CON, the target control signal TAR, the first adjacent control signal ADJ1, and the second adjacent control signal ADJ2. In detail, the signal generation unit 940 generates the redundancy control signal RED_CON by performing logical AND operation on the first signal A<0> and the second signal 0> generates the target control signal TAR by driving the first signal A<0>, generates the first adjacent control signal ADJ1 by driving the first signal A<1>, and generates the second adjacent control signal ADJ2 by driving the first signal A<2>.

Among the respective terminals of the plurality of first unit shifting units S11, S12 and S13 and the plurality of second unit shifting units S21, S22 and S23, I terminals indicate input terminals D terminals indicate output terminals, EN terminals indicate enable terminals, and IT terminals indicate initialization terminals. In the state in which the initialization terminals IT are deactivated, the respective unit shifting units receive and store the signals inputted through the input terminals I, and output stored values through the output terminals D. The respective unit shifting units output initial values in the state in which the initialization terminals IT are activated. The initial values of the first signal A<0> and the second signal S<0> as the output signals of the unit shifting units S11 and S21 are 1, and the initial values of the first signals A<1> and A<2> and the second signals B<1> and B<2> as the output signals of the unit shifting units S12, S13, S22 and S23 are 0.

Hereinafter, descriptions will be made for values of the plurality of first signals A<0:2>, the plurality of second signals B<0:2>, the redundancy control signal RED_CON, the target control signal TAR, the first adjacent control signal ADJ1, and the second adjacent control signal ADJ2 have the operations of the memory.

In the state in which the mode signal MOD and the state signal HIT_SUM are activated (in case (A) or (B) where a redundancy word line of one of the first and the second banks BK1 and BK2 is activated in the special mode), all the signals applied to the initialization terminals IT of the plurality of first unit shifting units S11, S12 and S13 and the plurality of second unit shifting units S21, S22 and S23 are deactivated. Accordingly, all of the plurality of first unit shifting units S11, S12 and S13 and the plurality of second unit shifting units S21, S22 and S23 perform shifting operations in response to the pulse signal PUL inputted through the enable terminals EN.

The shifting enable signal SEN is activated when the active signal RACTV1 or RACTV2 of the selected bank is activated and is deactivated when the active signal RACTV1 or RACTV2 of the selected bank is deactivated.

In the initial state and during the period in which the active signal RACTV1 or RACTV2 of the selected bank is activated for the first time in the compensation cycle, (A<0>, A<1>, A<2>)=(1, 0, 0) and (B<0>, b<1>, B<2>)=(1, 0, 0) are maintained. At this time, the redundancy control signal RED_CON and the target control signal TAR are in the activated states, and the first adjacent control signal ADJ1 and the second adjacent control signal ADJ2 are in the deactivated states.

If the firstly activated active signal RACTV1 or RACTV2 of the selected bank is deactivated, changes are made to (A<0>, A<1>, A<2>)=(0, 1, 0) and (B<0>, B<1>, B<2>) (0, 1, 0), and these values are maintained until the secondly activated active signal RACTV1 or RACTV2 of the selected bank is deactivated in the compensation cycle. At this time, the redundancy control signal RED_CON and the target control signal TAR are in the deactivated states, the first adjacent control signal ADJ1 is in the activated state, and the second adjacent control signal ADJ2 is in the deactivated state.

If the secondly activated active signal RACTV1 or RACTV2 of the selected bank is deactivated, changes are made to (A<0>, A<1>, A<2>)=(0, 0, 1) and (B<0>, B<1>, B<2>)=(0, 0, 1) and these values are maintained until the thirdly activated active signal RACTV1 or RACTV2 of the selected bank is deactivated in the compensation cycle. At this time, the redundancy control signal RED_CON, the target control signal TAR and the first adjacent control signal ADJ1 are in the deactivated states, and the second adjacent control signal ADJ2 is in the activated state.

Finally, the thirdly activated active signal RACTV1 or RACTV2 of the selected bank is deactivated, and changes are made to (A<0>, A<1>, A<2>)=(1, 0, 0) and (B<0>, B<1>, B<2>)=(1, 0, 0). That is to say, the state becomes initialized.

In the state in which the mode signal MOD is activated and the state signal HIT_SUM is deactivated (in the case where a redundancy word line of one of the first and the second banks BK1 and BK2 is not activated, i.e. an over-activated word line and all adjacent word lines are normal word lines in the special mode), the signals applied to the initialization terminals IT of the plurality of first unit shifting units S11, S12 and S13 maintain activated states, and the signals applied to the initialization terminals IT of the plurality of second unit shifting units S21, S22 and S23 are deactivated. Accordingly, the plurality of second unit shifting units S21, S22 and S23 perform shifting operations in response to the pulse signal PUL inputted through the enable terminals EN, and the plurality of first unit shifting units S11, S12 and S13 maintain the initial state (the state in which the respective bits A<0>, A<1> and A<2> of the first signals A<0:2> are (1, 0, 0)). In the initial state and during the period in which the active signal RACTV1 or RACTV2 of the selected bank is activated for the first time in the compensation cycle, (B<0>, B<1>, B<2>)=(1, 0, 0) is maintained.

If the firstly activated active signal RACTV1 or RACTV2 of the selected bank is deactivated, changes are made to (B<0>, B<1>, B<2>)=(0, 1, 0), and these values are maintained until the secondly activated active signal RACTV1 or RACTV2 of the selected bank is deactivated in the compensation cycle. At this time, the redundancy control signal RED_CON is in the deactivated state, the target control signal TAR is in the activated state, and the first adjacent control signal ADJ1 and the second adjacent control signal ADJ2 are in the deactivated states.

If the secondly activated active signal RACTV1 or RACTV2 of the selected bank is deactivated, changes are made to (B<0>, B<1>, B<2>)=(0, 0, 1), and these values are maintained until the thirdly activated active signal RACTV1 or RACTV2 of the selected bank is deactivated in the compensation cycle. At this time, the redundancy control signal RED_CON is in the deactivated state, the target control signal TAR is in the activated state, and the first adjacent control signal ADJ1 and the second adjacent control signal ADJ2 are in the deactivated states.

Finally, the thirdly activated active signal RACTV1 or RACTV2 is deactivated, and changes are made to (B<0>, B<1>, B<2>)=(1, 0, 0). That is to say, the state becomes initialized.

In the state in which the mode signal MOD is deactivated (in the normal access mode), all the signals applied to the initialization terminals IT of the plurality of first unit shifting units S11, S12 and S13 and the plurality of second unit shifting units S21, S22 and S23 maintain the deactivated states. Accordingly, the plurality of first signals A<0:2> and the plurality of second signals B<0:2> maintain the initial states as (A<0>, A<1>, A<2>)=(1, 0, 0) and (B<0>, B<1>, B<2>)=(1, 0, 0). Therefore, the redundancy control signal RED_CON is in the activated state, the target control signal TAR is in the activated state, and the first adjacent control signal ADJ1 and the second adjacent control signal ADJ2 are in the deactivated states.

In case (A) or (B) in the special mode, when the consecutive active signal RACTV1 or RACTV2 of the selected bank is activated after the first active signal RACTV1 or RACTV2 for the over-activated word line in the compensation cycle, the adjacent activation control block 610 activates the internally generated adjacent control signals ADJ1 and ADJ2, such that at least one adjacent word line to the over-activated word line corresponding to the excessive input address is activated regardless of the word line corresponding to the inputted address in the case where the active signal RACTV1 or RACTV2 of the selected bank is activated for the first time in the compensation cycle. Also, when the first active signal RACTV1 or RACTV2 of the selected bank is deactivated after activation of itself in the compensation cycle of the special mode, the adjacent activation control block 610 deactivates the redundancy control signal RED_CON, such that the redundancy enable signal HITB and the first to $M^{th}$ redundancy signals HIT1 to HITM of a bank selected after the first active signal RACTV1 or RACTV2 for the over-activated word line maintain the states when the active signal RACTV1 or RACTV2 of the selected bank is activated for the first time in the compensation cycle.

Figure 10A:
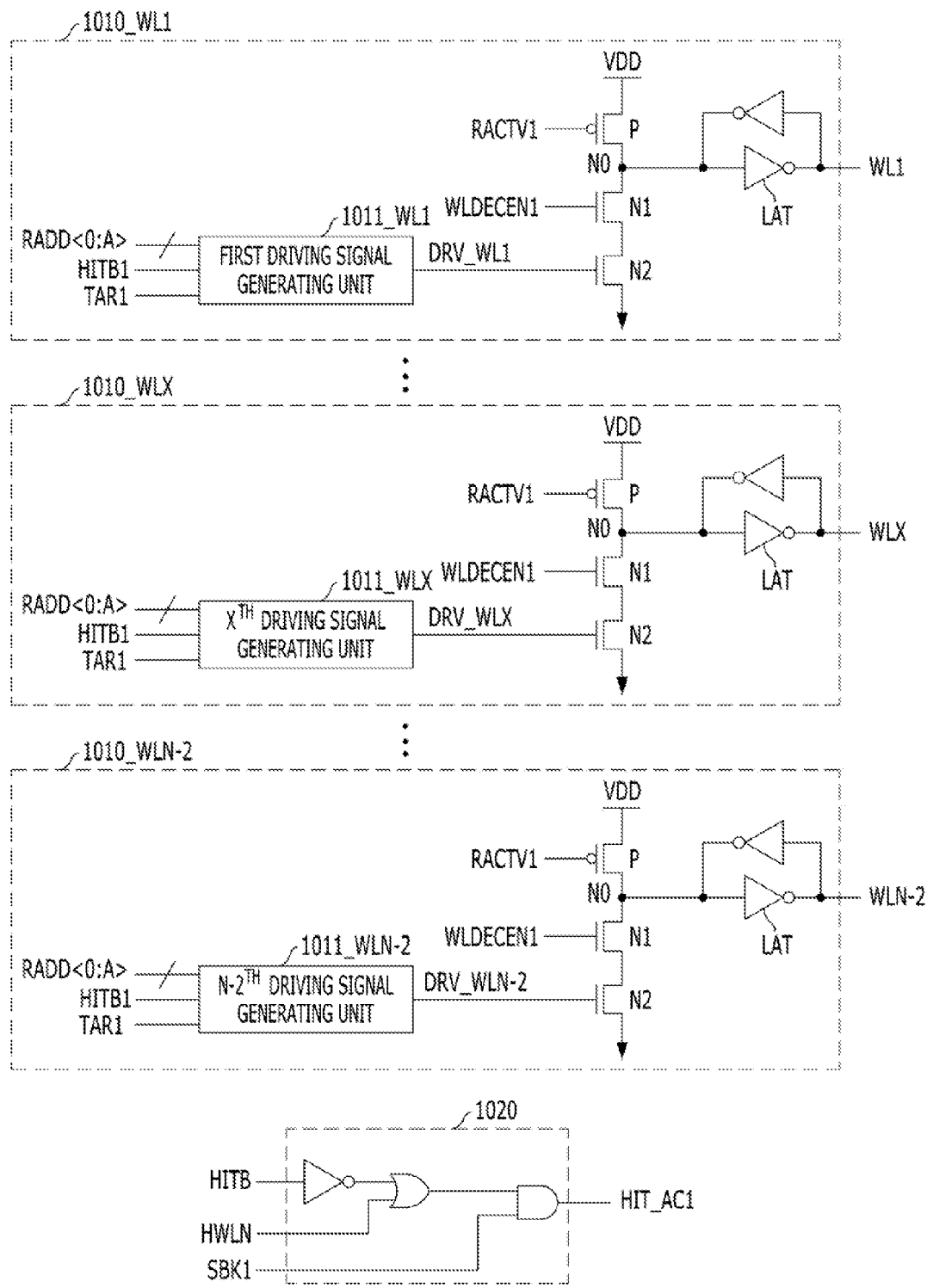
FIGS. 10A and 10B are detailed configuration diagrams illustrating a first word line control block illustrated in FIG. 6.
Figure 10B:
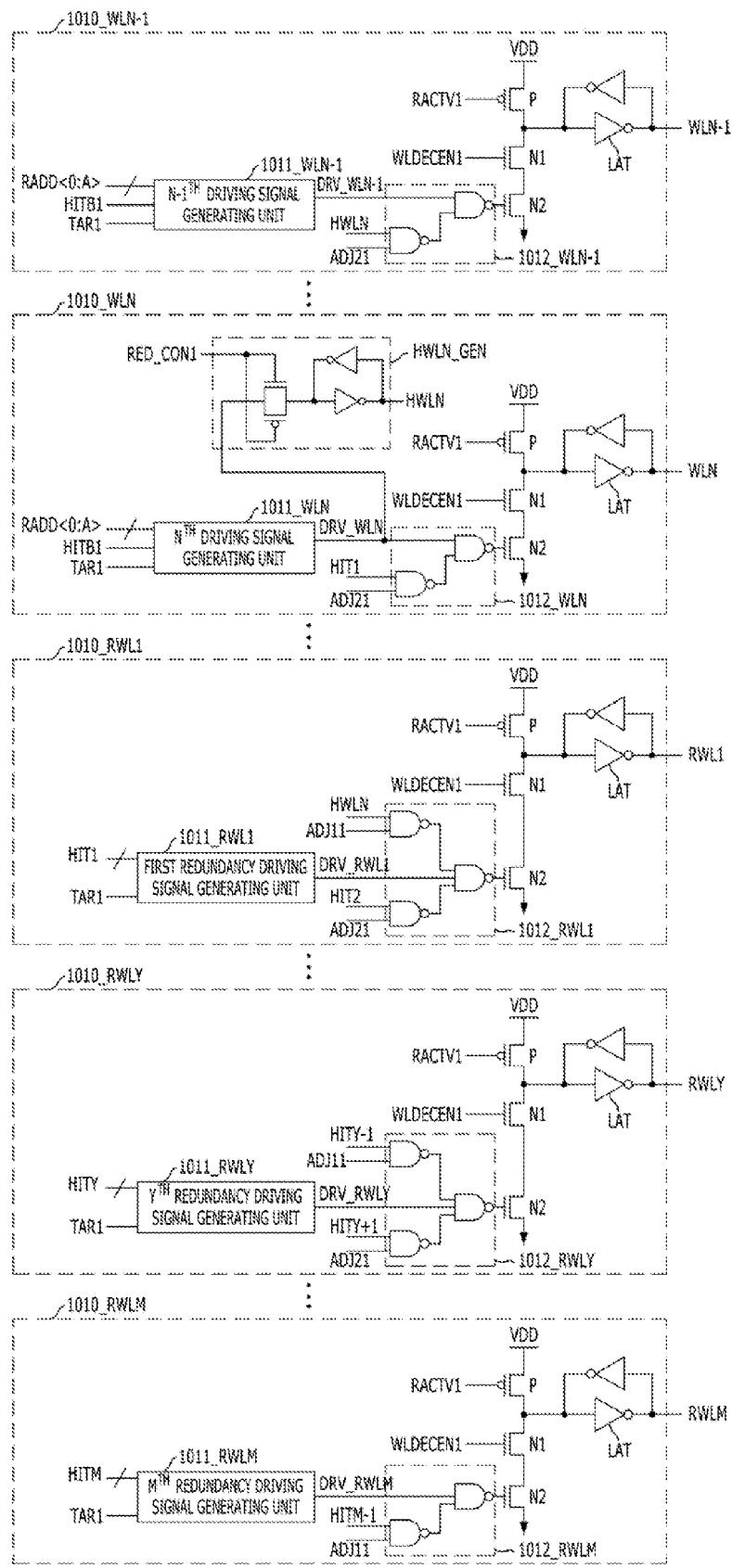

FIGS. 10A and 10B are detailed configuration diagrams of the first word line control block 623 illustrated in FIG. 6.

FIG. 10A illustrates a circuit for controlling the first to N-$2^{th}$ normal word lines WL1 to WLN-2 of the first bank BK1 in the first word line control block 623, and FIG. 10B illustrates a circuit for controlling the N-$1^{th}$ normal word line WLN-1, the $N^{th}$ normal word line WLN, and the first to $M^{th}$ redundancy word lines RWL1 to RWLM of the first bank BK1 in the first word line control block 623.

The first word line control block 623 will be described below with reference to FIGS. 10A and 10B.

The first word line control block 623 includes unit word line control units 1010_WL1 to 1010_WLN and 1010_RWL1 to 1010_RWLM respectively corresponding to the first to $N^{th}$ normal word lines WL1 to WLN and the first to $M^{th}$ redundancy word lines RWL1 to RWLM of the first bank BK1, and a first state signal generation unit 1020 configured to generate the first redundancy word line state signal HIT_AC1.

The unit word line control units 1010_WL1 to 1010_WLN and 1010_RWL1 to 1010_RWLM control corresponding word lines, respectively, in response to some signals among the first active signal RACTV1, the first word line decoding enable signal WLDECEN1, the inputted address RADD<0:A>, the first to $M^{th}$ redundancy signals HIT1 to HITM, the first target control signal TAR1, the one or more bank adjacent control signals ADJ11 and ADJ21, and the first redundancy enable signal HITB1.

The configurations and the operations of the unit word line control units 1010_WL1 to 1010_WLN-2 illustrated in FIG. 10A are substantially the same. Thus, the configuration and the operation of one unit word line control unit 1010_WLX (1≤X≤N-2) among the unit word line control units 1010_WL1 to 1010_WLN-2 will be described below.

The unit word line control unit 1010_WLX (1≤X≤N-2) includes a PMOS transistor P configured to maintain an $X^{th}$ normal word line WLX in a deactivated state when the first active signal RACTV1 is deactivated, a first NMOS transistor N1 configured to be turned on and off in response to the first word line decoding enable signal WLDECEN1 an $X^{th}$ driving signal generating unit 1011_WLX configured to activate an $X^{th}$ driving signal DRV_WLX when the value of an inputted address RADD<0:A> is X in the state in which the first target control signal TAR1 is activated and the first redundancy enable signal HITB1 is deactivated, a second NMOS transistor N2 configured to be turned on and off in response to the $X^{th}$ driving signal DRV_WLX, and a latch LAT connected with the $X^{th}$ normal word line WLX.

The PMOS transistor P is turned on in the state in which the first active signal RACTV1 is deactivated (to level LOW), and pull-up drives the voltage of an internal node NO. The latch LAT latches and inverts the voltage of the internal node NO and pull-down drives the $X^{th}$ normal word line WLX. Accordingly, the $X^{th}$ normal word line WLX is maintained in a deactivated state. If the first active signal RACTV1 is activated (to level HIGH), the PMOS transistor is turned off, and a preparation for activating the $X^{th}$ normal word line WLX is completed.

After a predetermined time lapses from the activation time of the first active signal RACTV1, the first word line decoding enable signal WLDECEN1 is activated, and the first NMOS transistor N1 is turned on. In the case where the inputted address RADD<0:A> has the value of X, the $X^{th}$ driving signal generating unit 1011_WLX activates the $X^{th}$ driving signal DRV_WLX (to level HIGH) at a similar time. The second NMOS transistor N2 is turned on in response to the $X^{th}$ driving signal DRV_WLX, the internal node NO is pull-down driven, and the latch LAT latches and inverts the voltage of the internal node NO and pull-up drives and activates the $X^{th}$ normal word line WLX. In the case where the inputted address RADD<0:A> does not have the value of X or the first redundancy enable signal HITB1 is activated, since the $X^{th}$ driving signal DRV_WLX is not activated, the $X^{th}$ normal word line WLX is not activated.

The configurations and the operations of the unit word line control units 1010_WLN-1, 1010_WLN, and 1010_RWL1 to 1010_RWLM illustrated in FIG. 10B will be described below.

The unit word line control unit 1010_WLN-1 for controlling the N-$1^{th}$ normal word line WLN-1 includes a PMOS transistor P, a first NMOS transistor N1, a second NMOS transistor N2, a latch LAT, an N-$1^{th}$ driving signal generating unit 1011_WLN-1, and a transistor control unit 1012_WLN-1. Operations of the PMOS transistor P, the first NMOS transistor N1, the latch LAT and the N-$1^{th}$ driving signal generating unit 1011_WLN-1 are substantially the same as described above.

The transistor control unit 1012_WLN-1 controls the activation of the N-$1^{th}$ word line WLN-1 as an adjacent word line when the N$^{th}$ word line WLN is activated as an over-activated word line. The transistor control unit 1012_WLN-1 activates its output when an N-$1^{th}$ driving signal DRV_WLN-1 is activated in the case where the first bank adjacent control signal ADJ21 is not activated. Since the output of the transistor control unit 1012_WLN-1 is inputted to the gate of the second NMOS transistor N2, if the output of the transistor control unit 1012_WLN-1 is activated, the second NMOS transistor N2 is turned on. In the case where the first bank adjacent control signal ADJ21 is activated, the transistor control unit 1012_WLN-1 activates its output in the case where the N$^{th}$ word line signal HWLN indicating the activation of the N$^{th}$ normal word line WLN is activated when the first active signal RACTV1 is activated for the first time in the compensation cycle. Accordingly, the second NMOS transistor N2 is turned on, which leads to activation of the N-$1^{th}$ normal word line WLN-1 by the latch LAT.

The unit word line control unit 1010 WLN for controlling the N$^{th}$ normal word line WLN includes a PMOS transistor P, a first NMOS transistor N1, a second NMOS transistor N2, a latch LAT, an N$^{th}$ driving signal generating unit 1011_WLN, a transistor control unit 1012_WLN, and an N$^{th}$ word line signal generating unit HWLN_GEN. Operations of the PMOS transistor P, the first. NMOS transistor N1 the latch LAT and the N$^{th}$ driving signal generating unit 1011_WLN are substantially the same as described above.

The transistor control unit 1012_WLN controls the activation of the N$^{th}$ word line WLN as an adjacent word line when the first redundancy word line RWL1 is activated as an over-activated word line. The transistor control unit 1012_WLN activates its output when an N$^{th}$ driving signal DRV_WLN is activated in the case where the first bank adjacent control signal ADJ21 is not activated. Since the output of the transistor control unit 1012_WLN is inputted to the gate of the second NMOS transistor N2, if the output of the transistor control unit 1012_WLN is activated, the second NMOS transistor N2 is turned on. In the case where the first bank adjacent control signal ADJ21 is activated, the transistor control unit 1012_WLN activates its output in the case where the first redundancy signal HIT1 is activated. Accordingly, the second NMOS transistor N2 is turned on, which leads to activation of the N$^{th}$ normal word line WLN by the latch LAT.

The N$^{th}$ word line signal generating unit HWLN_GEN generates the N$^{th}$ word line signal HWLN indicating the activation of the N$^{th}$ normal word line WLN when the first active signal RACTV1 is activated for the first time in the compensation cycle. In detail, the N$^{th}$ word line signal generating unit HWLN_GEN receives the N$^{th}$ driving signal DRV_WLN, inverts the N$^{th}$ driving signal DRV_WLN into the N$^{th}$ word line signal HWLN in the case where the first redundancy control signal RED_CON1 is activated, and transfers the N$^{th}$ word line signal HWLN. The latch LAT is included to allow the N$^{th}$ word line signal HWLN to maintain the state at the time the first redundancy control signal RED_CON1 is deactivated even when the first redundancy control signal RED_CON1 is deactivated.

The unit word line control unit 1010_RWL1 for controlling the first redundancy word line RWL1 includes a PMOS transistor P, a first NMOS transistor N1, a second NMOS transistor N2, a latch LAT, a first redundancy driving signal generating unit 1011_RWL1 and a transistor control unit 1012_RWL1. Operations of the PMOS transistor P, the first NMOS transistor N1 and the latch LAT are substantially the same as described above.

The first redundancy driving signal generating unit 1011_RWL1 activates a first redundancy driving signal DRV_RWL1 when the first target control signal TAR1 and the first redundancy signal HIT1 are activated together. The transistor control unit 1012_RWL1 controls the activation of the first redundancy word line RWL1 as an adjacent word line when the second redundancy word line RWLY2 or the N$^{th}$ normal word line WLN is activated as an over-activated word line. The transistor control unit 1012_RWL1 activates its output in the case where the first redundancy driving signal DRV_RWL1 is activated, in the case where the first bank adjacent control signal ADJ11 and the N$^{th}$ word line signal HWLN are activated together or in the case where the first bank adjacent control signal ADJ21 and the second redundancy signal HIT2 are activated together. Accordingly, the second NMOS transistor N2 is turned on, which leads to activation of the first redundancy word line RWL1 by the latch LAT.

The configurations and the operations of the unit word line control units 1010_RWL2 to 1010_RWLM illustrated in FIG. 10B are substantially the same. Thus, the configuration and the operation of one unit word line control unit 1010_RWLY ($2 \leq Y \leq M$) among the unit word line control units 1010_RWL2 to 1010_RWLM will be described below.

The unit word line control unit 1010_RWLY for controlling an $Y^{th}$ redundancy word line RWLY includes a PMOS transistor P, a first NMOS transistor N1, a second NMOS transistor N2, a latch LAT, an $Y^{th}$ redundancy driving signal generating unit 1011_RWLY, and a transistor control unit 1012_RWLY. Operations of the PMOS transistor P, the first NMOS transistor N1 and the latch LAT are substantially the same as described above.

The $Y^{th}$ redundancy driving signal generating unit 1011_RWLY activates an $Y^{th}$ redundancy driving signal DRV_RWLY when the first target control signal TAR1 and an $Y^{th}$ redundancy signal HITY are activated together. The transistor control unit 1012_RWLY controls the activation of the $Y^{th}$ redundancy word line RWLY as an adjacent word line when the $Y-1^{th}$ redundancy word line RWLY-1 or the $Y+1^{th}$ redundancy word line RWLY+1 is activated as an over-activated word line. The transistor control unit 1012_RWLY activates its output in the case where the $Y^{th}$ redundancy driving signal DRV_RWLY is activated, in the case where the first bank adjacent control signal ADJ11 and an $Y-1^{th}$ redundancy signal HITY-1 are activated together or in the case where the first adjacent control signal ADJ21 and an $Y+1^{th}$ redundancy signal HITY+1 are activated together. Accordingly, the second NMOS transistor N2 is turned on, which leads to activation of the $Y^{th}$ redundancy word line RWLY by the latch LAT.

In the case of the N-1 normal word line WLN-1 the unit word line control unit 1010 WLN-1 has the above-described configuration such that the N-1$^{th}$ normal word line WLN-1 is activated when the first bank adjacent control signal ADJ21 is activated in the case where the $N^{th}$ normal word line WLN is activated when the first active signal RACTV1 is activated for the first time in the compensation cycle and is activated in the remaining cases when a word line corresponding to an inputted address RADD<0:A> is the N-1$^{th}$ normal word line WLN-1.

In the case of the $N^{th}$ normal word line WLN, the unit word line control unit 1010 WLN has the above-described configuration such that the $N^{th}$ normal word line WLN is activated when the first bank adjacent control signal ADJ21 is activated in the case where the first redundancy word line RWL1 is activated when the first active signal RACTV1 is activated for the first time in the compensation cycle and is activated in the remaining cases when a word line corresponding to an inputted address RADD<0:A> is the $N^{th}$ normal word line WLN.

In the case of the first redundancy word line RWL1, the unit word line control unit 1010_RWL1 has the above-described configuration such that the first redundancy word line RWL1 is activated when the first bank adjacent control signal ADJ21 is activated in the case where the second redundancy word line RWL2 is activated (the second redundancy signal HIT2 is activated) when the first active signal RACTV1 is activated for the first time in the compensation cycle, is activated when the first bank adjacent control signal ADJ11 is activated in the case where the $N^{th}$ normal word line WLN is activated (the $N^{th}$ word line signal HWLN is activated) when the first active signal RACTV1 is activated for the first time in the compensation cycle, and is activated in the remaining cases when the first redundancy signal HIT1 is activated.

In the case of the $Y^{th}$ redundancy word line RWLY, the unit word line control unit 1010_RWLY has the above-described configuration such that the $Y^{th}$ redundancy word line RWLY is activated when the first bank adjacent control signal ADJ21 is activated in the case where the $Y+1^{th}$ redundancy word line RWLY+1 is activated (the $Y+1^{th}$ redundancy signal HITY+1 is activated) when the first active signal RACTV1 is activated for the first time in the compensation cycle, is activated when the first bank adjacent control signal ADJ11 is activated in the case where the $Y-1^{th}$ redundancy word line RWLY-1 is activated (the $Y-1^{th}$ redundancy signal HITY-1 is activated) when the first active signal RACTV1 is activated for the first time in the compensation cycle, and is activated in the remaining cases when the $Y^{th}$ redundancy signal HITY is activated.

Referring back to FIG. 10A, the first state signal generation unit 1020 activates the first redundancy word line state signal HIT_AC1 in the case where the first redundancy enable signal HITB1 is activated or the $N^{th}$ word line signal HWLN is activated in the state in which the first bank select signal SBK1 is activated. In other words, the first state signal generation unit 1020 activates the first redundancy word line state signal HIT_AC1 in case (A) (where the first redundancy enable signal HITB1 is activated) or case (B) (where the $N^{th}$ word line signal HWLN is activated). Considering that the $N^{th}$ normal word line WLN is adjacent to the first redundancy word line RWL1 in the case where the $N^{th}$ normal word line WLN is activated, at least one word line among the first to $M^{th}$ redundancy word lines RWL1 to RWLM is included in at least one word line adjacent to the word line corresponding to the inputted address RADD<0:A> (the first redundancy word line RWL1 is included). The first state signal generation unit 1020 may be configured to activate the first redundancy word line state signal HIT_AC1 only in one of the cases (A) and (B).

According to the description above, the first adjacent control signal ADJ11 of the first bank controls the activation of an adjacent word line 'after' an over-activated word line, and the second adjacent control signal ADJ21 of the first bank controls the activation of an adjacent word line 'before' the over-activated word line. The first and second adjacent control signals ADJ11 and ADJ21 of the first bank may be changed with each other according to a memory design. The embodiment illustrated in FIGS. 10A and 10B is designed by setting the $N^{th}$ normal word line WLN and the first redundancy word line RWL1 adjacent to each other, which may also vary according to a memory design.

The configuration and operation of the second word line control block 633 are similar to those of the first word line control block 623 except that the second word line control block 633 is activated and operates in the case where the second bank BK2 is selected by the second bank select signal SBK2 or the bank address BA corresponding to the second bank BK2 is inputted. Therefore, detailed descriptions of the second word line control block 633 will be omitted herein.

As is apparent from the above descriptions, according to the various embodiments of the present invention, word lines adjacent to a word line, which are activated for a number that is equal to or greater than a reference number, are activated to refresh the memory cells connected to themselves, whereby it is possible to prevent the word line disturbance to the memory cells connected to the adjacent word lines.

Also, according to the various embodiments of the present invention, even when a word line activated for a number equal to or greater than a reference number is a redundancy word line replacing a normal word line, it may be possible to prevent word line disturbance to the memory cells connected to the adjacent word lines.

In addition, according to the various embodiments of the present invention, even when the memory includes a plurality of banks, the memory may perform substantially similar operation to the above-described.

Another embodiment of the present invention is described below.

Figure 4:
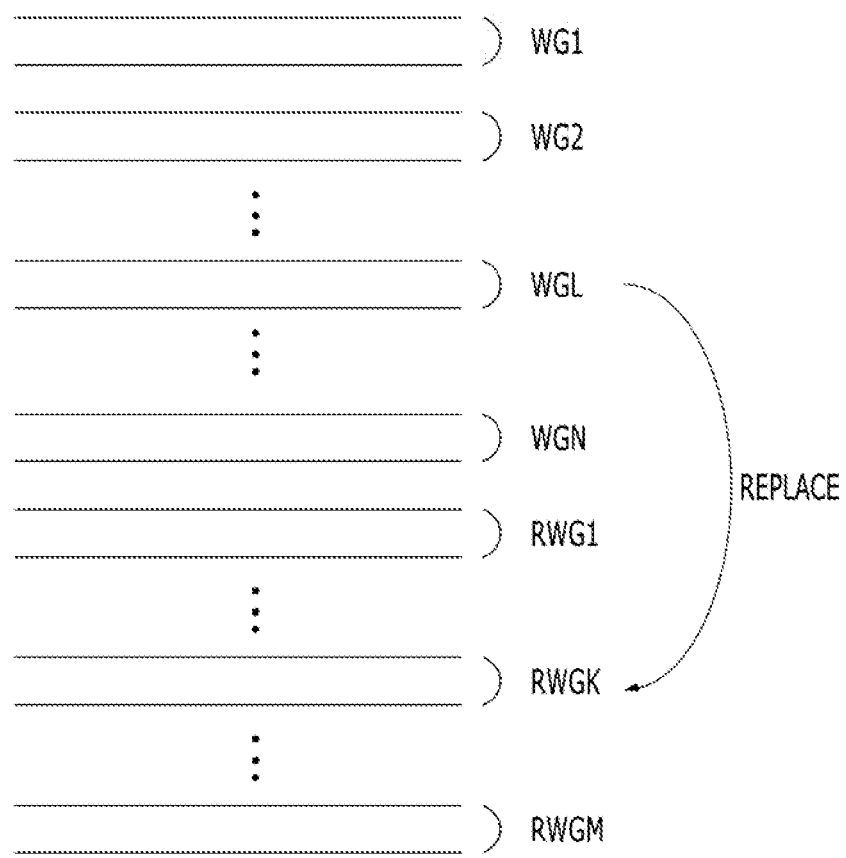
FIG. 4 is a diagram illustrating an operation in which a group of redundancy word lines replaces a group of normal word lines.

FIG. 4 is a diagram illustrating an operation in which a group of redundancy word lines replaces a group of normal word lines.

Referring to FIG. 4, a memory includes first to $N^{th}$ normal word line groups WG1 to WGN each including a plurality of word lines, and first to $M^{th}$ redundancy word line groups RWG1 to RWGM each including a plurality of redundancy word lines.

When a fail occurs in at least one normal word line among the plurality of normal word lines included in a normal word line group in a memory, the normal word line group may be replaced with a redundancy word line group. Hereinafter, for the convenience of description, descriptions will be set forth for the case in which an $L^{th}$ normal word line group WGL is replaced with a $K^{th}$ redundancy word line group RWGK.

When the $L^{th}$ normal word line group WGL has a fail and thus needs to be replaced with the $K^{th}$ redundancy word line group RWGK, the memory stores a part (hereinafter, referred to as "word line group address part" or "WLGA part") of an address ADD<0:A> representing the $L^{th}$ normal word line group WGL. For example, in the case where the memory has 1024 normal word lines and each of 256 word line groups includes 4 word lines, the address ADD<0:A> may be 10 bits, and the 4 word lines included in a word line group may share a 8-bit value in 10-bit address ADD<0:A>, which means that the word line group may be identified by the WLGA part of the address ADD<0:A>, namely the 8-bit value, and that a redundancy operation of the word line group may be performed with the identification of the WLGA part of the address ADD<0:A>.

In the case of the redundancy operation of the word line group level, when a WLGA part of the inputted address ADD<0:A> representing a word line group indicates the $L^{th}$ normal word line group WGL, the memory activates a redundancy word line replacing the normal word line of the inputted address ADD<0:A> among the plurality of redundancy word lines included in the $K^{th}$ redundancy word line group RWGK, which means that the $L^{th}$ normal word line group WGL is replaced with the $K^{th}$ redundancy word line group RWGK.

In this way, in the case of the redundancy operation of word line group level, the area of a fuse circuit for storing addresses may be reduced. However, in this case, when a normal word line group is replaced with a redundancy word line group, a scheme for performing the compensating operation for preventing degradation of data due to word line disturbance is demanded.

Figure 11:
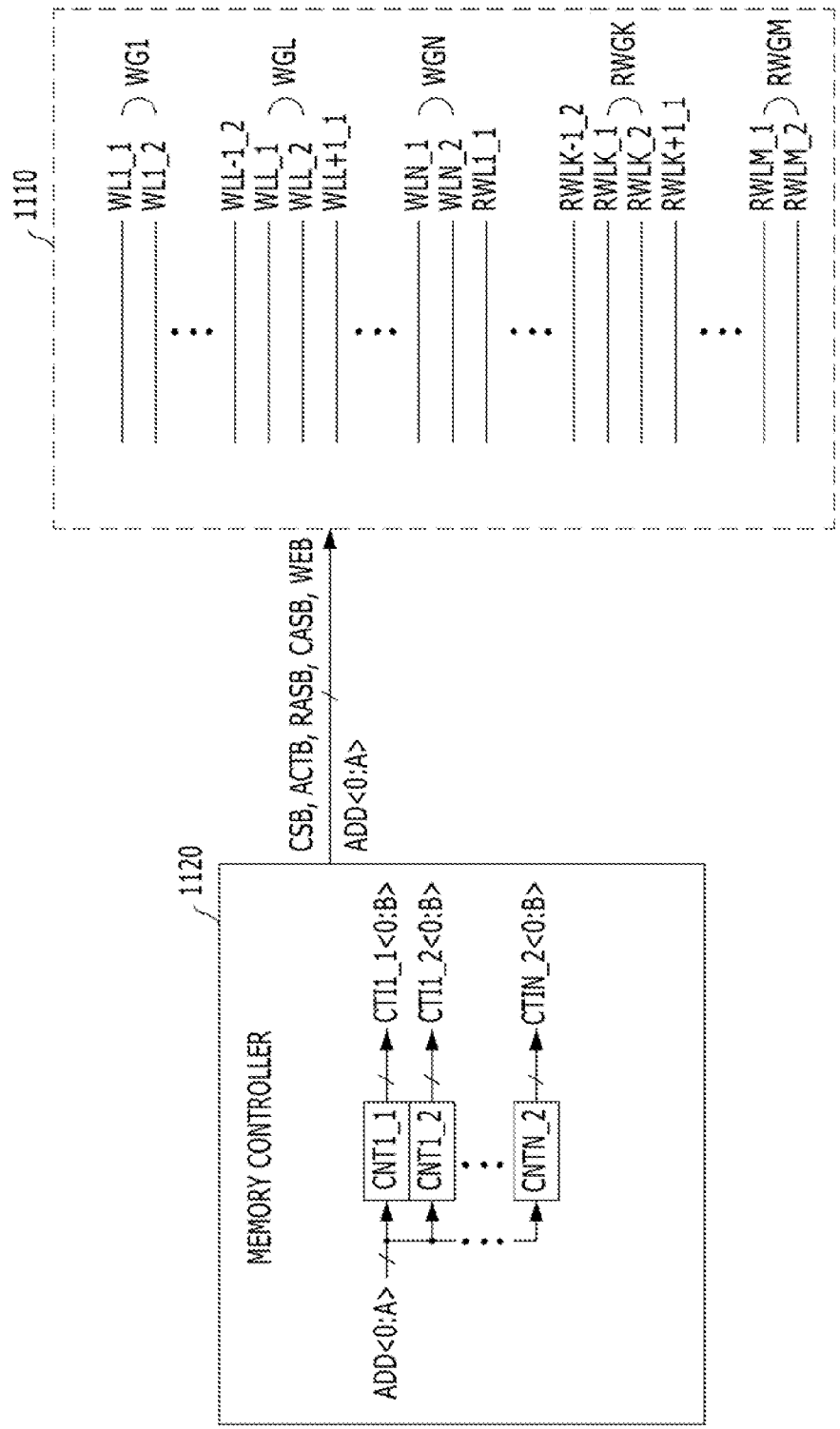
FIG. 11 is a configuration diagram illustrating a memory system in accordance with another embodiment of the present invention.

FIG. 11 is a configuration diagram of a memory system in accordance with another embodiment of the present invention.

Referring to FIG. 11, a memory system includes a memory 1110 and a memory controller 1120.

The memory 1110 includes first to $N^{th}$ normal word line groups WG1 to WGN each including a plurality of normal word lines WL, and first to $M^{th}$ redundancy word line groups RWG1 to RWGM for replacing failed M normal word line groups among the first to $N^{th}$ normal word line groups WG1 to WGN. Each of the first to $M^{th}$ redundancy word line groups RWG1 to RWGM includes a plurality of redundancy word lines RWL. In the memory 1110, the first to $N^{th}$ normal word line groups WG1 to WGN are sequentially disposed, and the first to $M^{th}$ redundancy word line groups RWG1 to RWGM are sequentially disposed next to the $N^{th}$ normal word line group WGN. The memory controller 1120 inputs an excessive input address ADD<0:A> to the memory 1110 in the special mode among addresses ADD<0:A> corresponding to the plurality of normal word lines WL of the first to $N^{th}$ normal word line groups WG1 to WGN in response to a result obtained by counting the number of inputs of an address corresponding to each one of the plurality of normal word lines WL in each of the first to $N^{th}$ normal word line groups WG1 to WGN. Hereinafter, descriptions will be made for the case in which each normal word line group includes two word lines and each redundancy word line group includes two redundancy word lines. It is to be noted that the number of normal or redundancy word lines included in each normal or redundancy word line group may vary according to a memory design.

A memory system will be described with reference to FIG. 11.

In the word line group structure having two word lines as illustrated in FIG. 11, adjacent word lines to a first normal word line WLL_1 of the $L^{th}$ normal word line group WGL are a second normal word line WLL-1_2 of an L-1$^{th}$ normal word line group WGL-1 and a second normal word line WLL_2 of the $L^{th}$ normal word line group WGL. Adjacent word lines to the second normal word line WLL_2 of the $L^{th}$ normal word line group WGL are the first normal word line WLL_1 of the $L^{th}$ normal word line group WGL and a first normal word line WLL+1_1 of an L+1$^{th}$ normal word line group WGL+1. Adjacent word lines to a first redundancy word line RWLK_1 of the $K^{th}$ redundancy word line group RWGK are a second redundancy word line RWLK-1_2 of a K-1$^{th}$ redundancy word line group RWGK-1 and a second redundancy word line RWLK_2 of the $K^{th}$ redundancy word line group RWGK. Adjacent word lines to the second redundancy word line RWLK_2 of the $K^{th}$ redundancy word line group RWGK are the first redundancy word line RWLK_1 of the $K^{th}$ redundancy word line group RWGK and a first redundancy word line RWLK+1_1 of a K+1$^{th}$ redundancy word line group RWGK+1. An adjacent word line to a first normal word line WL1_1 of the first normal word line group WG1 is a second normal word line WL1_2 of the first normal word line group WG1. An adjacent word line to a second redundancy word line RWLM_2 of the $M^{th}$ redundancy word line group RWGM is a first redundancy word line RWLM_1 of the $M^{th}$ redundancy word line group RWGM. Adjacent word lines to a second normal word line WLN_2 of the $N^{th}$ normal word line group WGN are a first normal word line WLN_1 of the $N^{th}$ normal word line group WGN and a first redundancy word line RWL1_1 of the first redundancy word line group RWG1, Identification or the number of the adjacent word lines may vary according to a memory design.

In the normal access mode, the memory 1110 or the memory controller 1120 counts the numbers of inputs or activations of addresses ADD<0:A> corresponding to the respective word lines to the memory 1110 together with an active command.

The memory 1110 or the memory controller 1120 may include a plurality of counting units CNT1_1 to CNTN_2 respectively corresponding to the respective word lines. FIG. 11 illustrates that the memory controller 1120 includes the plurality of counting units CNT1_1 to CNTN_2. The plurality of counting units CNT1_1 to CNTN_2 count the numbers of inputs of addresses ADD<0:A> corresponding to normal word lines applied together with the active command, and generate counting information CTI1_1<0:B> to CTIN_2<0:B>. The counting information CTI1_1<0:B> to CTIN_2<0:B> represents the numbers of activation of the plurality of normal word lines WL1_1 to WLN_2 of the first to $N^{th}$ normal word line groups WG1 to WGN. Even in the case of word line group replacement, namely the case that the $L^{th}$ normal word line group WGL is replaced with the $K^{th}$ redundancy word line group RWGK as the example discussed above, the address corresponding to the normal word line now is mapped to the redundancy word line through the redundancy operation discussed in connection with FIG. 4 and thus the number of activations of the redundancy word line may be counted with the number of inputs of the address corresponding to the normal word line.

The Operation of the Memory System in the Special Mode

As the memory controller 1120 inputs a combination of MRS commands and a specific address to the memory 1110, the memory 1110 enters the special mode (a mode signal MOD is activated). The memory controller 1120 in the special mode is configured to input to the memory 1110 the excessive input address in response to a result of counting the numbers of activation of the plurality of normal word lines WL1_1_1 to WLN_2 of the first to $N^{th}$ normal word line groups WG1 to WGN. Hereinafter descriptions will be made for the case where the special mode includes one compensation cycle for one excessive input address corresponding to the normal word line WLL_1.

After the memory 1110 enters the special mode, the memory controller 1120 inputs the active command three times to the memory 1110 during the compensation cycle. The memory controller 1120 inputs the excessive input address ADD<0:A> corresponding to the normal word line WLL_1 together with a first active command, inputs an address ADD<0:A> corresponding to the normal word line together with a second active command, and inputs an address ADD<0:A> corresponding to the normal word line WLL–1_2 together with a third active command. The number of times by which the active command is inputted to the memory 1110 during the compensation cycle may be designed to vary according to the number of adjacent word lines to be activated in the compensation cycle.

Cases (A) and (B) to be described below are where adjacent word lines to an over-activated word line may include at least one redundancy word line.

In case (A) where the over-activated word line is a redundancy word line, or a word line group including a word line corresponding to the excessive input address ADD<0:A> among the first to $N^{th}$ normal word line groups WG1 to WGN is replaced with the $K^{th}$ (1≤K≤M) redundancy word line group RWGK among the first to $M^{th}$ redundancy word line groups RWG1 to RWGM, the memory 1110 activates in response to the active command at least one adjacent word line to a redundancy word line RWLK_1 or RWLK_2 of the $K^{th}$ redundancy word line group RWGK corresponding to the excessive input address ADD<0:A>. In case (B) where the adjacent word lines partly include at least one redundancy word line, or an over-activated word line corresponding to the excessive input address ADD<0:A> is adjacent to the redundancy word line RWL1_1 disposed first in the first redundancy word line group RWG1, the memory 1110 activates at least one adjacent word line to the over-activated word line corresponding to the excessive input address ADD<0:A> among the redundancy word lines included in the first to $M^{th}$ redundancy word line groups RWG1 to RWGM in response to the active command. For example, case (B) is the one where adjacent word lines to the over-activated second normal word line WLN_2 of the $N^{th}$ normal word line group WGN are a first normal word line WLN_1 of the $N^{th}$ normal word line group WGN and a first redundancy word line RWL1_1 of the first redundancy word line group RWG1. The above cases (A) and (B) correspond to the case in which one adjacent word line to the over-activated word line designated by the excessive input address ADD<0:A> includes at least one redundancy word line among the plurality of redundancy word lines of the first to $M^{th}$ redundancy word line groups RWG1 to RWGM in the compensation cycle. In case (A) or (B), the memory 1110 activates the adjacent word lines, which may include at least one normal word line and at least one redundancy word line regardless of the inputted address ADD<0:A> for the adjacent word lines.

The Operation of the Memory 1110 in Case (A)

In the case where the $L^{th}$ normal word line group WGL is replaced with the $K^{th}$ redundancy word line group RWGK, the first normal word line WLL_1 of the $L^{th}$ normal word line group WGL is replaced with the first redundancy word line RWLK_1 of the $K^{th}$ redundancy word line group RWGK, and the second normal word line WLL_2 of the $L^{th}$ normal word line group WGL is replaced with the second redundancy word line RWLK_2 of the $K^{th}$ redundancy word line group RWGK.

When the excessive input address ADD<0:A> corresponding to the normal word line WLL_1 is inputted together with the first active command, the memory 1110 activates the redundancy word line RWLK_1 that replaces the normal word line WLL_1 and thus is the over-activated word line. When the second active command is inputted, the memory 1110 activates the redundancy word line RWLK_2 as an adjacent word line to the redundancy word line RWLK_1 regardless of the address ADD<0:A> that is applied together with the second active command and corresponds to the normal word line WLL_2, Finally, when the third active command is inputted, the memory 1110 activates the redundancy word line RWLK–1_2 as the other adjacent word line to the word line RWLK_1 regardless of the address ADD<0:A> that is applied together with the third active command and corresponds to the normal word line WLL–1_2. In the case where K is equal to '1', that is, the $L^{th}$ normal word line group WGL of the normal word line WLL_1 corresponding to the excessive input address ADD<0:A> is replaced with the first redundancy word line group RWG1, the memory 1110 sequentially activates the second redundancy word line RWL1_2 of the first redundancy word line group RWG1 and the second normal word line WLN_2 of the $N^{th}$ normal word line group WGN as adjacent word lines to the over activated word line, namely the redundancy word line RWLK_1, in response to the second and third active commands.

The order of activation of the adjacent word lines RWLK–1_2 and RWLK_2 to the over-activated word line RWLK_1 may be changed according to a memory design. The word line RWLK_2 is a redundancy word line disposed after the over-activated redundancy word line RWLK_1, and the word line RWLK–1_2 is a redundancy word Line disposed before the over-activated redundancy word line RWLK_1.

The Operation of the Memory 1110 in Case (B)

The memory 1110 activates a word line corresponding to the excessive input address ADD<0:A> in response to the first active command. The over-activated word line corresponding to the excessive input address ADD<0:A> may be the second normal word line WLN_2 of the $N^{th}$ normal word line group WGN that is adjacent to the first redundancy word line RWL1_1 of the first redundancy word line group RWG1.

In the case where the excessive input address ADD<0:A> with the first active command corresponds to the normal word line WLN_2, when the second active command is inputted, the memory 1110 activates the redundancy word line RWL1_1 as an adjacent word line to the over-activated word line or the normal word line WLN_2 regardless of the inputted address ADD<0:A> for an adjacent word line. Furthermore, when the third active command is inputted, the memory 1110 activates the normal word line WLN_1 as the other adjacent word line to the over-activated word line or the normal word line WLN_2 regardless of the inputted address ADD<0:A> for an adjacent word line.

The order of activation of the adjacent word lines WLN_1 and RWL1_1 adjacent to the normal word line WLN_2 may be changed according to a memory design. The redundancy word line RWL1_1 is disposed after the normal word line WLN_2, and the normal word line WLN_1 is disposed before the normal word line WLN_2.

Except cases (A) and (B), that is, when an over-activated word line and all adjacent word lines are normal word lines, or a word line group including the word line corresponding to the address ADD<0:A> is not replaced and the word line corresponding to the address ADD<0:A> is not adjacent to the first redundancy word line RWL1_1 of the first redundancy word line group RWG1, the memory 1110 activates the word line corresponding to the address ADD<0:A> inputted together with the active command in the compensation cycle.

Meanwhile, the memory 1110 does not perform a redundancy operation (explained in connection with FIG. 3) for the address ADD<0:A> inputted together with the second and third active commands after the first active signal RACTV for the over-activated word line in each compensation cycle, and maintains the states of signals associated with the redundancy operation in the states after the first active command for the over-activated word line is inputted. As discussed above, it is a word line physically adjacent to the over-activated word line that needs to be protected against the word line disturbance. Therefore, a nominally adjacent word line, which is not physically adjacent to the over-activated word line, need not be activated for protection from the word line disturbance. The nominally adjacent word line is caused by replacement to a redundancy word line from a normal word line. For example, assume that an excessive input address is 5, and thus, the over-activated word line is a fifth word line, and that a fourth word line, which corresponds to an address 4 and is physically adjacent to the over-activated fifth word line, is replaced with a third redundancy word line. Even though the third redundancy word line may be nominally an adjacent word line to the fifth word line according to the replacement, the third redundancy word line is not influenced by word line disturbance since it is not physically adjacent to the over-activated word line or the fifth word line.

The Operation of the Memory System in the Normal Access Mode

In order to perform an operation according to an external request (not illustrated), the memory controller 1120 applies the command signals CSB, ACTB, RASB, CASB and WEB, the address ADD<0:A> and data (not illustrated) to the memory 1110. The memory 1110 activates a word line corresponding to the address ADD<0:A> inputted together with the active command. In the case where a word line group including the word line corresponding to the address ADD<0:A> is replaced with a redundancy word line group, the memory 1110 activates the redundancy word line that replaces the word line corresponding to the inputted address ADD<0:A>.

In the above descriptions, it is explained that, when the memory 1110 corresponds to one of the cases (A) and (B), at least one adjacent word line is activated regardless of the address ADD<0:A> inputted together with the active commands after the first active signal RACTV for the over-activated word line. The memory 1110 may be designed to activate at least one adjacent word line regardless of the address ADD<0:A> inputted together with the active commands after the first active signal RACTV for the over-activated word line only in one of the cases (A) and (B).

In the memory system in accordance with another embodiment of the present invention, even in the case where a word line to be activated in the compensation cycle during the operation in the special mode is a redundancy word line that is not allocated with an address, a normal compensating operation may be performed. Also, it is possible to perform a normal compensating operating even when replacement is made not by the unit of a word line but by the unit of a word line group.

Figure 12:
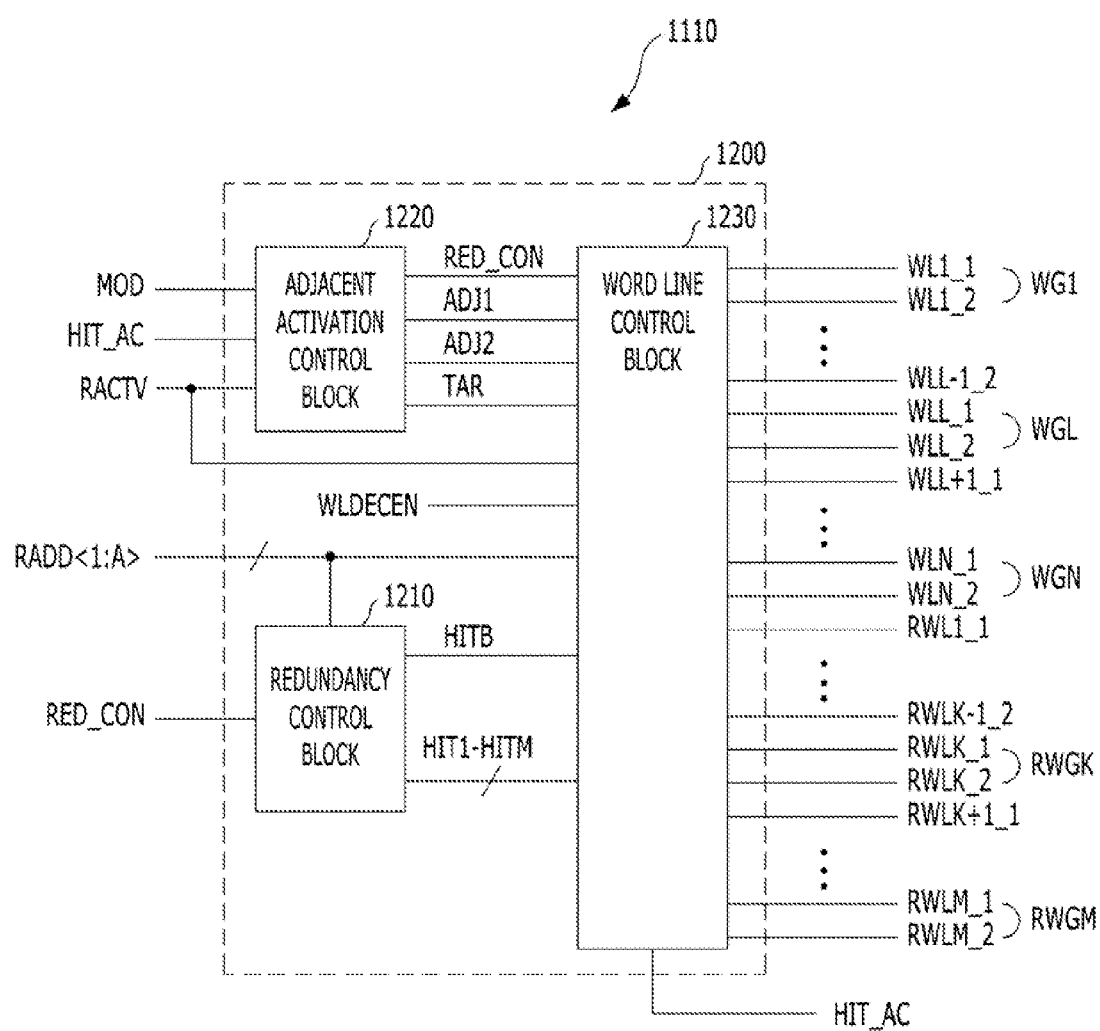
FIG. 12 is a configuration diagram illustrating a memory in accordance with another embodiment of the present invention.

FIG. 12 is a configuration diagram of the memory 1110 in accordance with another embodiment of the present invention.

Referring to FIG. 12, the memory 1110 includes the first to $N^{th}$ normal word line groups WG1 to WGN each including a plurality of normal word lines, the first to $M^{th}$, redundancy word line groups RWG1 to RWGM for replacing failed M normal word line groups among the first to $N^{th}$ normal word line groups WG1 to WGN, each including a plurality of redundancy word lines, and a control circuit 1200. In the memory 1110, the first to $N^{th}$ normal word line groups WG1 to WGN are sequentially disposed, and the first to $M^{th}$ redundancy word line groups RWG1 to RWGM are sequentially disposed next to the $N^{th}$ normal word line group WGN. Hereinafter, descriptions will be made for the case in which each of the first to $N^{th}$ normal word line groups WG1 to WGN includes 2 normal word lines and each of the first to $M^{th}$ redundancy word line groups RWG1 to RWGM includes 2 redundancy word lines. It is to be noted that the number of word lines included in each word line group and the number of redundancy word lines included in each redundancy word line group may vary according to a memory design.

An active signal RACTV is activated when the active command (not illustrated) is inputted to the memory 1110 and is deactivated when a precharge command (not illustrated) is inputted to the memory 1110. An address RADD<0:A> of FIG. 12 has the same value as the address ADD<0:A> inputted from the memory controller 1120 and is synchronized with the internal operation timing of the memory 1110.

The memory 1110 will be described with reference to FIG. 12.

The Operation of the Memory 1110 in the Special Mode

The memory 1110 enters the special mode when a combination of MRS commands and a specific address is inputted. As disclosed above, the memory controller 1120 is configured to input the excessive input address to the memory 1110 in the special mode in response to a result of counting the numbers of activation of the word lines of the first to $N^{th}$ normal word line groups WG1 to WGN. Hereinafter, descriptions will be made for the case where the special mode includes one compensation cycle for one excessive input address corresponding to the first normal word line WLL_1 of the $L^{th}$ normal word line group WGL.

In case (A) where the over-activated word line is a redundancy word line, or a normal word line group including a normal word line corresponding to the excessive input address RADD<0:A> among the first to $N^{th}$ normal word line groups WG1 to WGN is replaced with the $K^{th}$ (1≤K≤M) redundancy word line group RWGK among the first to $M^{th}$ redundancy word line groups RWG1 to RWGM, the control circuit 1200 activates at least one adjacent word line to a redundancy word line that replaces the normal word line corresponding to the excessive input address RADD<0:A> between the plurality of redundancy word lines RWLK_1 and RWLK_2 of the $K^{th}$ redundancy word line group RWGK in response to the active signal RACTV. In case (B) where the adjacent word lines include at least one redundancy word line, or an over-activated word line corresponding to the excessive input address RADD<0:A> includes at least one redundancy word line of the first to $M^{th}$ redundancy word line groups RWG1 to RWGM. This is the case where the over-activated word line is adjacent to the redundancy word line RWL1__1 disposed first in the first redundancy word line group RWG1. The control circuit 1200 in case (B) activates the adjacent word line to the over-activated word line corresponding to the excessive input address RADD<0:A> among the plurality of redundancy word lines included in the first to $M^{th}$ redundancy word line groups RWG1 to RWGM in response to the active signal RACTV. The above cases (A) and (B) correspond to the case in which at least one redundancy word line among the plurality of redundancy word lines included in the first to $M^{th}$ redundancy word line groups RWG1 to RWGM is activated in the compensation cycle. For example, case (B) is the one where adjacent word lines to the over-activated second normal word line WLN__2 of the $N^{th}$ normal word line group WGN are a first normal word line WLN__1 of the $N^{th}$ normal word line group WGN and a first redundancy word line RWL1__1 of the first redundancy word line group RWG1. In case (A) or (B) where one adjacent word line to the over-activated word line designated by the excessive input address ADD<0:A> includes at least one redundancy word line among the plurality of redundancy word lines of the first to $M^{th}$ redundancy word line groups RWG1 to RWGM in the compensation cycle, the control circuit 1200 activates the adjacent word lines, which may include at least one normal word line and at least one redundancy word line regardless of the inputted address RADD<0:A> for the adjacent word lines.

The Operation of the Control Circuit 1200 in Case (A)

In the case where the $L^{th}$ normal word line group WGL is replaced with the $K^{th}$ redundancy word line group RWGK, the first normal word line WLL__1 of the $L^{th}$ normal word line group WGL is replaced with the first redundancy word line RWLK__1 of the $K^{th}$ redundancy word line group RWGK, and the second normal word line WLL__2 of the $L^{th}$ normal word line group WGL is replaced with the second redundancy word line RWLK__2 of the $K^{th}$ redundancy word line group RWGK.

Under the first activation of the active signal RACTV in the compensation cycle, if the excessive input address RADD<0: A> corresponding to the normal word line WLL__1 is inputted, the control circuit 1200 activates the redundancy word line RWLK__1 that replaces the normal word line WLL__1, and thus the redundancy word line RWLK__1, is the over-activated word line. When the active signal RACTV is activated for the second time, the control circuit 1200 activates the redundancy word line RWLK__2 as an adjacent word line to the redundancy word line RWLK__1 regardless of the inputted address RADD<0:A> corresponding to the normal word line WLL__2. Finally, when the active signal RACTV is activated for the third time, the control circuit 1200 activates the redundancy word line RWLK−1__2 as the other adjacent word line to the redundancy word line RWLK__1 regardless of the inputted address RADD<0:A> corresponding to the normal word line WLL−1__2. In the case where K is equal to one, that is, the $L^{th}$ normal word line group WGL of the normal word line WLL__1 corresponding to the excessive input address ADD<0:A> is replaced with the first redundancy word line group RWG1, when the active signal RACTV is activated for the second and third times, the control circuit 1200 sequentially activates the second redundancy word line RWL1__2 of the first redundancy word line group RWG1 and the second normal word line WLN__2 of the $N^{th}$ normal word line group WGN as adjacent word lines to the over activated word line, namely the redundancy word line RWLK__1.

The order of activation of the adjacent word lines RWLK−1__2 and RWLK__2 to the over-activated redundancy word line RWLK__1 may be changed according to a memory design. The word line RWLK__2 is a redundancy word line disposed after the word line RWLK__1, and the word line RWLK−1__2 is a redundancy word line disposed before the word line RWLK__1.

The Operation of the Control Circuit 1200 in Case (B)

The control circuit 1200 activates the word line corresponding to the excessive input address RADD<0:A> under the first activation of the active signal RACTV in the compensation cycle. The word line corresponding to the excessive input address RADD<0:A> may be the second normal word line WLN__2 of the $N^{th}$ normal word line group WGN that is adjacent to the first redundancy word line RWL1__1 of the first redundancy word line group RWG1.

In the case where the excessive input address RADD<0:A> corresponds to the normal word line WLN__2 under the first activation of the active signals RACTV in the compensation cycle, the control circuit 1200 activates the redundancy word line RWL1__1 as an adjacent word line to the over-activated word line or the normal word line WLN__2 regardless of the inputted address ADD<0:A> for an adjacent word line under the second activation of the active signal RACTV. Under the third activation of the active signal RACTV, the control circuit 1200 activates the normal word line WLN__1 as the other adjacent word line to the normal word line WLN__2 regardless of the inputted address ADD<0:A> for an adjacent word line.

The order of activation of the adjacent word lines WLN__1 and RWL1__1 to the normal word line WLN__2 may be changed according to a memory design. The redundancy word line RWL1__1 is disposed after the normal word line WLN__2, and the normal word line WLN__1 is disposed before the normal word line WLN__2.

Except cases (A) and (B), that is, when an over-activated word line and all adjacent word lines are normal word lines, or a word line group including the word line corresponding to the inputted address ADD<0:A> is not replaced and the word line corresponding to the inputted address ADD<0:A> is not adjacent to the first redundancy word line RWL1__1 of the first redundancy word line group RWG1, the control circuit 1200 activates the word line corresponding to the address ADD<0:A> inputted under activation of the active signal RACTV in the compensation cycle.

Meanwhile, the control circuit 1200 does not perform a redundancy operation for the address ADD<0:A> inputted under the second and third activation of the active signal RACTV after the first activation of the active signal RACTV for the over-activated word line in each compensation cycle, and maintains the states of signals associated with the redundancy operation in the states after the first active signal RACTV for the over-activated word line is inputted. As discussed above, it is a word line physically adjacent to the over-activated word line that needs to be protected against the word line disturbance. Therefore, a nominally adjacent word line, which is not physically adjacent to the over-activated word line, need not be activated for protection from the word line disturbance. The nominally adjacent word line is caused by replacement to a redundancy word line from a normal word line.

The Operation of the Memory 1110 in the Normal Access Mode

The control circuit 1200 activates a word line corresponding to the address RADD<0:A> inputted under activation of the active signal RACTV. In the case where a word line group including the word line corresponding to the inputted address RADD<0:A> is replaced with a redundancy word line group, the control circuit 1200 activates the redundancy word line that replaces the word line corresponding to the inputted address RADD<0:A>.

In the above descriptions, it is explained that, when the control circuit 1200 corresponds to one of cases (A) and (B), at least one adjacent word line is activated regardless of the address RADD<0:A> inputted under activation of the active signal RACTV after the first activation of the active signal RACTV for the over-activated word line. The control circuit 1200 may be designed to activate at least one adjacent word line regardless of the address RADD<0:A> inputted when the active signals RACTV are activated after the first active signal RACTV for the over-activated word line only in one of the cases (A) and (B).

For the above-described operations, referring to FIG. 12, the control circuit 1200 includes a redundancy control block 1210, an adjacent activation control block 1220, and a word line control block 1230. Operations of the respective control blocks 1210, 1220 and 1230 will be described below.

The redundancy control block 1210 generates first to $M^{th}$ redundancy signals HIT1 to HITM. In the case where a normal word line group including the word line corresponding to the excessive input address RADD<0:A> among the first to $N^{th}$ normal word line groups WG1 to WGN is replaced with the $K^{th}$ ($1 \leq K \leq M$) redundancy word line group RWGK among the first to $M^{th}$ redundancy word line groups RWG1 to RWGM, the redundancy control block 1210 activates a $K^{th}$ redundancy signal HITK corresponding to the $K^{th}$ redundancy word line group RWGK among the first to $M^{th}$ redundancy signals HIT1 to HITM in response to a WLGA part of the excessive input address RADD<0:A>.

In detail, while the redundancy control block 1210 stores a WLGA part of the address representing the replaced normal word line group among the first to $N^{th}$ normal word line groups WG1 to WGN, in the case where a redundancy control signal RED_CON is activated, if the WLGA part of the inputted address RADD<0:A> representing the normal word line group among the first to $N^{th}$ normal word line groups WG1 to WGN is identical to the stored value, the redundancy control block 1210 activates one of the first to $M^{th}$ redundancy signals HIT1 to HITM. Under activation of at least one of the first to $M^{th}$ redundancy signals HIT1 to HITM, the redundancy control block 1210 also activates a redundancy enable signal HITB indicating that a redundancy operation is being performed. For reference, the redundancy enable signal HITB is an active low signal. In the case where the redundancy control signal RED_CON is deactivated, the redundancy control block 1210 keeps previous states of the first to $M^{th}$ redundancy signals HIT1 to HITM and the redundancy enable signal HITB regardless of whether the WLGA part of the inputted address RADD<0:A> corresponding to the word line group is identical to the stored value.

In other words, in the case where the redundancy control signal RED_CON is activated, the redundancy control block 1210 compares the WLGA part of the inputted address RADD<0:A> corresponding to the word line group with the value stored therein, and updates the first to $M^{th}$ redundancy signals HIT1 to HITM and the redundancy enable signal HITB. In the case where the redundancy control signal RED_CON is deactivated, the redundancy control block 1210 keeps previous states of the first to $M^{th}$ redundancy signals HIT1 to HITM and the redundancy enable signal HITB regardless of a result of comparing the inputted address RADD<0:A> with the value stored therein.

The redundancy control signal RED_CON is generated by the adjacent activation control block 1220, is in a deactivated state during a period from the first deactivation of the active signal RACTV to the third deactivation of the active signal RACTV in each compensation cycle, and is in an activated state during a remaining period. In the normal access mode, the redundancy control signal RED_CON is always maintained in the activated state. The third activation and deactivation of the active signal RACTV is last one in each compensation cycle. The number of activation time of active signal RACTV depends on the number of adjacent word line that may vary according to a memory design.

Accordingly, the redundancy control block 1210 activates one redundancy signal corresponding to the value of the WLGA part stored therein among the first to $M^{th}$ redundancy signals HIT1 to HITM and the redundancy enable signal HITB in the case where the WLGA part of the address RADD<0:A> inputted when the first active signal RACTV is activated is identical to the value stored therein in each compensation cycle, and keeps previous states of the first to $M^{th}$ redundancy signals HIT1 to HITM and the redundancy enable signal HITB during the remaining period of the compensation cycle. Therefore, the redundancy signal activated since the WLGA part of the address RADD<0:A> inputted under the first activation of the active signal RACTV in the compensation cycle is identical to the value stored in the redundancy control block 1210 stays active. Conversely, the redundancy control block 1210 deactivates all the first to $M^{th}$ redundancy signals HIT1 to HITM and the redundancy enable signal HITB in the case where the WLGA part of the address RADD<0:A> inputted under the first activation of the active signal RACTV in the compensation cycle is identical to the value stored therein in the compensation cycle, and keeps these states during the remaining period of the compensation cycle.

As described above, the address RADD<0:A> corresponds to one of the plurality of normal word lines WL1_1 to WLN_2. Since each word line group includes 2 word lines, the WLGA part of the address RADD<0:A> is RADD<1:A> of the address RADD<0:A>. In each word line group identified by RADD<1:A>, respective word lines are distinguished by the least significant bit RADD<0> of the address RADD<0:A>. In this disclosure, a part of the address RADD<0:A> for identification of individual word line in a word line group is referred to as a "word line address part" or "WLA part". Thus, the address RADD<0:A> may include the WLGA part for identification of a word line group and the WLA part for identification of a word line in the word line group. The LSB RADD<0> is an example of the WLA part.

In case (A) where the over-activated word line is a redundancy word line, or a normal word line group including the normal word line corresponding to the excessive input address RADD<0:A> among the first to $N^{th}$ normal word line groups WG1 to WGN in the special mode is replaced with the $K^{th}$ ($1 \leq K \leq M$) redundancy word line group RWGK among the first to $M^{th}$ redundancy word line groups RWG1 to RWGM, the adjacent activation control block 1220 activates a target control signal TAR and at least one of the adjacent control signals ADJ1 and ADJ2. Also, in case (B) where the adjacent word lines include at least one redundancy word line, or the over-activated word line corresponding to the excessive input address RADD<0:A> in the special mode includes at least one redundancy word line of the first to $M^{th}$ redundancy word line groups RWG1 to RWGM. This is the case where the over-activated word line is adjacent to the first word line RWL1_1 of the first redundancy word line group RWG1. The adjacent activation control block 1220 in case (B) activates the target control signal TAR and at least one adjacent control signal ADJ1. Namely, in the case where it is necessary to activate a redundancy word line in the special mode, the adjacent activation control block 1220 activates at least one of the adjacent control signals ADJ1 and ADJ2.

In detail, the adjacent activation control block 1220 generates the redundancy control signal RED_CON, the target control signal TAR and at least one of the adjacent control signals ADJ1 and ADJ2 in response to the mode signal MOD, a redundancy word line state signal HIT_AC, the active signal RACTV and the WLA part of the inputted address RADD<0:A> for identification of respective word lines in each word line group. In an initial state, the adjacent activation control block 1220 activates the redundancy control signal RED_CON and the target control signal TAR and deactivates the adjacent control signals ADJ1 and ADJ2.

The adjacent control signals ADJ1 and ADJ2 are used to activate an adjacent word line physically adjacent to an over-activated word line, which may be either one of a normal word line and a redundancy word line corresponding to the excessive input address RADD<0:A>. The adjacent word line also may be either one of a normal word line and a redundancy word line of a word line group, which may be same as or different from a word line group of the over-activated word line. The adjacent control signals ADJ1 and ADJ2 are used to activate an adjacent word line included in a word line group different from that of the over-activated word line. The target control signal TAR is used to activate an adjacent word line to the over-activated word line included in the word line group of the over-activated word line. The redundancy word line state signal HIT_AC indicates whether a redundancy word line is to be activated or not in the special mode. A word line distinguishing signal DIS_WL is generated by latching the WLA part, for example the least significant bit RADD<0> of the inputted address RADD<0:A> under activation of the redundancy control signal RED_CON, and indicates disposition order of corresponding word line in the word line group defined by the WLGA part.

The first adjacent control signal ACM activates an adjacent word line disposed after the over-activated word line designated by the excessive input address RADD<0:A> inputted under the first activation of the active signal RACTV in the compensation cycle, and the second adjacent control signal ADJ2 activates an adjacent word line disposed before the over-activated word line designated by the excessive input address RADD<0:A> inputted under the first activation of the active signal RACTV in the compensation cycle. The over-activated word line designated by the excessive input address RADD<0:A> means a normal word line corresponding to the excessive input address RADD<0:A> or a redundancy word line replacing the normal word line. Identification or the number of the adjacent word lines, and thus the number of the adjacent control signals may vary according to a memory design.

In case (A) where both the mode signal MOD and the redundancy word line state signal HIT_AC are activated and the over-activated word line is a redundancy word line for replacing the normal word line corresponding to the excessive input address RADD<0:A> inputted under the first activation of the active signal RACTV in the compensation cycle, which is disposed first in a redundancy word line group, the adjacent activation control block 1220 operates as described below. When the firstly activated active signal RACTV is deactivated, the adjacent activation control block 1220 deactivates the redundancy control signal RED_CON. When the secondly activated active signal RACTV is deactivated, the adjacent activation control block 1220 deactivates the target control signal TAR and activates the second adjacent control signal ADJ2. When the thirdly activated active signal RACTV is deactivated, the adjacent activation control block 1220 deactivates the second adjacent control signal ADJ2 and activates the redundancy control signal RED_CON and the target control signal TAR (the compensation cycle ends and return is made to the initial state).

In case (A) where the over-activated word line is a redundancy word line replacing the normal word line corresponding to the excessive input address RADD<0:A> inputted under the first activation of the active signal RACTV in the compensation cycle, which is disposed last in a redundancy word line group, the adjacent activation control block 1220 operates as described below. When the firstly activated active signal RACTV is deactivated, the adjacent activation control block 1220 deactivates the redundancy control signal RED_CON and the target control signal TAR and activates the first adjacent control signal ADD. When the secondly activated active signal RACTV is deactivated, the adjacent activation control block 1220 activates the target control signal TAR and deactivates the first adjacent control signal ADJ1. When the thirdly activated active signal RACTV is deactivated, the adjacent activation control block 1220 activates the redundancy control signal RED_CON (the compensation cycle ends and return is made to the initial state).

In the case where the mode signal MOD is activated and the redundancy word line state signal HIT_AC is deactivated, which means that an over-activated word line and all adjacent word lines are normal word lines, when the firstly activated active signal RACTV is deactivated, the adjacent activation control block 1220 deactivates the redundancy control signal RED_CON. When the secondly activated active signal RACTV is deactivated, the adjacent activation control block 1220 maintains the previous state (the state in which only the target control signal TAR is activated among the four signal's RED_CON, TAR, ADJ1 and ADJ2). When the thirdly activated active signal RACTV is deactivated, the adjacent activation control block 1220 activates the redundancy control signal RED_CON (the compensation cycle ends and return is made to the initial state).

In the case where the mode signal MOD is deactivated, the adjacent activation control block 1220 maintains the initial state, that is, the state in which the redundancy control signal RED_CON and the target control signal TAR are activated and the adjacent control signals ADJ1 and ADJ2 are deactivated regardless of toggle of the active signal RACTV.

In case (A) where the over-activated word line is a redundancy word line, or a normal word line group including the normal word line corresponding to the excessive input address RADD<0:A> in the special mode is replaced with the $K^{th}$ redundancy word line group RWGK, the word line control block 1230 activates at least one adjacent word line to a redundancy word line for replacing the normal word line corresponding to the excessive input address RADD<0:A> in response to the active signal RACTV, the $K^{th}$ redundancy signal HITK, and activate at least one of the adjacent control signals ADJ1 and ADJ2.

In detail, the word line control block 1230 activates an appropriate word line in response to the active signal RACTV, a word line decoding enable signal WLDECEN, the inputted address RADD<0:A>, the target control signal TAR, at least one of the adjacent control signals ADJ1 and ADJ2, the first to $M^{th}$ redundancy signals HIT1 to HITM and the redundancy enable signal HITB. The word line decoding enable signal WLDECEN is activated after a delay defined from the activation of the active signal RACTV to determination of the activation of the redundancy enable signal HITB (whether or not the value of the input address RADD<0:A> is identical to the value of the address stored in the redundancy control block 1210), stays active for a predetermined period, and is then deactivated.

With the active signal RACTV deactivated, the word line control block 1230 keeps deactivated states of the plurality of normal word lines WL1_1 to WLN_2 and the plurality of redundancy word lines RWL1_1 to RWLM_2. After activation of the active signal RACTV, activation of the word line decoding enable signal WLDECEN causes activation of one of the over-activated word line corresponding to the excessive input address RADD<0:A>, which may be a normal word line or a redundancy word line, the target control signal TAR, and at least one of the adjacent control signals ADJ1 and ADJ2.

In case (A) where the over-activated word line is a redundancy word line, or a normal word line corresponding to the excessive input address RADD<0:A> inputted under the first activation of the active signal RACTV in the compensation cycle of the special mode is disposed first in a word line group that is replaced with the $K^{th}$ redundancy word line group RWGK, the word line control block 1230 under the second activation of the active signal RACTV activates a redundancy word line disposed after the redundancy word line replacing the normal word line corresponding to the excessive input address RADD<0:A> in response to the $K^{th}$ redundancy signal HITK, the target control signal TAR, and the WLA part (for example, the least significant bit RADD<0>) of the excessive input address RADD<0:A>. Under the third activation of the active signal RACTV, the word line control block 1230 activates a redundancy word line disposed before the redundancy word line replacing the normal word line corresponding to the excessive input address RADD<0:A> in response to the $K^{th}$ redundancy signal HITK and the second adjacent control signal ADJ2.

In case (A) where the over-activated word line is a redundancy word line, or a normal word line corresponding to the excessive input address RADD<0:A> inputted under the first activation of the active signal RACTV in the compensation cycle of the special mode is disposed last in a word line group that is replaced with the $K^{th}$ redundancy word line group RWGK, the word line control block 1230 under the second activation of the active signal RACTV activates a redundancy word line disposed after the redundancy word line for replacing the normal word line corresponding to the excessive input address RADD<0:A> in response to the $K^{th}$ redundancy signal HITK and the first adjacent control signal ADJ1. Under the third activation of the active signal RACTV, the word line control block 1230 activates a redundancy word line disposed before the redundancy word line replacing the normal word line corresponding to the excessive input address RADD<0: A> in response to the $K^{th}$ redundancy signal HITK, the target control signal TAR and the WLA part (for example, the least significant bit RADD<0>) of the excessive input address RADD<0:A>.

In case (B) where the adjacent word lines include at least one redundancy word line, or a normal word line corresponding to the excessive input address RADD<0:A> inputted under the first activation of the active signal RACTV in the compensation cycle of the special mode is adjacent to the first redundancy word line RWL1_1 of the first redundancy word line group RWG1, for example in the case where the over-activated word line corresponding to the excessive input address RADD<0:A> inputted under the first activation of the active signal RACTV in the compensation cycle is the second normal word line WLN_2 of the $N^{th}$ normal word line group WGN, the word line control block 1230 under the second activation of the active signal RACTV activates the redundancy word line RWL1_1 disposed after the normal word line WLN_2 in response to the first adjacent control signal ADJ1 and activation of the normal word line WLN_2. Under the third activation of the active signal RACTV, the word line control block 1230 activates the normal word line WLN_1 disposed before the normal word line WLN_2 in response to the inputted address RADD<0:A> and the target control signal TAR.

In the case except for cases (A) and (B) where a normal word line corresponding to the excessive input address RADD<0:A> inputted under the first activation of the active signal RACTV in the compensation cycle under the special mode is not replaced, the word line control block 1230 activates normal word lines corresponding to the addresses RADD<0:A> inputted under the second and third activation of the active signal RACTV. However, the word line control block 1230 does not activate a redundancy word line that is a replacement of the normal word line corresponding to the addresses RADD<0:A> inputted under the second and third activation of the active signal RACTV.

When operating in the normal access mode, in the case where a word line corresponding to the inputted address RADD<0:A> is not replaced, the word line control block 1230 activates the word line corresponding to the inputted address RADD<0:A>. In the case where a word line corresponding to the inputted address RADD<0:A> is replaced, the word line control block 1230 activates a redundancy word line that corresponds to an activated redundancy signal. In the latter case, a word line corresponding to the address RADD<0:A> inputted in response to the redundancy enable signal HITB is not activated.

In the memory in accordance with another embodiment of the present invention, in the case where a normal word line group including a normal word line corresponding to the excessive input address under the first active command in the compensation cycle of the special mode is replaced with a redundancy word line group, it is possible to activate adjacent word lines to the over-activated redundancy word line that replaces the normal word line corresponding to the excessive input address, whereby it is possible to perform a normal compensating operation even when a normal word line is replaced with a redundancy word line. Also, since only word lines necessary in each situation are activated, current and power consumption in the compensating operation may be reduced.

Figure 13:
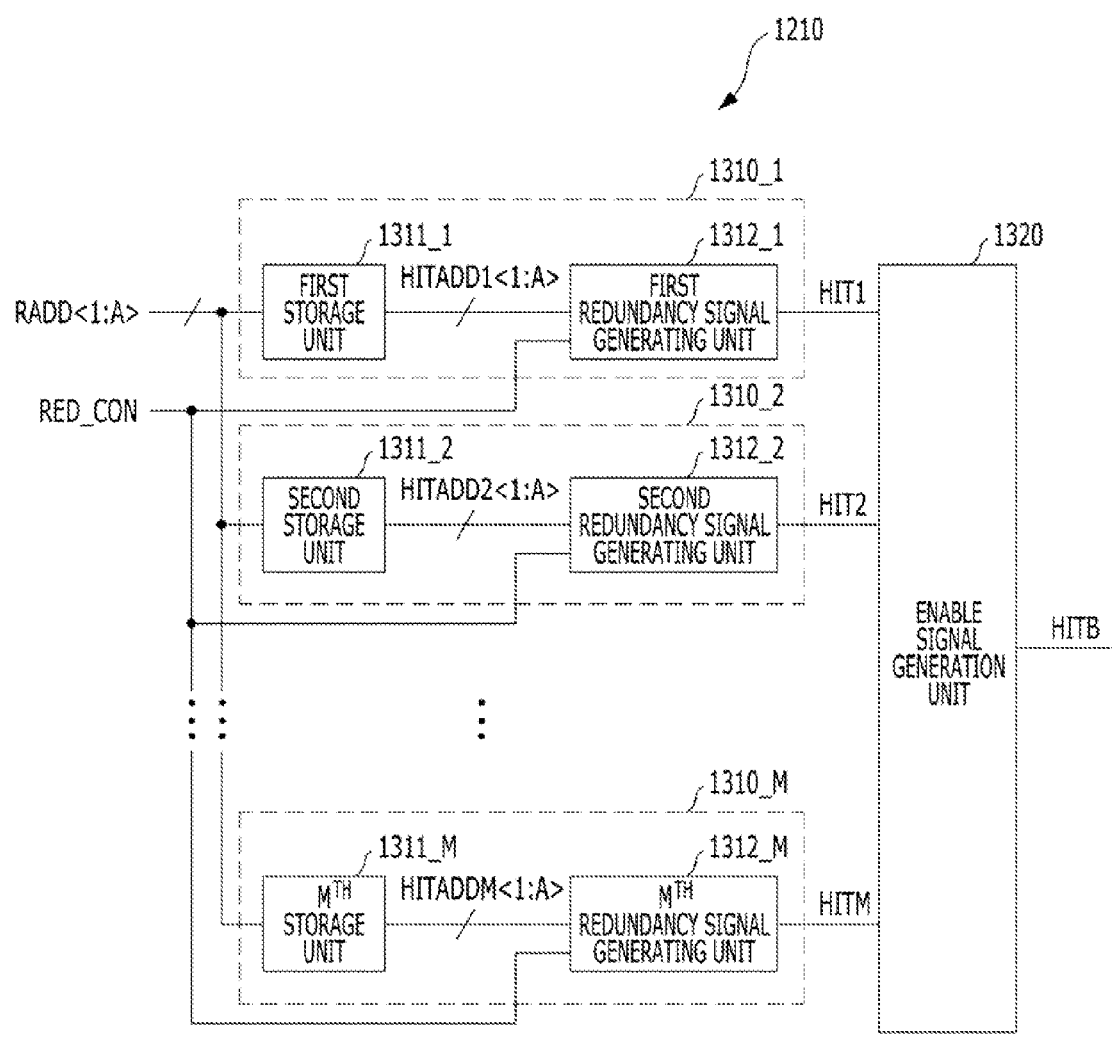
FIG. 13 is a detailed configuration diagram illustrating a redundancy control block illustrated in FIG. 12.

FIG. 13 is a detailed configuration diagram of the redundancy control block 1210 illustrated in FIG. 12.

The redundancy control block 1210 includes first to $M^{th}$ unit redundancy control units 1310_1 to 1310_M each configured to activate its redundancy signal in the case where a WLGA part RADD<1:A> in an inputted address RADD<0: A> is identical to the value stored therein, and an enable signal generation unit 1320 configured to generate the redundancy enable signal HITB according to activation of at least one redundancy signal among the first to $M^{th}$ redundancy signals HIT1 to HITM.

The configurations and operations of the first to $M^{th}$ unit redundancy control units 1310_1 to 1310_M are substantially the same. The configuration and operation of an $M^{th}$ unit redundancy control unit 1310_M among the first to $M^{th}$ unit redundancy control units 1310_1 to 1310_M will be described below.

The M$^{th}$ unit redundancy control unit 1310_M includes an M$^{th}$ storage unit 1311_M configured to store a value of WLGA part corresponding to a word line group to be replaced and generate K$^{th}$ comparison information HITADDM<1:A> by comparing the respective bits of the value stored therein and the respective bits of the WLGA part RADD<1:A> in the inputted address RADD<0:A>, and an M$^{th}$ redundancy signal generating unit 1312_M configured to generate an M$^{th}$ redundancy signal HITM and update the state of the M$^{th}$ redundancy signal HITM in response to the M$^{th}$ comparison information HITADDM<1:A> in the state in which the redundancy control signal RED_CON is activated.

The M$^{th}$ storage unit 1311_M activates all respective bits of the M$^{th}$ comparison information HITADDM<1:A> in the case where all bits of the value stored therein and all bits of the WLGA part RADD<1:A> in the inputted address RADD<0: A> are substantially the same with one another. The M$^{th}$ redundancy signal generating unit 1312_M activates the M$^{th}$ redundancy signal HITM when all the respective bits of the M$^{th}$ comparison information HITADDM<1:A> are activated in the state in which the redundancy control signal RED_CON is activated. The M$^{th}$ redundancy signal generating unit 1312 deactivates the M$^{th}$ redundancy signal HITM in the case where even any one of all the bits of the M$^{th}$ comparison information HITADDM<1:A> is not activated in the state in which the redundancy control signal RED_CON is activated. In the case where the redundancy control signal RED_CON is deactivated, the M$^{th}$ redundancy signal generating unit 1312_M causes the M$^{th}$ redundancy signal HITM to maintain the state before the redundancy control signal RED_CON is deactivated regardless of whether all the bits of the M$^{th}$ comparison information HITADDM<1:A> are activated.

Figure 14:
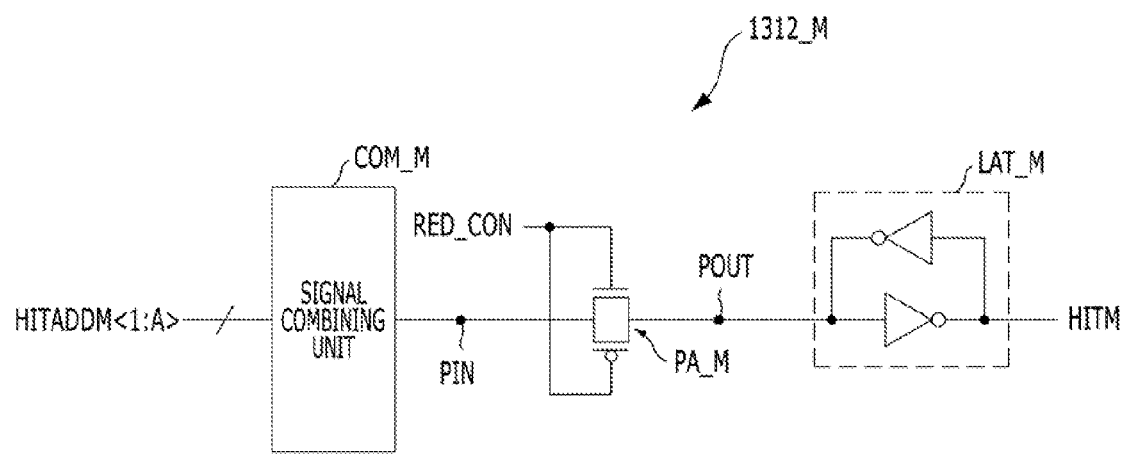
FIG. 14 is a detailed configuration diagram illustrating an $M^{th}$ redundancy signal generating unit illustrated in FIG. 13.

FIG. 14 is a detailed configuration diagram of the M$^{th}$ redundancy signal generating unit 1312_M illustrated in FIG. 13.

Referring to FIG. 14, the M$^{th}$ redundancy signal generating unit 1312_M includes a pass gate PA_M configured to allow or intercept the transfer of an input thereto as an output in response to the redundancy control signal RED_CON, a signal combining unit COM_M configured to activate (to level LOW) the input to the pass gate PA_M in the case where all bits of the M$^{th}$ comparison information HITADDM<1:A> are activated, and a latch LAT_M configured to invert the output value of the pass gate PA_M and latch the output value of the pass gate PA_M in the case where input to the pass gate PA_M is blocked.

The signal combining unit COM_M activates (to level LOW) an input PIN to the pass gate PA_M in the case where all respective bits of the M$^{th}$ comparison information HITADDM<1:A> are activated (to level HIGH). The signal combining unit COM_M deactivates (to level HIGH) the input PIN to the pass gate PA_M in the case where even one of the respective bits of the M$^{th}$ comparison information HITADDM<1:A> is deactivated (to level LOW). The pass gate PA_M transfers the input PIN thereto as an output POUT in the case where the redundancy control signal RED_CON is activated and intercepts the transfer of the input PIN thereto as the output POUT in the case where the redundancy control signal RED_CON is deactivated.

Referring back to FIG. 13, the enable signal generation unit 1320 activates (to level LOW) the redundancy enable signal HITB when at least one redundancy signal among the first to M$^{th}$ redundancy signals HIT1 to HITM is activated. the enable signal generation unit 1320 deactivates the redundancy enable signal HITB when all of the first to M$^{th}$ redundancy signals HIT1 to HITM are deactivated.

Circuit configurations may be easily modified according to variation of signal, which is active high or low. Also, in the case of the memory and the memory system described above, while a normal word line or a redundancy word line as an over-activated word line corresponding to an excessive input address inputted under the first activation of the active signal RACTV in the compensation cycle is activated, it is may not be necessary to activate the over-activated word line because the data of the memory cells connected to the over-activated word lines that have the actual numbers of activations greater than the reference number are not likely to be degraded. Therefore, even though an excessive input address is inputted under the first activation of the active signal RACTV in the compensation cycle is replaced only an adjacent word line to the over-activated word line may be activated in response to the consecutively activated active signal RACTV without activation of the over-activated word lines.

Figure 15:
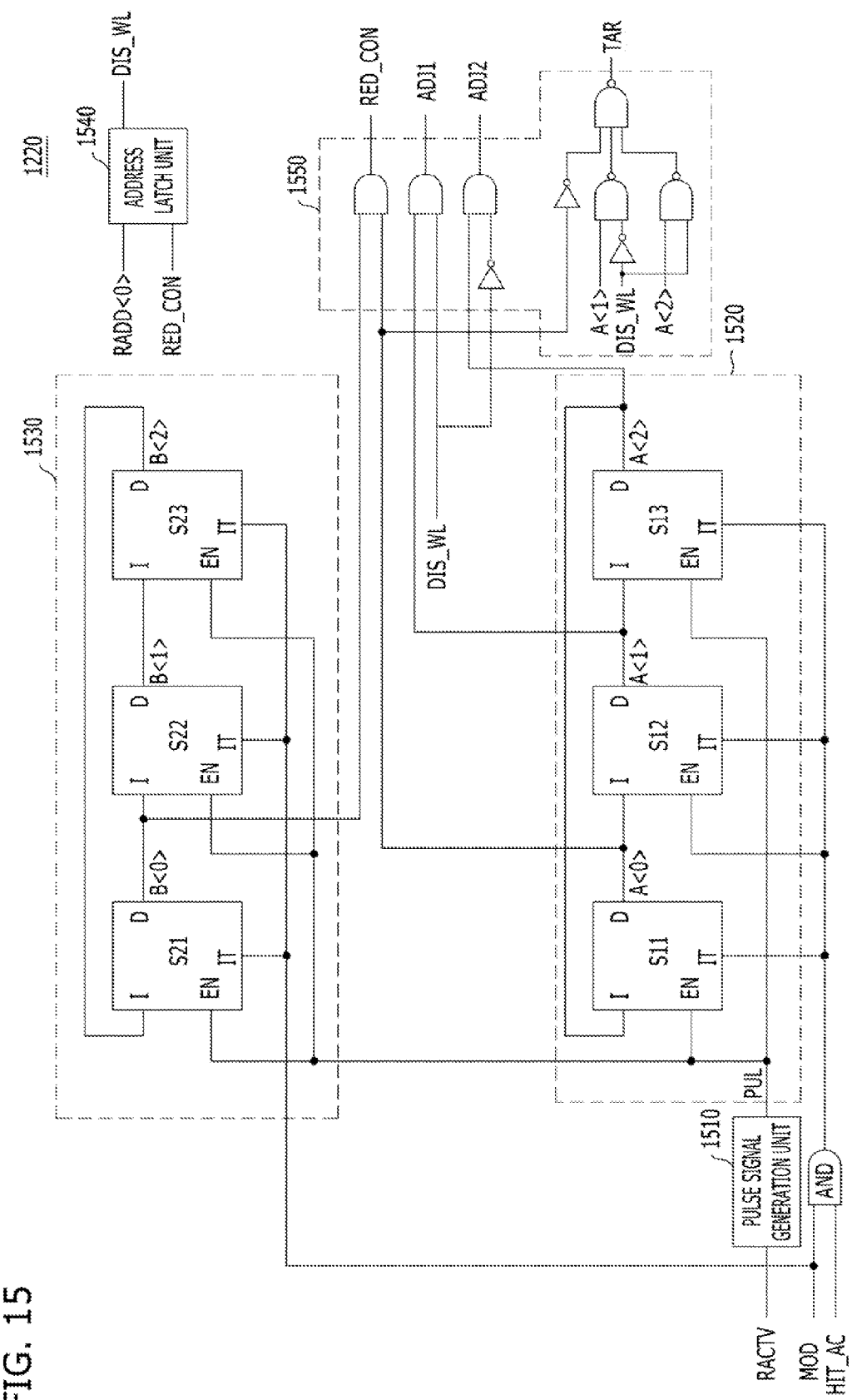
FIG. 15 is a detailed configuration diagram illustrating an adjacent activation control block illustrated in FIG. 12.

FIG. 15 is a detailed configuration diagram of the adjacent activation control block 1220 illustrated in FIG. 12.

Referring to FIG. 15, the adjacent activation control block 1220 includes a pulse generation unit 1510 configured to generate a pulse signal PUL having a predetermined pulse width at deactivation of the active signal RACTV, a first shifting unit 1520, a second shifting unit 1530, a signal generation unit 1540, and a signal generation unit 1550.

Operations of the adjacent activation control block 1220 will be described below with reference to FIG. 15.

The pulse generation unit 1510 generates the pulse signal PUL having the predetermined pulse width at each deactivation of the active signal RACTV and transfers the generated pulse signal PUL to the first shifting unit 1520 and the second shifting unit 1530.

The first shifting unit 1520 includes a plurality of first unit shifting units S11, S12 and S13 that are connected in series. While the plurality of first unit shifting units S11, S12 and S13 are in initial states, if the mode signal MOD and the redundancy word line state signal HIT_AC are activated, the plurality of first unit shifting units S11, S12 and S13 shift their outputs each time the pulse signal PUL is activated and generate a plurality of first signals A<0:2>. A<0> is the output of the first unit shifting unit S11, A<1> is the output of the first unit shifting unit S12, and A<2> is the output of the first unit shifting unit S13. In the initial states, the initial values of the plurality of first signals A<0:2> are (A<0>, A<1>, A<2>)=(1, 0, 0).

The second shifting unit 1530 includes a plurality of second unit shifting units S21, S22 and S23 that are connected in series. While the plurality of second unit shifting units S21, S22 and S23 are in initial states, if the mode signal MOD is activated, the plurality of second unit shifting units S21, S22 and S23 shift their outputs each time the pulse signal PUL is activated and generate a plurality of second signals B<0:2>. B<0> is the output of the second unit shifting unit S21, B<1> is the output of the second unit shifting unit S22, and B<2> is the output of the second unit shifting unit S23. In the initial states, the initial values of the plurality of second signals B<0:2> are (B<0>, B<1>, B<2>)=(1, 0, 0).

The address latch unit 1540 is configured to latch the WLA part, for example the LSB RADD<0> in an address RADD<0:A> inputted at deactivation of the redundancy control signal RED_CON, and to generate the word line distinguishing signal DIS_WL. Value '0' of the word line distinguishing signal DIS_WL (the WLA part, for example the LSB RADD<0> of the inputted address RADD<0:A> is 0) indicates a normal or redundancy word line disposed first in a normal or redundancy word line group. Value '1' of the word line distinguishing signal DIS_WL (the WLA part, for example the LSB RADD<0> of the inputted address RADD<0:A> is 1) indicates a normal or redundancy word line disposed second (last) in a normal or redundancy word line group.

The signal generation unit 1550 is configured to combine the plurality of first signals A<0:2>, the plurality of second signals B<0:2> and the word line distinguishing signal DIS_WL and to generate the redundancy control signal RED_CON, the target control signal TAR, the first adjacent control signal ADJ1 and the second adjacent control signal ADJ2. In detail, the signal generation unit 1550 generates the redundancy control signal RED_CON by performing logical AND operation on the first signal A<0> and the second signal 6<0>, generates the first adjacent control signal ADJ1 by performing logical AND operation on the first signal A<1> and the word line distinguishing signal DIS_WL, and generates the second adjacent control signal ADJ2 by combining the first signal A<2> and the inverted signal of the word line distinguishing signal DIS_WL. Furthermore, the signal generation unit 1550 activates the target control signal TAR in the case where the first signal A<0> is 1, in the case where the word line distinguishing signal DIS_WL is 0 and the first signal A<1> is 1, or in the case where the word line distinguishing signal DIS_WL is 1 and the first signal A<2> is 1.

Among the respective terminals of the plurality of first unit shifting units S11, S12 and S13 and the plurality of second unit shifting units S21, S22 and S23, I terminals indicate input terminals D terminals indicate output terminals, EN terminals indicate enable terminals, and IT terminals indicate initialization terminals. In the state in which the initialization terminals IT are deactivated, the respective unit shifting units receive and store the signals inputted through the input terminals I, and output stored values through the output terminals D. The respective unit shifting units output initial values in the state in which the initialization terminals IT are activated. The initial values of the first signal A<0> and the second signal S<0> as the output signals of the unit shifting units S11 and S21 are 1, and the initial values of the first signals A<1> and A<2> and the second signals B<1> and B<2> as the output signals of the unit shifting units S12, S13, S22 and S23 are 0.

Hereinafter, descriptions will be made for values of the plurality of first signals A<0:2>, the plurality of second signals B<0:2>, the redundancy control signal RED_CON, the target control signal TAR, the first adjacent control signal ACJ1 and the second adjacent control signal ADJ2 during the operations of the memory.

In the state in which the mode signal MOD and the redundancy word line state signal HIT_AC are activated (case (A) or (B)), all the signals applied to the initialization terminals IT of the plurality of first unit shifting units S11, S12 and S13 and the plurality of second unit shifting units S21, S22 and S23 are deactivated. Accordingly, all of the plurality of first unit shifting units S11, S12 and S13 and the plurality of second unit shifting units S21, S22 and S23 perform shifting operations in response to the pulse signal PUL that is inputted through the enable terminals EN.

In the initial state and during the period in which the active signal RACTV is activated for the first time in the compensation cycle, (A<0>, A<1>, A<2>)=(1, 0, 0) and (B<0>, B<1>, B<2>)=(1, 0, 0) are maintained. At this time, the redundancy control signal RED_CON and the target control signal TAR are in the activated states, and the first adjacent control signal ADJ1 and the second adjacent control signal ADJ2 are in the deactivated states.

If the firstly activated active signal RACTV is deactivated, changes are made to (A<0>, A<1>, A<2>)=(0, 1, 0) and (B<0>, B<1>, B<2>)=(0, 1, 0), and these values are maintained until the secondly activated active signal RACTV is deactivated in the compensation cycle. At this time, if the word line distinguishing signal DIS_WL is 0, the redundancy control signal RED_CON is in the deactivated state, the target control signal TAR is in the activated state, and the first adjacent control signal ADJ1 and the second adjacent control signal ADJ2 are in the deactivated states. If the word line distinguishing signal DIS_WL is 1, the redundancy control signal RED_CON and the target control signal TAR are in the deactivated states, the first adjacent control signal ADJ1 is in the activated state, and the second adjacent control signal ADJ2 is in the deactivated state.

If the secondly activated active signal RACTV is deactivated, changes are made to (A<0>, A<1>, A<2>)=(0, 0, 1) and (B<0>, B<1>, B<2>) (0, 0, 1), and these values are maintained until the thirdly activated active signal RACTV is deactivated in the compensation cycle. At this time, the redundancy control signal RED_CON, the target control signal TAR, and the first adjacent control signal ADJ1 are in the deactivated states. The second adjacent control signal ADJ2 is in the activated state if the word line distinguishing signal DIS_WL is 0. The redundancy control signal RED_CON is in the deactivated state, the target control signal TAR is in the activated state, and the first adjacent control signal ADJ1 and the second adjacent control signal ADJ2 are in the deactivated states if the word line distinguishing signal DIS_WL is 1.

The thirdly activated active signal RACTV is deactivated, and changes are made to (A<0>, A<1>, A<2>)=(1, 0, 0) and (B<0, B<1>, B<2>)=(1, 0, 0). That is to say, the state becomes initialized.

In the state in which the mode signal MOD is activated and the redundancy word line state signal HIT_AC is deactivated (an over-activated word line and all adjacent word lines are normal word lines in the special mode), the signals applied to the initialization terminals IT of the plurality of first unit shifting units S11, S12 and S13 maintain activated states, and the signals applied to the initialization terminals IT of the plurality of second unit shifting units S21, S22 and S23 are deactivated. Accordingly, the plurality of second unit shifting units S21, S22 and S23 perform shifting operations in response to the pulse signal PUL that is inputted through the enable terminals EN, and the plurality of first unit shifting units S11, S12 and S13 maintain the initial state (the state in which the respective bits A<0>, A<1> and A<2> of the first signals A<0:2> are (1, 0, 0)).

In the initial state and during the period in which the active signal RACTV is activated for the first time in the compensation cycle, (A<0>, A<1>, A<2>)=(1, 0, 0) and (B<0>, B<1>, B<2>) (1, 0, 0) are maintained. At this time, the redundancy control signal RED_CON and the target control signal TAR are in the activated states, and the first adjacent control signal ADJ1 and the second adjacent control signal ADJ2 are in the deactivated states.

If the firstly activated active signal RACTV is deactivated, changes are made to (B<0>, B<1>, B<2>)=(0, 1, 0), and these values are maintained until the secondly activated active signal RACTV is deactivated in the compensation cycle. At this time, the redundancy control signal RED_CON is in the deactivated state, the target control signal TAR is in the activated state, and the first adjacent control signal ADJ11 and the second adjacent control signal ADJ2 are in the deactivated states.

If the secondly activated active signal RACTV is deactivated, changes are made to (B<0>, B<1>, B<2>)=(0, 0, 1), and these values are maintained until the thirdly activated active signal RACTV is deactivated in the compensation cycle. At this time, the redundancy control signal RED_CON is in the deactivated state, the target control signal TAR is in the activated state, and the first adjacent control signal ADJ1 and the second adjacent control signal ADJ2 are in the deactivated states.

The thirdly activated active signal RACTV is deactivated, and changes are made to (B<0>, B<1>, B<2>)=(1, 0, 0). That is to say, the state becomes initialized.

In the state in which the mode signal MOD is deactivated (in the normal access mode), all the signals applied to the initialization terminals IT of the plurality of first unit shifting units S11, S12 and S13 and the plurality of second unit shifting units S21, S22 and S23 maintain the deactivated states. Accordingly, the plurality of first signal's A<0:2> and the plurality of second signals B<0:2> maintain the initial states as (A<0>, A<1>, A<2>)=(1, 0, 0) and (B<0>, B<1>, B<2>) (1, 0, 0). Therefore, the redundancy control signal RED_CON and the target control signal TAR are in the activated states, and the first adjacent control signal ADJ1 and the second adjacent control signal ADJ2 are in the deactivated states.

Figure 16A:
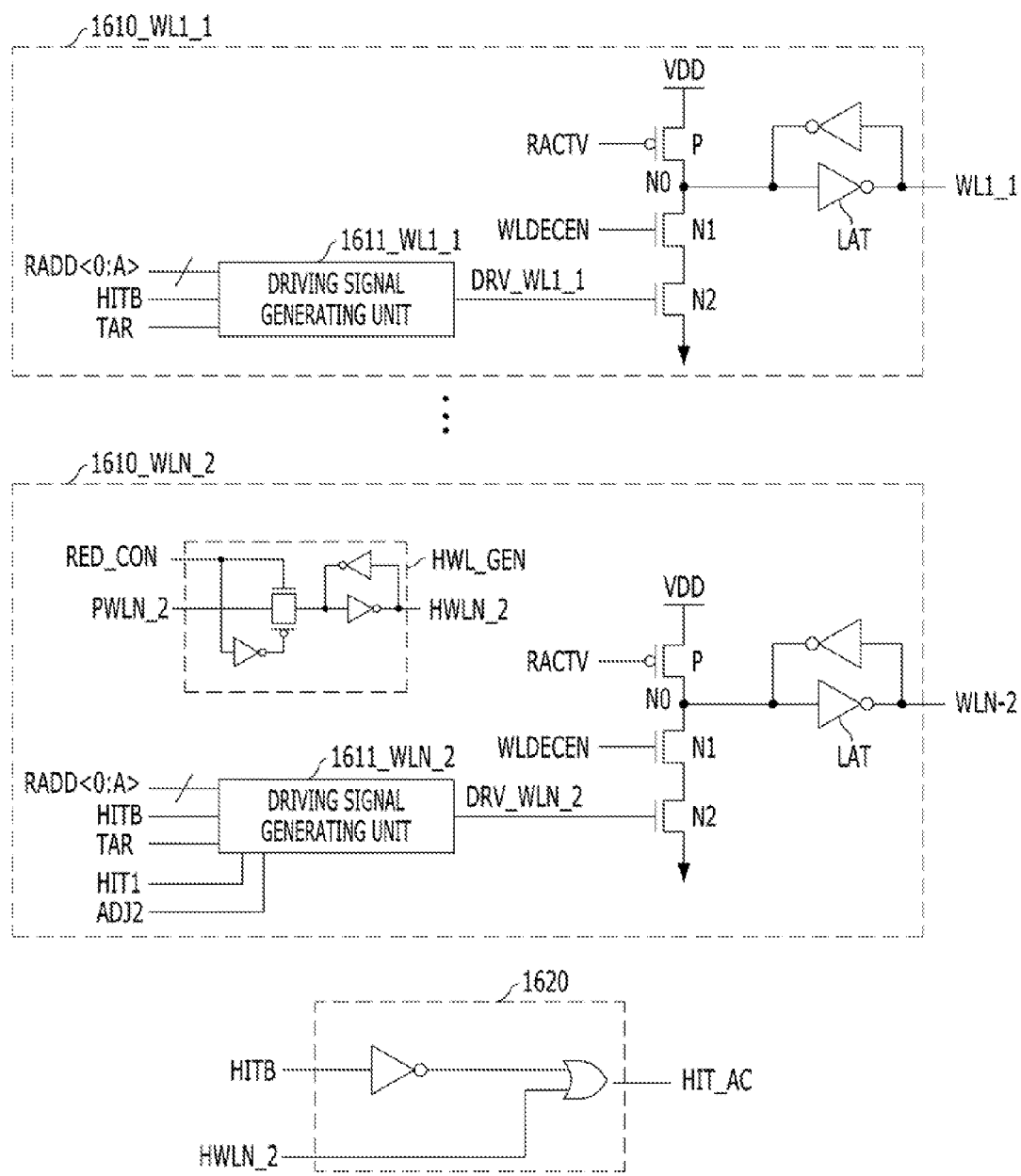
FIGS. 16A and 16B are detailed configuration diagrams illustrating a word line control block illustrated in FIG. 12.
Figure 16B:
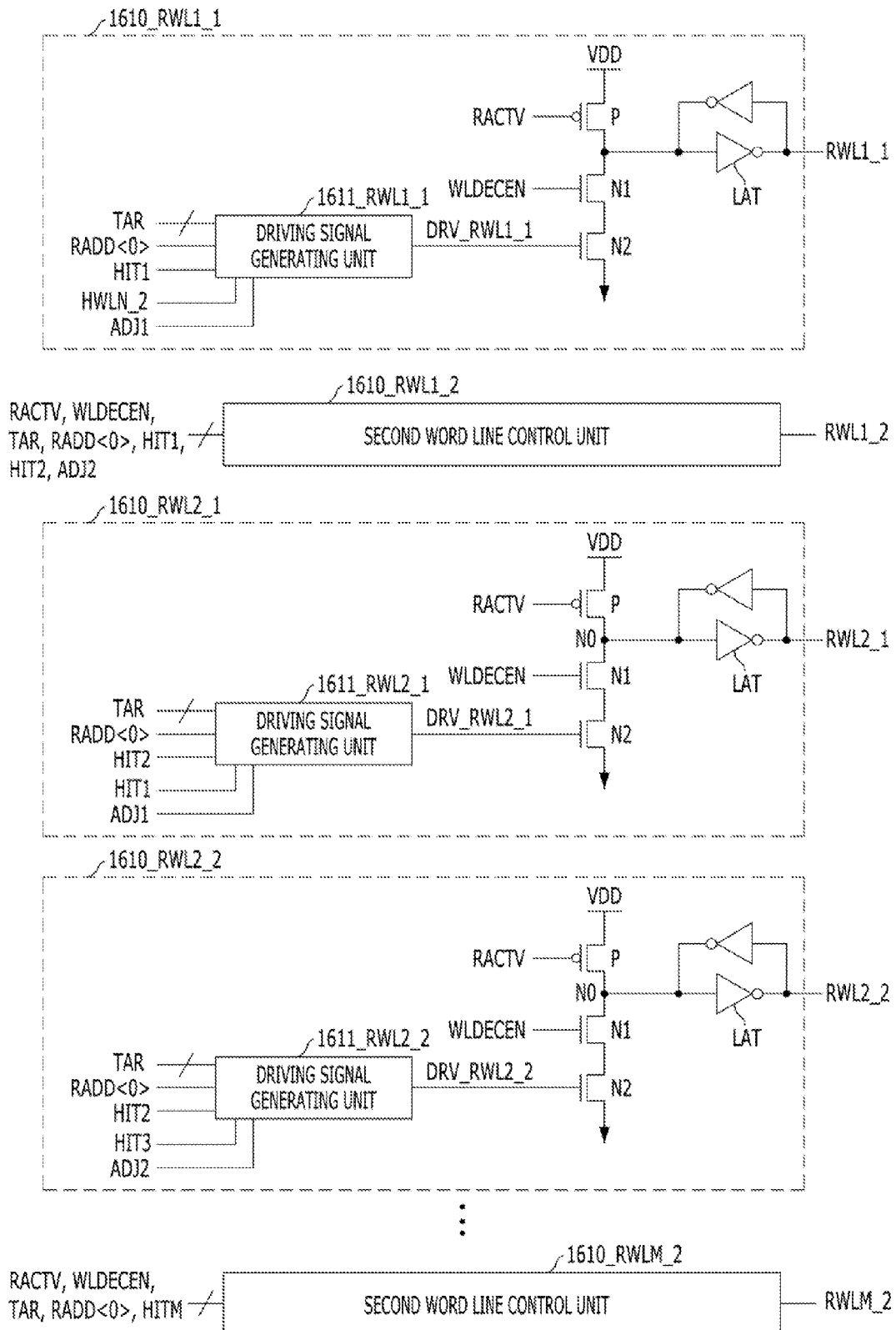

FIGS. 16A and 16B are detailed configuration diagrams of the word line control block 1230 illustrated in FIG. 12.

FIG. 16A illustrates a circuit for controlling the word lines included in the first to $N^{th}$ normal word line groups WG1 to WGN in the word line control block 1230 and FIG. 16B illustrates a circuit for controlling the redundancy word lines included in the first to $M^{th}$ redundancy word line groups RWG1 to RWGM in the word line control block 1230.

The word line control block 1230 will be described below with reference to FIGS. 16A and 16B.

The word line control block 1230 includes a plurality of normal word line control units 1610_WL1_1 to 1610_WLN_2 respectively corresponding to the normal word lines WL1_1 to WLN_2 included in the first to $N^{th}$ normal word line groups WG1 to WGN, a plurality of redundancy word line control units 1610_RWL1_1 to 1610_RWLM_2 respectively corresponding to the redundancy word lines RWL1_1 to RWLM_2 included in the first to $M^{th}$ redundancy word line groups RWG1 to RWGM, and a state signal generation unit 1620 configured to generate the redundancy word line state signal HIT_AC.

Each of the normal word line control units 1610_WL1_1 to 1610_WLN_1 corresponding to the normal word lines WL1_1 to WLN_1 controls corresponding normal word lines in response to the active signal RACTV, the word line decoding enable signal WLDECEN, the inputted address RADD<0:A>, the redundancy enable signal HITB and the target control signal TAR. The last normal word line control unit 1610_WLN_2 corresponding to the last normal word line WLN_2 included in the last normal word line group WGN controls the normal word line WLN_2 in response to the active signal RACTV, the word line decoding enable signal WLDECEN, the inputted address RADD<0:A>, the first redundancy signal HIT1, the redundancy enable signal HITB, the target control signal TAR and the second adjacent control signal ADJ2.

The configurations and the operations of the normal word line control units 1610_WL1_1 to 1610_WLN_1 illustrated in FIG. 16A are substantially the same. The configuration and the operation of the normal word line control unit 1610_WL1_1 corresponding to the normal word line WL1_1 will be described below.

The normal word line control unit 1610_WL1_1 includes a PMOS transistor P configured to maintain deactivation of the normal word line WL1_1 under deactivation of the active signal RACTV, a first NMOS transistor N1 configured to be turned on and off in response to the word line decoding enable signal WLDECEN, a driving signal generating unit 1611_WL1_1 configured to activate a driving signal DRV_WL1_1 when the value of the inputted address RADD<0:A> corresponds to the normal word line WL1_1 under activation of the target control signal TAR and deactivation of the redundancy enable signal HITB, a second NMOS transistor N2 configured to be turned on and off in response to the driving signal DRV_WL1_1 and a latch LAT connected with the normal word line WL1_1.

The PMOS transistor P is turned on in the state in which the active signal RACTV is deactivated (to level LOW), and pull-up drives the voltage of an internal node NO. The latch LAT latches and inverts the voltage of the internal node NO and pull-down drives the normal word line WL1_1. Accordingly, the normal word line WL1_1 is maintained in a deactivated state. If the active signal RACTV is activated (to level HIGH), the PMOS transistor is turned off, and a situation for activating the normal word line WL1_1 is prepared. After a predetermined time lapses from the activation of the active signal RACTV, the word line decoding enable signal WLDECEN is activated, and the first NMOS transistor N1 is turned on. In the case where the inputted address RADD<0:A> has the value corresponding to the normal word line WL1_1 the driving signal generating unit 1611_WL1_1 activates the driving signal DRV_WL1_1 (to level HIGH) at a time similar to when the word line decoding enable signal WLDECEN is activated. The second NMOS transistor N2 is turned in response to the driving signal DRV_WL1_1, the internal node NO is pull-down driven, and the latch LAT latches and inverts the voltage of the internal node NO and pull-up drives and activates the normal word line WL1_1. In the case where the inputted address RADD<0:A> does not have the value corresponding to the normal word line WL1_1 or the redundancy enable signal HITS is activated, since the driving signal DRV_WL1_1 is not activated, the normal word line WL1_1 is not activated.

The configuration and the operation of the last normal word line control unit 1610_WLN_2 corresponding to the last normal word line WLN_2 included in the last normal word line group WGN will be described below.

The normal word line control unit 1610_WLN_2 includes a PMS transistor P configured to maintain deactivation of the last normal word line WLN_2 under deactivation of the active signal RACTV, a first NMOS transistor N1 configured to be turned on and off in response to the word line decoding enable signal WLDECEN, a driving signal generating unit 1611_WLN_2 configured to activate a driving signal DRV_WLN_2 when the value of the inputted address RADD<0:A> corresponds to the last normal word line WLN_2 under activation of the target control signal TAR and deactivation of the redundancy enable signal HITB or when the first redundancy signal HIT1 and the second adjacent control signal ADJ2 are activated, a second NMOS transistor N2 configured to be turned on and off in response to the driving signal DRV_WLN_2, a latch LAT connected with the last normal word line WLN_2, and a word line activation signal generating unit HWLN_GEN. Operations of the PMOS transistor P, the first NMOS transistor N1, the second NMOS transistor N2 and the latch LAT are substantially the same as the operations of those of the normal word line control units 1610_WL1_1 to 1610 WLN_1 described above.

The word line activation signal generating unit HWLN_GEN generates a word line activation signal HWLN_2 indicating that the last normal word line WLN_2 is activated under the first activation of the active signal RACTV in the compensation cycle of the special mode, which means that the last normal word line WLN_2 is activated as the over-activated word line. In detail, under activation of the redundancy control signal RED_CON, the word line activation signal generating unit HWLN_GEN generates the word line activation signal HWLN_2 that is an inverted version of a signal PWLN_2, which is activated when the redundancy enable signal HITB is deactivated, the target control signal TAR is activated, and the value of the inputted address RADD<0:A> corresponds to the normal word line WLN_2. Under deactivation of the redundancy control signal RED_CON, the word line activation signal generating unit HWLN_GEN does not transfer the signal PWLN_2 as the word line activation signal HWLN_2. Under deactivation of the redundancy control signal RED_CON, the latch LAT keeps the previous state of the word line activation signal HWLN_2 before deactivation of the redundancy control signal RED_CON.

The configurations and the operations of the redundancy word line control units 1610_RWL1_1 to 1610_RWLM_2 illustrated in FIG. 16B will be described below. The configurations and the operations of the plurality of redundancy word line control units 1610_RWL1_1 to 1610_RWLM_2 illustrated in FIG. 16B are substantially the same.

The configuration and the operation of the redundancy word line control unit 1610_RWL2_1 corresponding to the redundancy word line RWL 2_1 will be described below.

The redundancy word line control unit 1610_RWL2_1 includes a PMOS transistor P configured to maintain deactivation of the redundancy word line RWL2_1 under deactivation of the active signal RACTV, a first NMOS transistor N1 configured to be turned on and off in response to the word line decoding enable signal WLDECEN, a driving signal generating unit 1611_RWL2_1, a second NMOS transistor N2 configured to be turned on and off in response to a driving signal DRV_RWL2_1, and a latch LAT connected with the word line RWL2_1. Operations of the PMOS transistor P, the first NMOS transistor N1 and the second NMOS transistor N2 are substantially the same as the normal word line control units 1610_WL1_1 to 1610_WLN_2 described above.

The driving signal generating unit 1611_RWL2_1 activates the driving signal DRV_RWL2_1 in the case where the target control signal TAR and the second redundancy signal HIT2 are activated and the WLA part (for example, the LSB RADD<0>) of the inputted address RADD<0:A> is 0 or in the case where the first redundancy signal HIT1 and the first adjacent control signal ADJ1 are activated.

The configuration and the operation of the redundancy word line control unit 1610_RWL2_2 corresponding to the redundancy word line RWL 2_2 will be described below.

The redundancy word line control unit 1610_RWL2_2 includes a PMOS transistor P configured to maintain deactivation of the redundancy word line RWL2_2 under deactivation of the active signal RACTV, a first NMOS transistor N1 configured to be turned on and off in response to the word line decoding enable signal WLDECEN, a driving signal generating unit 1611_RWL2_2, a second NMOS transistor N2 configured to be turned on and off in response to a driving signal DRV_RWL2_2, and a latch LAT connected with the word line RWL2_2. Operations of the PMOS transistor P, the first NMOS transistor N1 and the second NMOS transistor N2 are substantially the same as described above.

The driving signal generating unit 1611_RWL2_2 activates the driving signal DRV_RWL2_2 in the case where the target control signal TAR and the second redundancy signal HIT2 are activated and the WLA part (for example, the LSB RADD<0>) of the inputted address RADD<0:A> is 1 or in the case where the third redundancy signal HIT3 and the second adjacent control signal ADJ2 are activated.

As a consequence, a redundancy word line disposed first in a redundancy word line group is activated under the following condition: (1) one of the first to $M^{th}$ redundancy signals HIT1 to HITM corresponding to the redundancy word line group of the redundancy word line and the target control signal TAR are activated or (2) one of the first to $M^{th}$ redundancy signals HIT1 to HITM corresponding to a redundancy word line group disposed before the redundancy word line group of the redundancy word line and the first adjacent control signal ADJ1 are activated. A redundancy word line disposed last in a redundancy word line group is activated under the following condition: (1) one of the first to $M^{th}$ redundancy signals HIT1 to HITM corresponding to the redundancy word line group of the redundancy word line and the target control signal TAR are activated or (2) one of the first to $M^{th}$ redundancy signals HIT1 to HITM corresponding to a redundancy word line group disposed after the redundancy word line group of the redundancy word line and the second adjacent control signal ADJ2 are activated. However, the first redundancy word line RWL1_1 of the first redundancy word line group RWG1 is activated under the following condition: (1) the first redundancy signal HIT1 and the target control signal TAR are activated or (2) the word line activation signal HWLN_2 and the first adjacent control signal ADJ1 are activated.

Referring back to FIG. 16A, the state signal generation unit 1620 activates the redundancy word line state signal HIT_AC in case (A) where the redundancy enable signal HITS is activated or case (B) where the word line activation signal HWLN_2 is activated. Considering that the last normal word line WLN_2 of the last normal word line group WGN is adjacent to the first redundancy word line RWL1_1 of the first redundancy word line group RWG1 disposed next to the last normal word line group WGN, when the last normal word line WLN_2 is activated as the over-activated word line, the first redundancy word line RWL1_1 is included in the adjacent word lines to the over-activated word line or the last normal word line WLN_2. The state signal generation unit 1620 may be designed to activate the redundancy word line state signal HIT_AC only in one of the cases (A) and (B).

As is apparent from the above descriptions, according to the various embodiments of the present invention, word lines adjacent to a word line having the number of activations equal to or greater than a reference number are activated to refresh the memory cells connected to themselves, whereby the word line disturbance to the memory cells connected to the adjacent word lines may be prevented.

Also, according to the various embodiments of the present invention, even in the case where a group of a plurality of normal word lines is replaced with a group of a plurality of redundancy word lines and a normal word line having the number of activations equal to or greater than a reference number is replaced with a redundancy word line, the word line disturbance to the memory cells connected to word lines adjacent to the redundancy word line may be prevented.

Although various embodiments have been described for illustrative purposes, it will be apparent to those skilled in the art that various changes and modifications may be made without departing from the spirit and scope of the invention as defined in the following claims.

What is claimed is:
1. A memory comprising:
a first bank configured to include first to $N^{th}$ word lines and first to $M^{th}$ redundancy word lines to replace M number of word lines among the first to $N^{th}$ word lines;

a second bank configured to include first to $N^{th}$ word lines and first to $M^{th}$ redundancy word lines to replace M number of word lines among the first to $N^{th}$ word lines; and a control circuit configured to activate, in the case where a word line corresponding to an inputted address among the first to $N^{th}$ word lines in a bank selected between the first bank and the second bank is replaced with a $K^{th}$ ($1 \leq K \leq M$) redundancy word line among the first to $M^{th}$ redundancy word lines during an operation in a first mode, at least one adjacent word line adjacent to the $K^{th}$ redundancy word line of the selected bank in response to an active signal of the selected bank.

2. The memory according to claim 1, wherein the control circuit comprises:

a first control block configured to activate at least one adjacent word line adjacent to the $K^{th}$ redundancy word line in response to a first active signal of the first bank when the first bank is selected in the case where the word line corresponding to the inputted address among the first to $N^{th}$ word lines in the first bank is replaced with the $K^{th}$ redundancy word line; and a second control block configured to activate at least one adjacent word line adjacent to the $K^{th}$ redundancy word line in response to a second active signal of the second bank when the second bank is selected in the case where the word line corresponding to the inputted address among the first to $N^{th}$ word lines in the second bank is replaced with the $K^{th}$ redundancy word line.

3. The memory according to claim 2, wherein the first active signal is activated in response to an active command in the case where a bank address corresponds to the first bank and wherein the second active signal is activated in response to the active command in the case where the bank address corresponds to the second bank.

4. The memory according to claim 2, wherein the first mode includes at least one compensation cycle, and the active signal is activated at least two times in each compensation cycle, and wherein, in the case where the word line corresponding to the inputted address in the selected bank when the active signal of the selected bank activated for the first time in the compensation cycle is replaced with the $K^{th}$ redundancy word line, a control circuit corresponding to the selected bank activates the adjacent word line of the selected bank when the active signal of the selected bank is activated after the first activation of the active signal.

5. The memory according to claim 4, wherein, in the case where the word line corresponding to the address inputted in the selected bank when the active signal of the selected bank is activated for the first time in the compensation cycle is replaced with the $K^{th}$ redundancy word line, the control circuit corresponding to the selected bank does not activate a word line corresponding to an address inputted when the active signal of the selected bank is activated after the first activation of the active signal, and, wherein, in the case where the word line corresponding to the address inputted when the active signal of the selected bank is activated for the first time in the compensation cycle is not replaced, the control circuit corresponding to the selected bank activates a word line corresponding to an address inputted when the active signal of the selected bank is activated after the first activation of the active signal.

6. The memory according to claim 1, wherein, in each of the first bank and the second bank, the first to $N^{th}$ word lines are sequentially disposed and the first to $M^{th}$ redundancy word lines are sequentially disposed next to the $N^{th}$ word line.

7. The memory according to claim 6, wherein, in each of the first bank and the second bank, in the case where the word line corresponding to the inputted address is replaced with the $K^{th}$ redundancy word line, if the $K^{th}$ redundancy word line is the first redundancy word line, the adjacent word line includes at least one word line of the $N^{th}$ word line and the second redundancy word line, and, if the $K^{th}$ redundancy word line is not the first redundancy word line, the adjacent word line includes at least one word line of a $K-1^{th}$ redundancy word line and a $K+1^{th}$ redundancy word line.

8. The memory according to claim 1, wherein, in the case where a word line corresponding to an inputted address in a bank corresponding to the bank address is replaced with the $K^{th}$ redundancy word line while operating in the first mode and the bank corresponding to the bank address is not selected by a bank select information, the control circuit activates the $K^{th}$ redundancy word line in response to the active signal of the bank corresponding to the bank address, and wherein, in the case where a word line corresponding to an inputted address in a bank corresponding to the bank address is replaced with the $K^{th}$ redundancy word line in the second mode, the control circuit activates the $K^{th}$ redundancy word line in response to the active signal of the bank corresponding to the bank address.

9. The memory according to claim 4, wherein the control circuit further comprises:

an adjacent activation control block configured to sequentially activate one or more adjacent control signals in the case where the word line corresponding to the inputted address in the selected bank is replaced with the $K^{th}$ redundancy word line when at least one active signal of the first active signal and the second active signal is activated for the first time in the compensation cycle.

10. The memory according to claim 4, wherein the first control block comprises:

a first redundancy control block configured to activate a $K^{th}$ redundancy signal corresponding to the $K^{th}$ redundancy word line among first to $M^{th}$ redundancy signals corresponding to the first to $M^{th}$ redundancy word lines in the case where a word line corresponding to an inputted address in the first bank is replaced with the $K^{th}$ redundancy word line; and a first word line control block configured to activate the adjacent word line in response to the first active signal, the one or more adjacent control signals and the $K^{th}$ redundancy signal in the case where a word line corresponding to an inputted address in the first bank is replaced with the $K^{th}$ redundancy word line during an operation in the first mode.

11. The memory according to claim 10, wherein the second control block comprises:

a second redundancy control block configured to activate a $K^{th}$ redundancy signal corresponding to the $K^{th}$ redundancy word line among first to $M^{th}$ redundancy signals corresponding to the first to $M^{th}$ redundancy word lines in the case where a word line corresponding to an inputted address in the second bank is replaced with the $K^{th}$ redundancy word line; and a second word line control block configured to activate the adjacent word line in response to the second active signal, the one or more adjacent control signals and the $K^{th}$ redundancy signal in the case where a word line corresponding to an inputted address in the second bank is replaced with the $K^{th}$ redundancy word line during an operation in the first mode.

12. The memory according to claim 11,
wherein the first word line control block does not activate a word line corresponding to an address inputted when the first active signal is activated after the first activation of the active signal in the case where a word line corresponding to an inputted address in the first bank when the first active signal is activated for the first time in the compensation cycle is replaced with the $K^{th}$ redundancy word line, and activates a word line corresponding to an inputted address when the first active signal is activated after the first activation of the active signal in the case where a word line corresponding to an inputted address in the first bank when the first active signal is activated for the first time in the compensation cycle is not replaced, and
wherein the second word line control block does not activate a word line corresponding to an address inputted when the second active signal is activated after the first activation of the active signal in the case where a word line corresponding to an inputted address in the second bank when the second active signal is activated for the first time in the compensation cycle is replaced with the $K^{th}$ redundancy word line, and activates a word line corresponding to an inputted address when the second active signal is activated after the first activation of the active signal in the case where a word line corresponding to an inputted address in the second bank when the second active signal is activated for the first time in the compensation cycle is not replaced.

13. A memory comprising:
a first bank configured to include first to $N^{th}$ word lines and first to $M^{th}$ redundancy word lines to replace M number of word lines among the first to $N^{th}$ word lines;
a second bank configured to include first to $N^{th}$ word lines and first to $M^{th}$ redundancy word lines to replace M number of word lines among the first to $N^{th}$ word lines; and
a control circuit configured to activate, in the case where a word line corresponding to an inputted address among the first to $N^{th}$ word lines in a bank selected between the first bank and the second bank is adjacent to the first redundancy word line during an operation in a first mode, at least one adjacent word line adjacent to the word line corresponding to the inputted address among the first to $M^{th}$ redundancy word lines in response to an active signal of the selected bank.

14. The memory according to claim 13, wherein the control circuit comprises:
a first control block configured to activate at least one adjacent word line adjacent to the word line corresponding to the inputted address among the first to $M^{th}$ redundancy word lines in response to a first active signal of the first bank when the first bank is selected during an operation in the first mode in the case where the word line corresponding to the inputted address in the first bank is adjacent to the first redundancy word line; and
a second control block configured to activate at least one adjacent word line adjacent to the word line corresponding to the inputted address among the first to $M^{th}$ redundancy word lines in response to a second active signal of the second bank when the second bank is selected during an operation in the first mode in the case where the word line corresponding to the inputted address in the second bank is adjacent to the first redundancy word line.

15. The memory according to claim 14,
wherein the first mode includes at least one compensation cycle, and the active signal is activated at least two times in each compensation cycle, and
wherein, in the case where the word line corresponding to the inputted address in the selected bank when the active signal of the selected bank is activated for the first time in the compensation cycle is adjacent to the first redundancy word line, a control circuit corresponding to the selected bank activates the adjacent word line adjacent to the word line corresponding to the inputted address among the first to $M^{th}$ redundancy word lines when the active signal of the selected bank is activated after the first activation of the active signal.

16. The memory according to claim 15, wherein the control circuit further comprises:
an adjacent activation control block configured to activate one or more adjacent control signals in the case where the word line corresponding to the inputted address in the selected bank is adjacent to the first redundancy word line when at least one active signal of the first active signal and the second active signal is activated for the first time in the compensation cycle during an operation in the first mode.

17. The memory according to claim 16, wherein the first control block comprises:
a first redundancy control block configured to activate a $K^{th}$ redundancy signal corresponding to the $K^{th}$ redundancy word line among first to $M^{th}$ redundancy signals corresponding to the first to $M^{th}$ redundancy word lines in the case where a word line corresponding to an inputted address in the first bank is replaced with the $K^{th}$ redundancy word line; and
a first word line control block configured to activate the adjacent word line in response to the first active signal, the one or more adjacent control signals and a signal indicating that a word line corresponding to an inputted address is selected in the case that the word line corresponding to the inputted address in the first bank is adjacent to the first redundancy word line during an operation in the first mode.

18. The memory according to claim 17, wherein the second control block comprises:
a second redundancy control block configured to activate a $K^{th}$ redundancy signal corresponding to the $K^{th}$ redundancy word line among first to $M^{th}$ redundancy signals corresponding to the first to $M^{th}$ redundancy word lines in the case where a word line corresponding to an inputted address in the second bank is replaced with the $K^{th}$ redundancy word line; and
a second word line control block configured to activate the adjacent word line in response to the second active signal, the one or more adjacent control signals and a signal indicating that a word line corresponding to an inputted address is selected in the case where the word line corresponding to the inputted address in the second bank is adjacent to the first redundancy word line during an operation in the first mode.

19. A memory system comprising:
a memory configured to include
a first bank configured to include first to $N^{th}$ word lines and first to $M^{th}$ redundancy word lines to replace M number of word lines among the first to $N^{th}$ word lines, and a second bank configured to include first to $N^{th}$ word lines and first to $M^{th}$ redundancy word lines to replace M number of word lines among the first to $N^{th}$ word lines, wherein the memory is configured to activate, in the case where a word line corresponding to an inputted address among the first to $N^{th}$ word lines in a bank selected between the first bank and the second bank by bank select information is replaced with a $K^{th}$ ($1 \leq K \leq M$) redundancy word line among the first to $M^{th}$ redundancy word lines during an operation in a first mode, at least one adjacent word line adjacent to the $K^{th}$ redundancy word line in response to an active signal of the selected bank; and a memory controller configured to input, in response to a result of counting the numbers of activations of the first to $N^{th}$ word lines of the first bank and the numbers of activations of the first to $N^{th}$ word lines of the second bank, an address corresponding to a word line of which the number of activations is equal to or greater than a reference number among the first to $N^{th}$ word lines of the selected bank, to the memory during the operation in the first mode.

20. A memory system comprising:

a memory configured to include
  a first bank configured to include first to $N^{th}$ word lines and first to $M^{th}$ redundancy word lines to replace M number of word lines among the first to $N^{th}$ word lines, and
  a second bank configured to include first to $N^{th}$ word lines and first to $M^{th}$ redundancy word lines to replace M number of word lines among the first to $N^{th}$ word lines, wherein
  the memory is configured to activate, in the case where a word line corresponding to an inputted address among the first to $N^{th}$ word lines in a bank selected between the first bank and the second bank by bank select information is adjacent to the first redundancy word line during an operation in a first mode, at least one adjacent word line adjacent to the word line corresponding to the inputted address among the first to $M^{th}$ redundancy word lines in response to an active signal of the selected bank; and a memory controller configured to input, in response to a result of counting the numbers of activations of the first to $N^{th}$ word lines of the first bank and the numbers of activations of the first to $N^{th}$ word lines of the second bank, an address corresponding to a word line of which the number of activations is equal to or greater than a reference number among the first to $N^{th}$ word lines of the selected bank, to the memory during the operation in the first mode.

21. A memory comprising:

first to $N^{th}$ word line groups, each of which is configured to include a plurality of word lines;

first to $M^{th}$ redundancy word line groups, each of which is configured to include a plurality of redundancy word lines to replace M number of word line groups among the first to $N^{th}$ word line groups; and a control circuit configured to activate, in the case where a word line group including a word line corresponding to an inputted address among the first to $N^{th}$ word line groups is replaced with a $K^{th}$ ($1 \leq K \leq M$) redundancy word line group among the first to $M^{th}$ redundancy word line groups in a first mode, at least one adjacent word line adjacent to a redundancy word line that replaces the word line corresponding to the inputted address among the plurality of redundancy word lines of the $K^{th}$ redundancy word line group in response to an active signal.

22. The memory according to claim 21, wherein the control circuit generates first to $M^{th}$ redundancy signals that correspond to the first to $M^{th}$ redundancy word line groups, activates a $K^{th}$ redundancy signal that corresponds to the $K^{th}$ redundancy word line group among the first to $M^{th}$ redundancy signals in response to the inputted address in the case where the word line group including the word line corresponding to the inputted address is replaced with the $K^{th}$ redundancy word line group in the first mode, and activates the adjacent word line using the $K^{th}$ redundancy signal.

23. The memory according to claim 22, wherein the first mode includes at least one compensation cycle, and the active signal is activated at least two times in each compensation cycle, and wherein, in the case where a word line group including a word line corresponding to an address inputted when the active signal is activated for the first time in the compensation cycle is replaced with the $K^{th}$ redundancy word line group, the control circuit does not activate a word line corresponding to an address inputted when the active signal is activated after the first activation of the active signal and, wherein, in the case where a word line group corresponding to an address inputted when the active signal is activated for the first time in the compensation cycle is not replaced, the control circuit activates a word line corresponding to an address inputted when the active signal is activated after the first activation of the active signal.

24. The memory according to claim 23, wherein, in the case where the word line group including the word line corresponding to the address inputted when the active signal is activated for the first time in the compensation cycle is replaced with the $K^{th}$ redundancy word line group, the control circuit activates the adjacent word line when the active signal is activated after the first activation of the active signal.

25. The memory according to claim 22, wherein the first to $N^{th}$ word line groups are sequentially disposed and the first to $M^{th}$ redundancy word line groups are sequentially disposed next to the $N^{th}$ word line group.

26. The memory according to claim 25, wherein, if a word line that replaces the word line corresponding to the inputted address in the first mode is a redundancy word line disposed first in the first redundancy word line group, the adjacent word line is one of a word line disposed last in the $N^{th}$ word line group and a redundancy word line disposed second in the first redundancy word line group, and wherein, if a word line that replaces the word line corresponding to the inputted address in the first mode is a redundancy word line other than a redundancy word line disposed first in the first redundancy word line group, the adjacent word line is one of a redundancy word line disposed before the redundancy word line that replaces the word line corresponding to the inputted address and a redundancy word line disposed after the redundancy word line that replaces the word line corresponding to the inputted address.

27. The memory according to claim 21, wherein, in the case where a word line corresponding to the inputted address is replaced with a redundancy word line in a second mode, the control circuit activates the redundancy word line that replaces the word line corresponding to the inputted address in response to the active signal.

28. The memory according to claim 21, wherein the active signal is activated in response to an active command and is deactivated in response to a precharge command.

29. A memory comprising:
first to $N^{th}$ word line groups, each of which is configured to include a plurality of word lines;
first to $M^{th}$ redundancy word line groups, each of which is configured to include a plurality of redundancy word lines to replace M number of word line groups among the first to $N^{th}$ word line groups;
a redundancy control block configured to generate first to $M^{th}$ redundancy signals, and, in the case where a word line group including a word line corresponding to an inputted address among the first to $N^{th}$ word line groups is replaced with a $K^{th}$ ($1 \leq K \leq M$) redundancy word line group among the first to $M^{th}$ redundancy word line groups, to activate a $K^{th}$ redundancy signal among the first to $M^{th}$ redundancy signals that corresponds to the $K^{th}$ redundancy word line group in response to the inputted address;
an adjacent activation control block configured to activate at least one adjacent control signal in the case where the word line group including the word line corresponding to the inputted address is replaced with the $K^{th}$ redundancy word line group in a first mode; and
a word line control block configured to activate at least one adjacent word line adjacent to the redundancy word line that replaces the word line corresponding to the inputted address in response to an active signal and the $K^{th}$ redundancy signal and the adjacent control signal, in the case where the word line group including the word line corresponding to the inputted address is replaced with the $K^{th}$ redundancy word line group in the first mode.

30. The memory according to claim 29, wherein the adjacent activation control block deactivates the adjacent control signal in the case where the word line corresponding to the inputted address is not replaced in the first mode or in the case of a second mode.

31. The memory according to claim 30, wherein, in the case where the word line corresponding to the inputted address is not replaced, the word line corresponding to the inputted address is activated in response to the active signal.

32. The memory according to claim 31, wherein the first mode includes at least one compensation cycle, and the active signal is activated at least two times in each compensation cycle.

33. The memory according to claim 32,
wherein the adjacent activation control block further generates a target control signal, and
wherein the adjacent control signal is one of a first adjacent control signal and a second adjacent control signal.

34. The memory according to claim 33,
wherein, in the case where a word line corresponding to an address inputted when the active signal is activated for the first time in the compensation cycle is a word line disposed first in a word line group and the word line group including the word line corresponding to the inputted address is replaced with the $K^{th}$ redundancy word line group, the adjacent activation control block activates the target control signal and the second adjacent control signal, and
wherein, in the case where a word line corresponding to an address inputted when the active signal is activated for the first time in the compensation cycle is a word line disposed last in a word line group and the word line group including the word line corresponding to the inputted address is replaced with the $K^{th}$ redundancy word line group, the adjacent activation control block activates the target control signal and the first adjacent control signal.

35. The memory according to claim 34,
wherein, in the case where a word line corresponding to an address inputted when the active signal is activated for the first time in the compensation cycle is a word line disposed first in a word line group and the word line group including the word line corresponding to the inputted address is replaced with the $K^{th}$ redundancy word line group, when the active signal is activated after the first activation of the active signal, the word line control block activates a redundancy word line disposed after the redundancy word line that replaces the word line corresponding to the inputted address in response to the $K^{th}$ redundancy signal and the target control signal, and activates a redundancy word line disposed before the redundancy word line that replaces the word line corresponding to the inputted address in response to the $K^{th}$ redundancy signal and the second adjacent control signal, and
wherein, in the case where a word line corresponding to an address inputted when the active signal is activated for the first time in the compensation cycle is a word line disposed last in a word line group and the word line group including the word line corresponding to the inputted address is replaced with the $K^{th}$ redundancy word line group, when the active signal is activated after the first activation, the word line control block activates a redundancy word line disposed before the redundancy word line that replaces the word line corresponding to the inputted address in response to the $K^{th}$ redundancy signal and the target control signal, and activates a redundancy word line disposed after the redundancy word line that replaces the word line corresponding to the inputted address in response to the $K^{th}$ redundancy signal and the second adjacent control signal.

36. The memory according to claim 35, wherein each of the first to $N^{th}$ word line groups comprises 2 word lines, and each of the first to $M^{th}$ redundancy word line groups comprises at least 2 redundancy word lines.

37. The memory according to claim 29,
wherein the redundancy control block comprises first to $M^{th}$ storage units configured to store addresses corresponding to word line groups to be replaced among the first to $N^{th}$ word line groups, and activates the $K^{th}$ redundancy signal when the portion of the inputted address and a value stored in a $K^{th}$ storage unit among the first to $M^{th}$ storage units are identical to each other, and
wherein the first to $M^{th}$ storage units corresponds to the first to $M^{th}$ redundancy signals, respectively.

38. A memory system comprising:
a memory configured to include
first to $N^{th}$ word line groups, each of which is configured to include a plurality of word lines, and
first to $M^{th}$ redundancy word line groups, each of which is configured to include a plurality of redundancy word lines to replace M number of word line groups among the first to $N^{th}$ word line groups, wherein
the memory is configured to activate, in the case where a word line group including a word line corresponding to an inputted address among the first to $N^{th}$ word line groups is replaced with a $K^{th}$ ($1 \leq K \leq M$) redundancy word line group among the first to $M^{th}$ redundancy word line groups in a first mode, at least one adjacent word line adjacent to a redundancy word line that replaces the word line corresponding to the inputted address among the plurality of redundancy word lines of the $K^{th}$ redundancy word line group in response to an active signal; and a memory controller configured to input, in response to a result of counting the numbers of activations of the plurality of word lines of the first to $N^{th}$ word line groups, an address corresponding to a word line of which the number of activations is equal to or greater than a reference number among the plurality of word lines of the first to $N^{th}$ word line groups in the first mode, to the memory.

39. The memory system according to claim 38, wherein the memory generates first to $M^{th}$ redundancy signals that correspond to the first to $M^{th}$ redundancy word line groups, activates a $K^{th}$ redundancy signal that corresponds to the $K^{th}$ redundancy word line group among the first to $M^{th}$ redundancy signals in response to a portion of the inputted address in the case where the word line group including the word line corresponding to the inputted address is replaced with the $K^{th}$ redundancy word line group in the first mode, and activates the adjacent word line using the $K^{th}$ redundancy signal.

40. The memory system according to claim 39,
wherein the first mode includes at least one compensation cycle, and the active signal is activated at least two times in each compensation cycle, and
wherein, in the case where a word line group including a word line corresponding to an address inputted when the active signal is activated for the first time in the compensation cycle is replaced with the $K^{th}$ redundancy word line group, the memory does not activate a word line corresponding to an address inputted when the active signal is activated after the first activation of the active signal, and, in the case where a word line group corresponding to an address inputted when the active signal is activated for the first time in the compensation cycle is not replaced, the control circuit activates a word line corresponding to an address inputted when the active signal is activated after the first activation of the active signal.

41. The memory system according to claim 40, wherein, in the case where the word line group including the word line corresponding to the address inputted when the active signal is activated for the first time in the compensation cycle is replaced with the $K^{th}$ redundancy word line group, the memory activates the adjacent word line when the active signal is activated after the first activation of the active signal.

42. A memory system comprising a memory and a memory controller,
wherein the memory is configured to comprise:
first to $N^{th}$ word line groups, each of which is configured to include a plurality of word lines;
first to $M^{th}$ redundancy word line groups, each of which is configured to include a plurality of redundancy word lines to replace M number of word line groups among the first to $N^{th}$ word line groups;
a redundancy control block configured to generate first to $M^{th}$ redundancy signals, and, in the case where a word line group including a word line corresponding to an inputted address among the first to $N^{th}$ word line groups is replaced with a $K^{th}$ (1≤K≤M) redundancy word line group among the first to $M^{th}$ redundancy word line groups, to activate a $K^{th}$ redundancy signal among the first to $M^{th}$ redundancy signals that corresponds to the $K^{th}$ redundancy word line group in response to a portion of the inputted address;
an adjacent activation control block configured to activate at least one adjacent control signal in the case where the word line group including the word line corresponding to the inputted address is replaced with the $K^{th}$ redundancy word line group in a first mode; and a word line control block configured to activate at least one adjacent word line adjacent to the redundancy word line that replaces the word line corresponding to the inputted address in response to an active signal and the $K^{th}$ redundancy signal and the adjacent control signal in the case where the word line group including the word line corresponding to the inputted address is replaced with the $K^{th}$ redundancy word line group in the first mode, and
wherein the memory contoller is configured to input, in response to a result of counting the numbers of activations of the plurality of word lines of the first to $N^{th}$ word line groups, an address corresponding to a word line of which the number of activations is equal to or greater than a reference number among the plurality of word lines of the first to $N^{th}$ word line groups in the first mode, to the memory.

43. The memory system according to claim 42, wherein the adjacent activation control block deactivates the adjacent control signal in the case where the word line corresponding to the inputted address is not replaced in the first mode or in the case of a second mode.

44. The memory system according to claim 43,
wherein the adjacent activation control block further generates a target control signal, and
wherein the adjacent control signal is one of a first adjacent control signal and a second adjacent control signal.

45. The memory system according to claim 44,
wherein, in the case where a word line corresponding to an address inputted when the active signal is activated for the first time in the compensation cycle is a word line disposed first in a word line group and the word line group including the word line corresponding to the inputted address is replaced with the $K^{th}$ redundancy word line group, the adjacent activation control block activates the target control signal and the second adjacent control signal, and
wherein, in the case where a word line corresponding to an address inputted when the active signal is activated for the first time in the compensation cycle is a word line disposed last in a word line group and the word line group including the word line corresponding to the inputted address is replaced with the $K^{th}$ redundancy word line group, the adjacent activation control block activates the target control signal and the first adjacent control signal.

46. The memory system according to claim 45,
wherein, in the case where a word line corresponding to an address inputted when the active signal is activated for the first time in the compensation cycle is a word line disposed first in a word line group and the word line group including the word line corresponding to the inputted address is replaced with the $K^{th}$ redundancy word line group, when the active signal is activated after the first activation of the active signal, the word line control block activates a redundancy word line disposed after the redundancy word line that replaces the word line corresponding to the inputted address in response to the $K^{th}$ redundancy signal and the target control signal, and activates a redundancy word line disposed before the redundancy word line that replaces the word line corresponding to the inputted address in response to the $K^{th}$ redundancy signal and the second adjacent control signal, and wherein, in the case where a word line corresponding to an address inputted when the active signal is activated for the first time in the compensation cycle is a word line disposed last in a word line group and the word line group including the word line corresponding to the inputted address is replaced with the $K^{th}$ redundancy word line group, when the active signal is activated after the first activation of the active signal, the word line control block activates a redundancy word line disposed before the redundancy word line that replaces the word line corresponding to the inputted address in response to the $K^{th}$ redundancy signal and the target control signal, and activates a redundancy word line disposed after the redundancy word line that replaces the word line corresponding to the inputted address in response to the $K^{th}$ redundancy signal and the second adjacent control signal.

47. A memory comprising:
first to $N^{th}$ word line groups, each of which is configured to include a plurality of word lines;
first to $M^{th}$ redundancy word line groups, each of which is configured to include a plurality of redundancy word lines to replace M number of word line groups among the first to $N^{th}$ word line groups; and
a control circuit configured to activate at least one adjacent word line adjacent to a word line corresponding to an inputted address among the redundancy word lines included in the first to $M^{th}$ redundancy word lines in response to an active signal in the case where the word line corresponding to the inputted address is adjacent to a redundancy word line disposed first in the first redundancy word line group, in a first mode.

48. The memory according to claim 47, wherein, in the case where the word line corresponding to the inputted address is a word line disposed last in the $N^{th}$ word line group, the adjacent word line is a redundancy word line disposed first in the first redundancy word line group.

49. A memory comprising:
first to $N^{th}$ word line groups, each of which is configured to include a plurality of word lines;
first to $M^{th}$ redundancy word line groups, each of which is configured to include a plurality of redundancy word lines to replace M number of word line groups among the first to $N^{th}$ word line groups;
a redundancy control block configured to generate first to $M^{th}$ redundancy signals, and, in the case where a word line group including a word line corresponding to an inputted address among the first to $N^{th}$ word line groups is replaced with a $K^{th}$ ($1 \leq K \leq M$) redundancy word line group among the first to $M^{th}$ redundancy word line groups, to activate a $K^{th}$ redundancy signal among the first to $M^{th}$ redundancy signals that corresponds to the $K^{th}$ redundancy word line group in response to a portion of the inputted address;
an adjacent activation control block configured to activate at least one adjacent control signal in the case where the word line corresponding to the inputted address is adjacent to a redundancy word line disposed first in the first redundancy word line group, in a first mode; and
a word line control block configured to activate at least one adjacent word line adjacent to the word line corresponding to the inputted address among the redundancy word lines included in the first to $M^{th}$ redundancy word line groups in response to an active signal and a signal that is activated when the word line corresponding to the inputted address is activated and the adjacent control signal in the case where the word line corresponding to the inputted address is adjacent to the redundancy word line disposed first in the first redundancy word line group, in the first mode.

50. The memory according to claim 49,
wherein the first mode includes at least one compensation cycle, and the active signal is activated at least two times in each compensation cycle, and
wherein, in the case where the word line corresponding to the inputted address when the active signal is activated for the first time in the compensation cycle is adjacent to the redundancy word line disposed first in the first redundancy word line group, the adjacent activation control block activates the adjacent control signal when the active signal is activated after the first activation of the active signal.

51. A memory comprising:
first to $N^{th}$ word line groups, each of which is configured to include a plurality of word lines;
first to $M^{th}$ redundancy word line groups, each of which is configured to include a plurality of redundancy word lines to replace M number of word line groups among the first to $N^{th}$ word line groups;
a redundancy control block configured to generate first to $M^{th}$ redundancy signals, and, in the case where a word line group including a word line corresponding to an inputted address among the first to $N^{th}$ word line groups is replaced with a $K^{th}$ ($1 \leq K \leq M$) redundancy word line group among the first to $M^{th}$ redundancy word line groups, to activate a $K^{th}$ redundancy signal among the first to $M^{th}$ redundancy signals that corresponds to the $K^{th}$ redundancy word line group in response to a portion of the inputted address;
a pulse signal generation unit configured to generate a pulse signal at deactivation of an active signal;
a first shifting unit configured to shift values stored therein when the pulse signal is activated in the case where a redundancy word line state signal is activated in a first mode, and to generate a plurality of first signals;
a second shifting unit configured to shift values stored therein when the pulse signal is activated in the first mode, and to generate a plurality of second signals;
an address latch unit configured to latch a bit for distinguishing respective word lines of a word line group in the inputted address, and to generate a word line distinguishing signal;
a signal generation unit configured to combine the plurality of first signals and the plurality of second signals and the word line distinguishing signal, and to generate at least one adjacent control signal; and
a word line control block configured to activate at least one adjacent word line adjacent to the redundancy word line that replaces the word line corresponding to the inputted address in response to an active signal and the $K^{th}$ redundancy signal and the adjacent control signal in the case where the word line group including the word line corresponding to the inputted address is replaced with the $K^{th}$ redundancy word line group in the first mode.

52. The memory according to claim 51, wherein the redundancy word line state signal is activated in the case where the word line group including the word line corresponding to the inputted address among the first to $N^{th}$ word line groups is replaced with the $K^{th}$ redundancy word line group among the first to $M^{th}$ redundancy word line groups or in the case where the word line corresponding to the inputted address is adjacent to a redundancy word line disposed first in the first redundancy word line group, in the first mode.

* * * * *